(12) United States Patent
Bower et al.

(10) Patent No.: US 11,488,943 B2
(45) Date of Patent: *Nov. 1, 2022

(54) MODULES WITH INTEGRATED CIRCUITS AND DEVICES

(71) Applicant: X Display Company Technology Limited, Dublin (IE)

(72) Inventors: Christopher Andrew Bower, Raleigh, NC (US); Matthew Alexander Meitl, Durham, NC (US); Ronald S. Cok, Rochester, NY (US); Salvatore Bonafede, Chapel Hill, NC (US); Brook Raymond, Cary, NC (US); Andrew Tyler Pearson, Durham, NC (US); Erik Paul Vick, Raleigh, NC (US)

(73) Assignee: X Display Company Technology Limited, Dublin (IE)

( * ) Notice: Subject to any disclaimer, the term of this patent is extended or adjusted under 35 U.S.C. 154(b) by 90 days.

This patent is subject to a terminal disclaimer.

(21) Appl. No.: 17/030,347

(22) Filed: Sep. 23, 2020

(65) Prior Publication Data

US 2021/0043618 A1    Feb. 11, 2021

Related U.S. Application Data

(63) Continuation-in-part of application No. 16/442,142, filed on Jun. 14, 2019, now Pat. No. 10,944,027.

(51) Int. Cl.
*H01L 25/16* (2006.01)
*H01L 27/15* (2006.01)
(Continued)

(52) U.S. Cl.
CPC .......... *H01L 25/167* (2013.01); *H01L 23/481* (2013.01); *H01L 25/50* (2013.01); *H01L 27/15* (2013.01); *H01L 33/54* (2013.01)

(58) Field of Classification Search
CPC .................................................. H01L 25/167
See application file for complete search history.

(56) References Cited

U.S. PATENT DOCUMENTS

| 6,142,358 A | 11/2000 | Cohn et al. |
| 7,195,733 B2 | 3/2007 | Rogers et al. |

(Continued)

FOREIGN PATENT DOCUMENTS

| DE | 102016124983 A1 | 6/2018 |
| WO | WO-2020/249800 A1 | 12/2020 |

OTHER PUBLICATIONS

Bower, C. A. et al., Micro-Transfer-Printing: Heterogeneous Integration of Microscale Semiconductor Devises using Elastomer Stamps, IEEE Conference, (2014).

(Continued)

*Primary Examiner* — Thao P Le
(74) *Attorney, Agent, or Firm* — Choate, Hall & Stewart LLP; Michael D. Schmitt

(57) ABSTRACT

An example of a pixel module comprises a module substrate having light emitters disposed on a light-emitter surface and a controller disposed on a controller surface opposed to the light-emitter surface. At least one module electrode is electrically connected to the controller and at least one module electrode is electrically connected to each light emitter. An example of a pixel-module wafer comprises a module source wafer comprising sacrificial portions and module anchors, each sacrificial portion laterally separated from an adjacent sacrificial portion by a module anchor and a pixel module disposed entirely over each sacrificial portion. At least one module tether physically connects each of the pixel modules to at least one of the module anchors. An example of a pixel-module display comprises a display substrate, pixel modules disposed on the display substrate and display (Continued)

electrodes disposed on the display substrate, each display electrode electrically connected to a module electrode.

20 Claims, 68 Drawing Sheets

(51) Int. Cl.
  *H01L 25/00* (2006.01)
  *H01L 33/54* (2010.01)
  *H01L 23/48* (2006.01)

(56) References Cited

U.S. PATENT DOCUMENTS

| | | | |
|---|---|---|---|
| 7,354,801 B2 | 4/2008 | Sugiyama et al. | |
| 7,521,292 B2 | 4/2009 | Rogers et al. | |
| 7,557,367 B2 | 7/2009 | Rogers et al. | |
| 7,622,367 B1 | 11/2009 | Nuzzo et al. | |
| 7,662,545 B2 | 2/2010 | Nuzzo et al. | |
| 7,704,684 B2 | 4/2010 | Rogers et al. | |
| 7,799,699 B2 | 9/2010 | Nuzzo et al. | |
| 7,932,123 B2 | 4/2011 | Rogers et al. | |
| 7,972,875 B2 | 7/2011 | Rogers et al. | |
| 7,982,296 B2 | 7/2011 | Nuzzo et al. | |
| 8,333,860 B1 | 12/2012 | Bibi et al. | |
| 8,506,867 B2 | 8/2013 | Menard | |
| 8,558,243 B2 | 10/2013 | Bibi et al. | |
| 8,722,458 B2 | 5/2014 | Rogers et al. | |
| 8,791,474 B1 | 7/2014 | Bibi et al. | |
| 8,794,501 B2 | 8/2014 | Bibi et al. | |
| 8,835,940 B2 | 9/2014 | Hu et al. | |
| 8,865,489 B2 | 10/2014 | Rogers et al. | |
| 8,889,485 B2 | 11/2014 | Bower | |
| 8,895,406 B2 | 11/2014 | Rogers et al. | |
| 8,946,760 B2 | 2/2015 | Kim | |
| 9,049,797 B2 | 6/2015 | Menard et al. | |
| 9,087,764 B2 | 7/2015 | Chan et al. | |
| 9,117,940 B2 | 8/2015 | Rogers et al. | |
| 9,139,425 B2 | 9/2015 | Vestyck | |
| 9,153,171 B2 | 10/2015 | Sakariya et al. | |
| 9,165,989 B2 | 10/2015 | Bower et al. | |
| 9,166,114 B2 | 10/2015 | Hu et al. | |
| 9,217,541 B2 | 12/2015 | Bathurst et al. | |
| 9,355,854 B2 | 5/2016 | Meitl et al. | |
| 9,367,094 B2 | 6/2016 | Bibi et al. | |
| 9,368,683 B1 | 6/2016 | Meitl et al. | |
| 9,520,537 B2 | 12/2016 | Bower et al. | |
| 9,589,944 B2 | 3/2017 | Higginson et al. | |
| 9,640,108 B2 | 5/2017 | Cok et al. | |
| 9,818,725 B2 | 11/2017 | Bower et al. | |
| 9,930,277 B2 | 3/2018 | Cok | |
| 10,074,768 B2 | 9/2018 | Meitl et al. | |
| 10,153,256 B2 | 12/2018 | Cok et al. | |
| 10,224,231 B2 | 3/2019 | Bower et al. | |
| 10,255,834 B2 | 4/2019 | Cok et al. | |
| 10,332,868 B2 | 6/2019 | Cok et al. | |
| 10,395,966 B2 | 8/2019 | Bower et al. | |
| 10,431,719 B2 | 10/2019 | Cok et al. | |
| 10,468,363 B2 | 11/2019 | Prevatte et al. | |
| 10,944,027 B2 | 3/2021 | Bower et al. | |
| 2003/0141570 A1 | 7/2003 | Chen et al. | |
| 2009/0267104 A1 | 10/2009 | Hsu et al. | |
| 2010/0060553 A1 | 3/2010 | Zimmerman et al. | |
| 2010/0123268 A1 | 5/2010 | Menard | |
| 2010/0236603 A1 | 9/2010 | Menard et al. | |
| 2010/0248484 A1 | 9/2010 | Bower et al. | |
| 2010/0306993 A1 | 12/2010 | Mayyas et al. | |
| 2010/0317132 A1 | 12/2010 | Rogers et al. | |
| 2012/0018745 A1 | 1/2012 | Liu et al. | |
| 2012/0223875 A1 | 9/2012 | Lau et al. | |
| 2012/0228669 A1 | 9/2012 | Bower et al. | |
| 2012/0256814 A1 | 10/2012 | Ootorii | |
| 2012/0314388 A1 | 12/2012 | Bower et al. | |
| 2013/0069275 A1 | 3/2013 | Menard et al. | |
| 2013/0196474 A1 | 8/2013 | Meitl et al. | |
| 2013/0221355 A1 | 8/2013 | Bower et al. | |
| 2013/0273695 A1 | 10/2013 | Menard et al. | |
| 2013/0316487 A1 | 11/2013 | de Graff et al. | |
| 2014/0084482 A1 | 3/2014 | Hu et al. | |
| 2014/0159043 A1 | 6/2014 | Sakariya et al. | |
| 2014/0264763 A1 | 9/2014 | Meitl et al. | |
| 2014/0267683 A1 | 9/2014 | Bibi et al. | |
| 2014/0367633 A1 | 12/2014 | Bibi et al. | |
| 2014/0367705 A1 | 12/2014 | Bibi et al. | |
| 2015/0135525 A1 | 5/2015 | Bower | |
| 2015/0137153 A1 | 5/2015 | Bibi et al. | |
| 2015/0362165 A1 | 12/2015 | Chu et al. | |
| 2015/0371585 A1 | 12/2015 | Bower et al. | |
| 2016/0093600 A1 | 3/2016 | Bower et al. | |
| 2017/0122502 A1 | 5/2017 | Cok et al. | |
| 2017/0187976 A1 | 6/2017 | Cok | |
| 2017/0256522 A1 | 9/2017 | Cok et al. | |
| 2018/0114800 A1* | 4/2018 | Pan | H01L 33/0075 |
| 2018/0190615 A1* | 7/2018 | Pan | G06F 3/044 |
| 2018/0191978 A1 | 7/2018 | Cok et al. | |
| 2018/0211945 A1 | 7/2018 | Cok et al. | |
| 2018/0226386 A1 | 8/2018 | Cok | |
| 2019/0081122 A1 | 3/2019 | Kim et al. | |
| 2019/0088526 A1 | 3/2019 | Bower et al. | |
| 2019/0265478 A1 | 8/2019 | Cok et al. | |
| 2019/0326269 A1 | 10/2019 | Schwarz | |
| 2019/0348573 A1 | 11/2019 | Raymond et al. | |
| 2020/0043401 A1 | 2/2020 | Yokoyama et al. | |
| 2020/0203321 A1* | 6/2020 | Choi | H01L 24/95 |
| 2020/0295120 A1* | 9/2020 | Bower | G06F 3/147 |
| 2020/0395510 A1* | 12/2020 | Bower | H01L 25/167 |
| 2021/0151630 A1 | 5/2021 | Bower et al. | |
| 2021/0296394 A1* | 9/2021 | Meng | H01L 27/156 |
| 2021/0327964 A1* | 10/2021 | Jeon | H01L 27/322 |
| 2021/0367021 A1* | 11/2021 | Yang | G09G 3/3233 |

OTHER PUBLICATIONS

Bower, C. A. et al., Transfer Printing: An Approach for Massively Parallel Assembly of Microscale Devices, IEE, Electronic Components and Technology Conference, 2008, pp. 1105-1109.
Cok, R. S. et al., 60.3: AMOLED Displays Using Transfer-Printed Integrated Circuits, Society for Information Display, 10:902-904, (2010).
Cok, R. S. et al., AMOLED displays with transfer-printed integrated circuits, Journal of SID, 19(4):335-341, (2011).
Cok, R. S. et al., Inorganic light-emitting diode displays using micro-transfer printing, Journal of the SID, 25(10):589-609, (2017).
Hamer et al., 63.2: AMOLED Displays Using Transfer-Printed Integrated Circuits, SID 09 DIGEST, 40(2):947-950 (2009).
Kim, Dae-Hyeong et al., Optimized Structural Designs for Stretchable Silicon Integrated Circuits, Small, 5(24):2841-2847, (2009).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Partial Search Report for PCT/EP2020066401, filed Jun. 12, 2020, 3 pages, (dated Sep. 8, 2020).
Provisional Opinion Accompanying Partial Search Result for PCT/EP2020066401, filed Jun. 12, 2020, 5 pages, (dated Sep. 8, 2020).
Trindade, A.J. et al., Precision transfer printing of ultra-thin AllnGaN micron-size light-emitting diodes, Crown, pp. 217-218, (2012).
Yoon, J. et al., Heterogeneously Integrated Optoelectronic Devices Enabled by MicroTransfer Printing, Adv. Optical Mater., 3:1313-1335 (2015).
International Search Report PCT/EP2020/066401, 6 pages, dated Oct. 29, 2020.
Written Opinion PCT/EP2020/066401, 11 pages, dated Oct. 29, 2020.

* cited by examiner

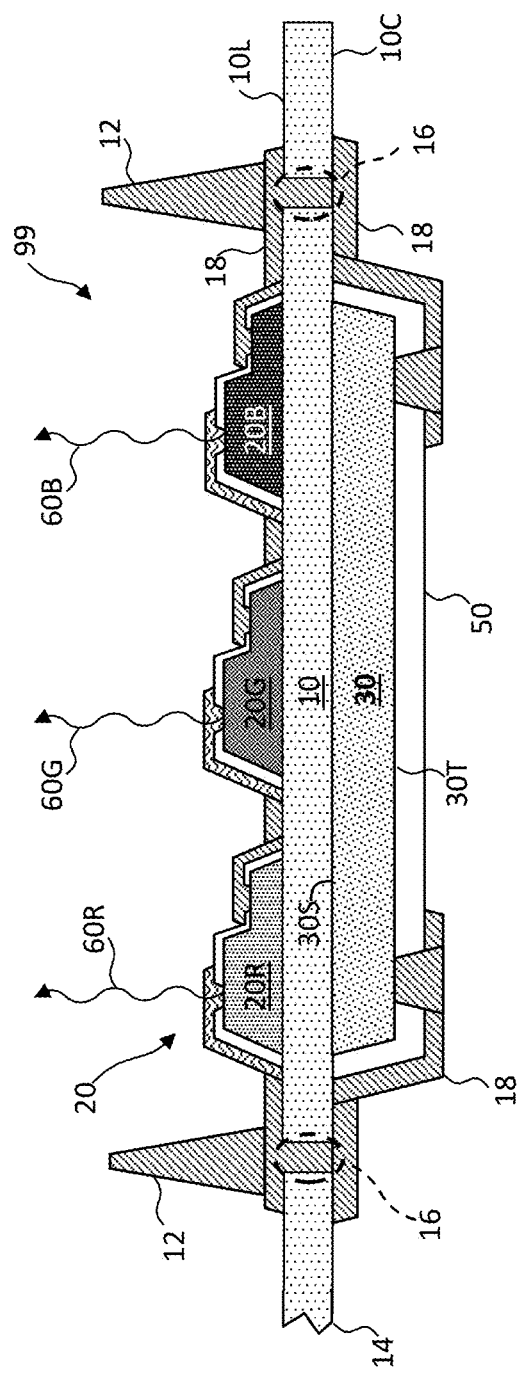

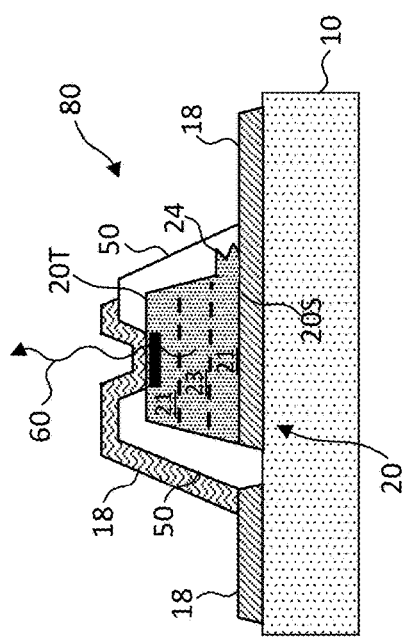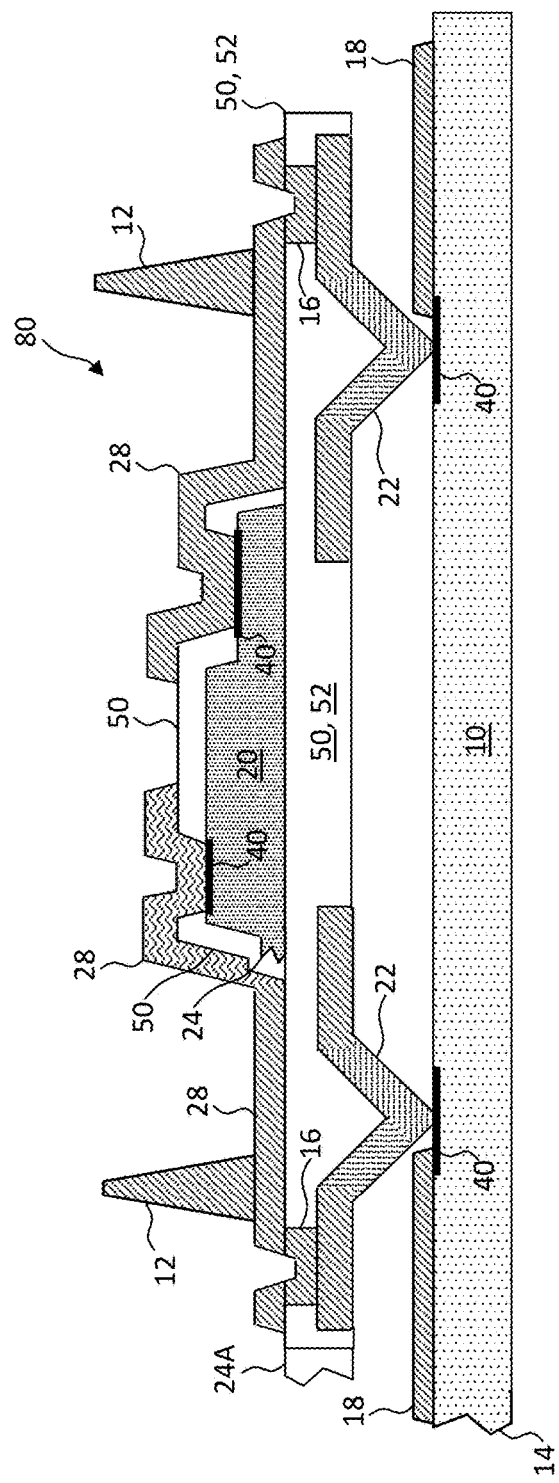

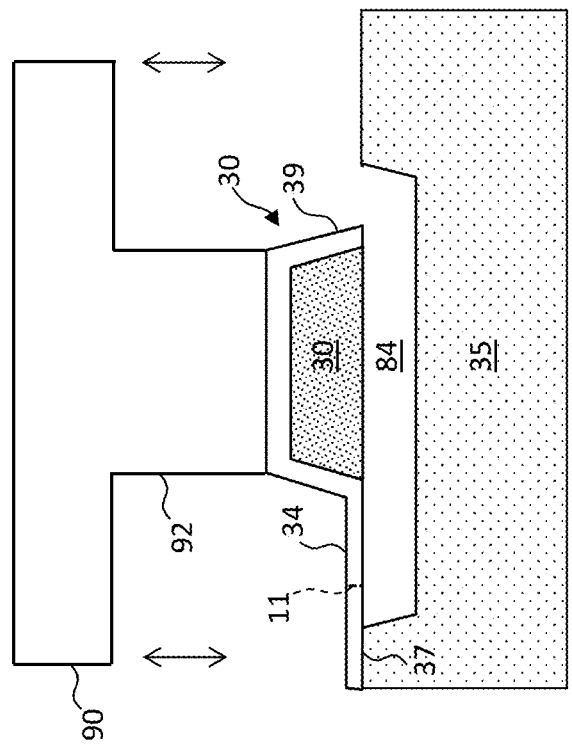
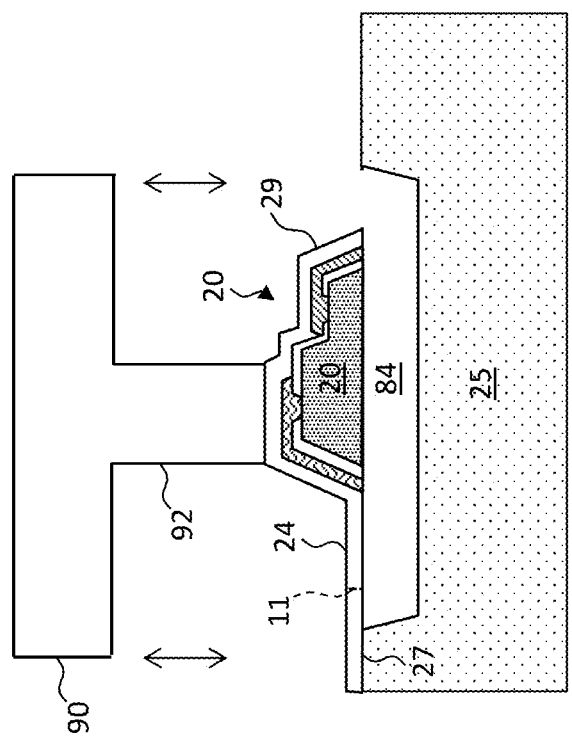

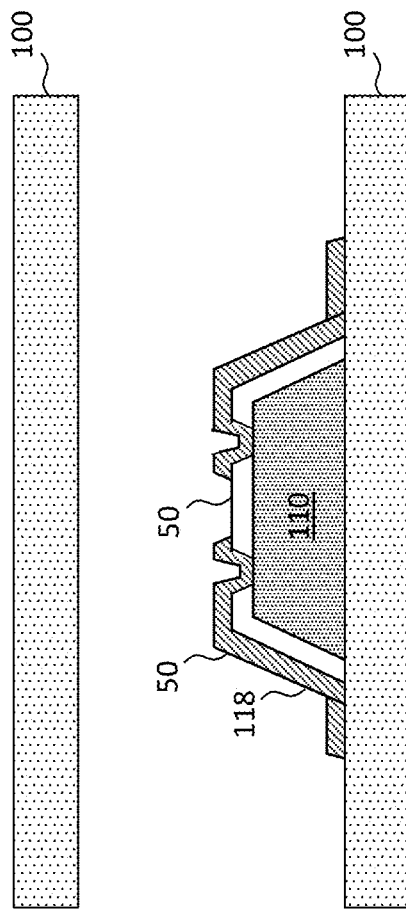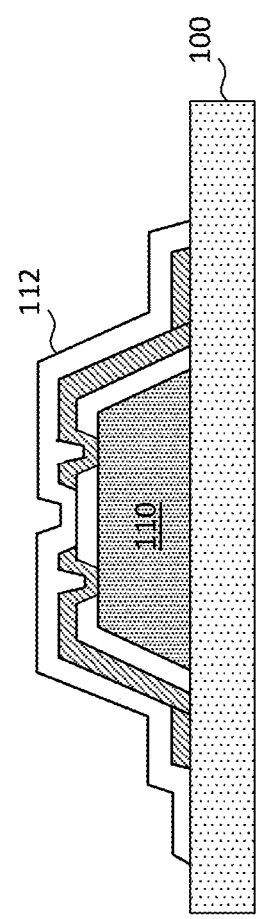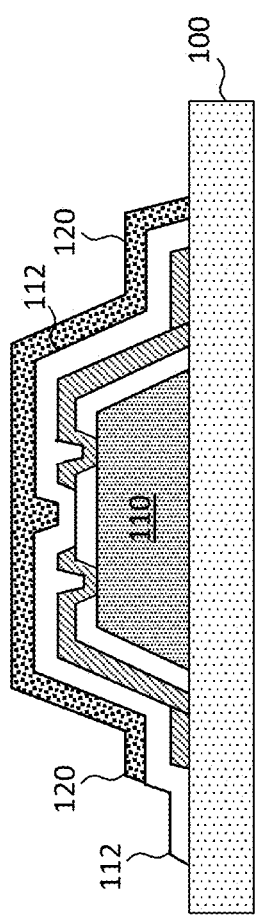

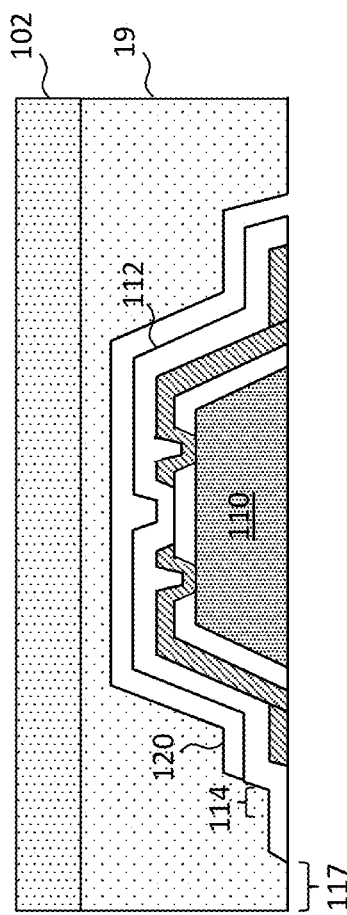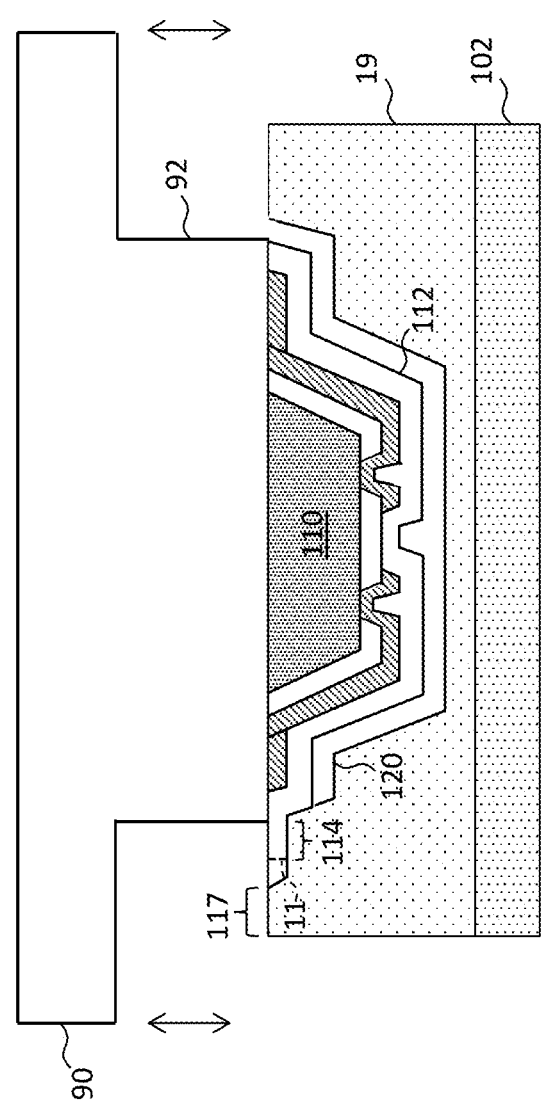

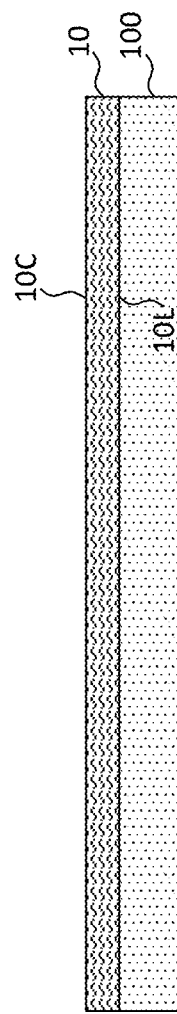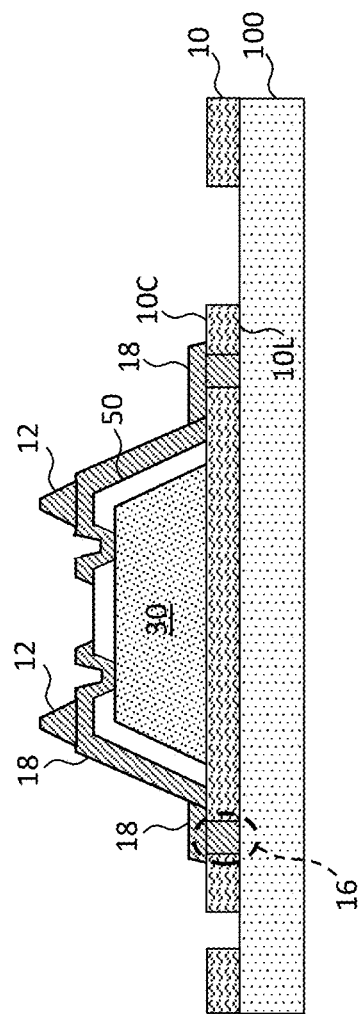

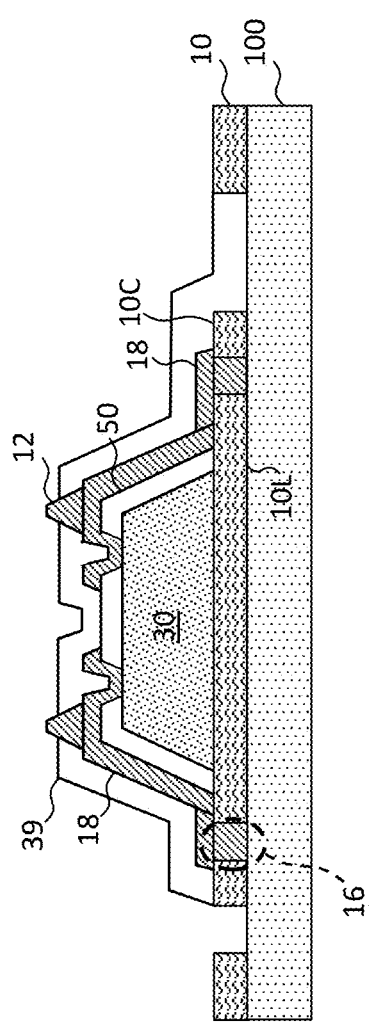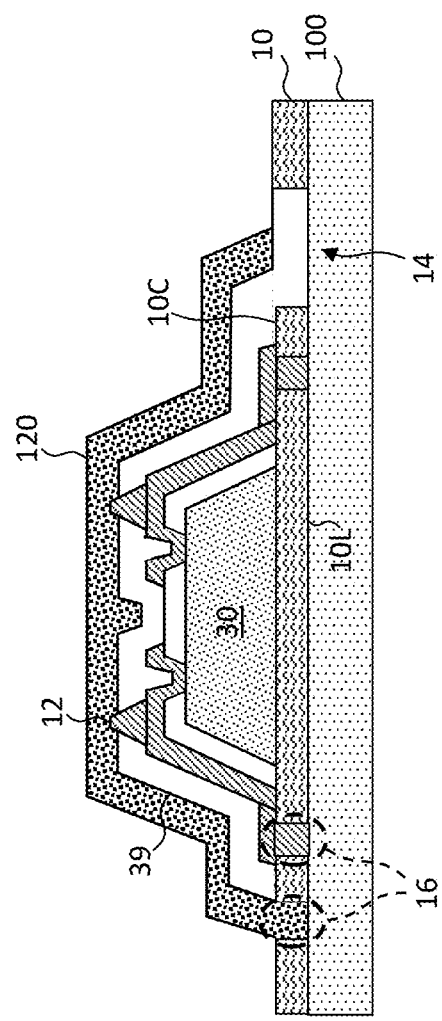

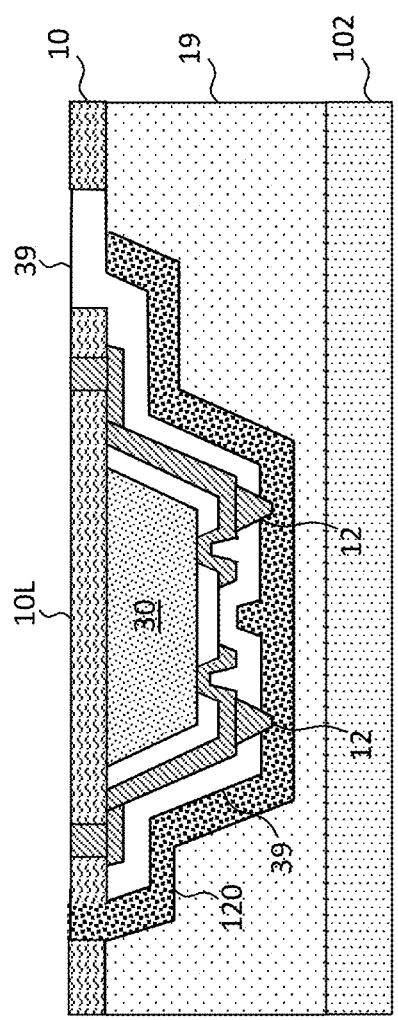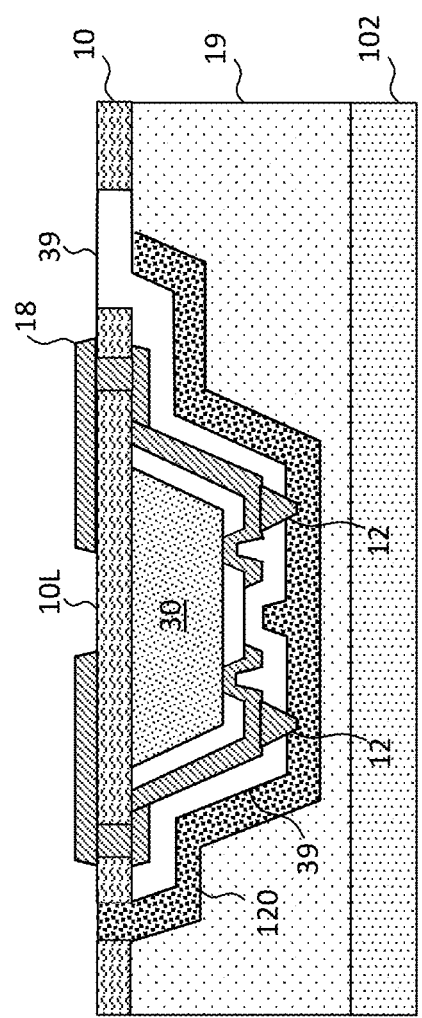

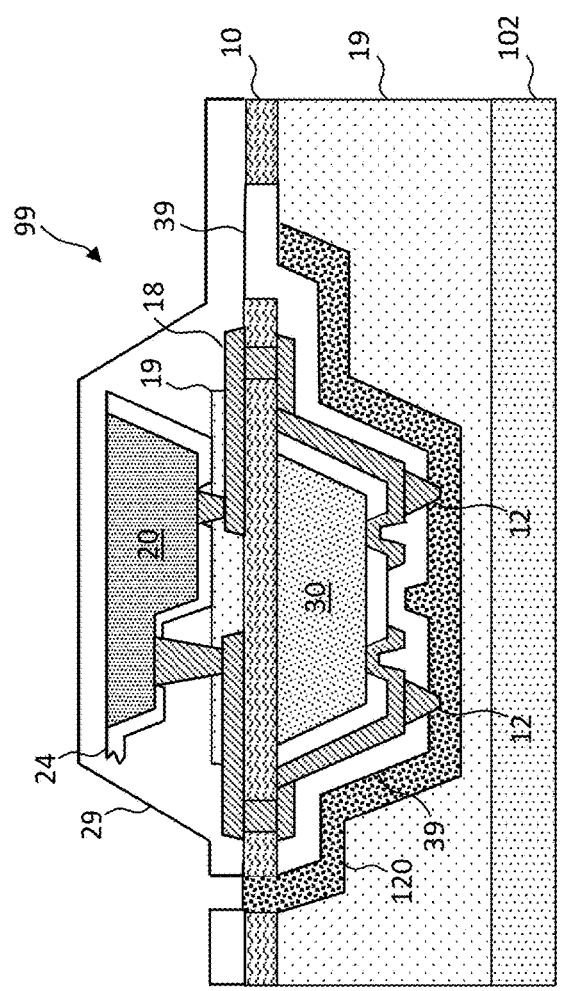
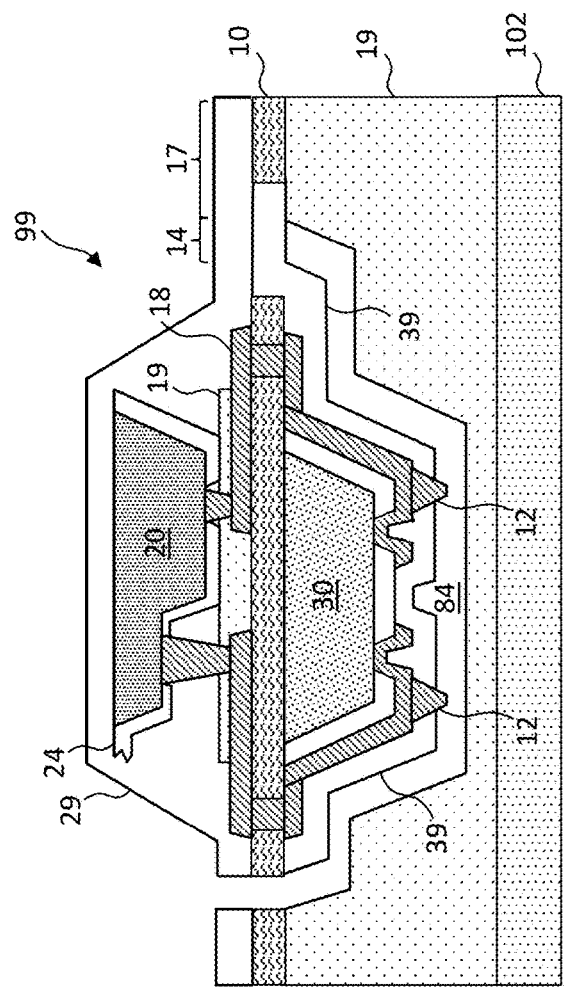

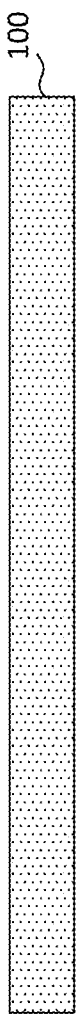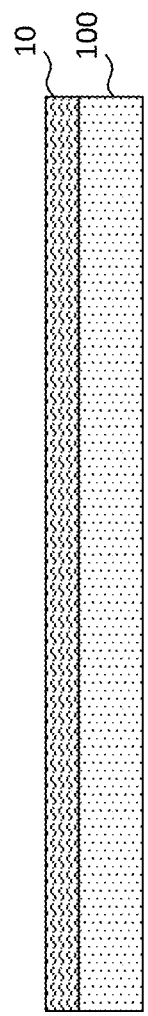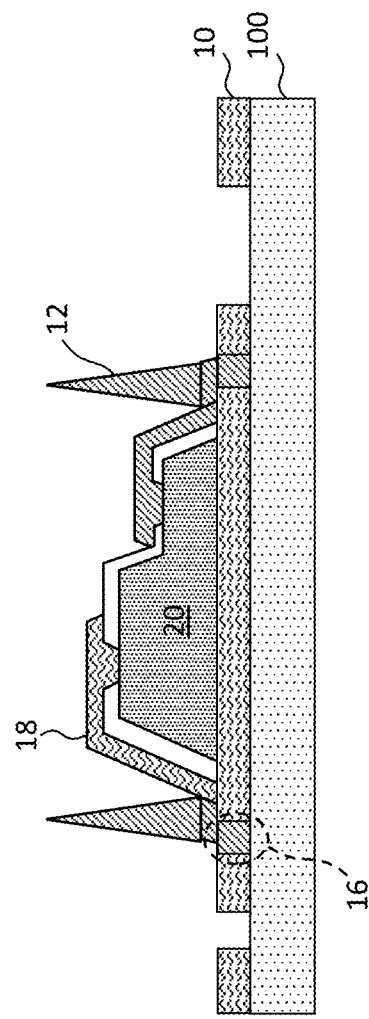

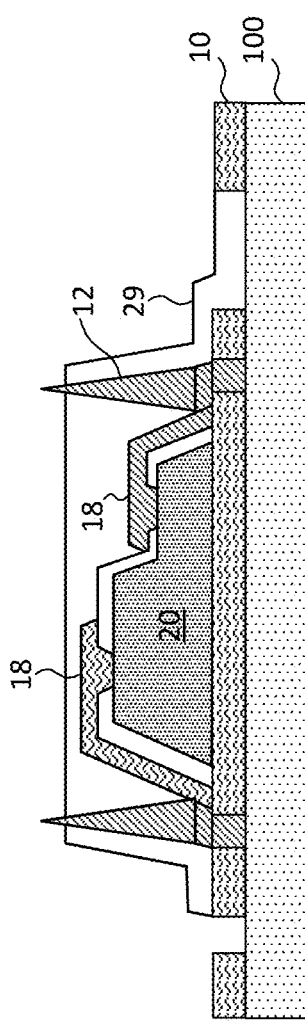
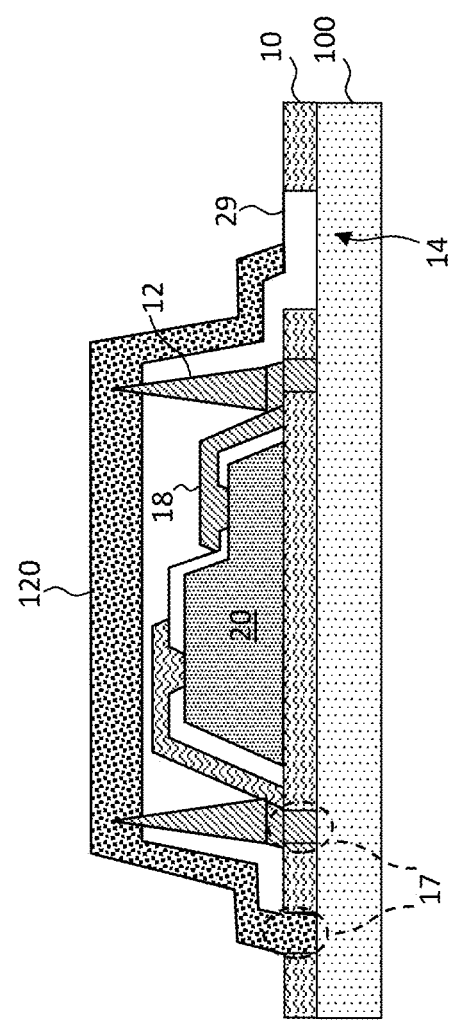

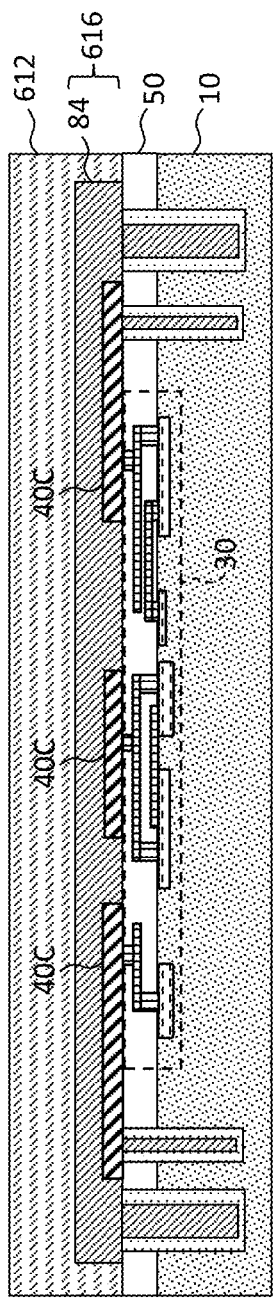
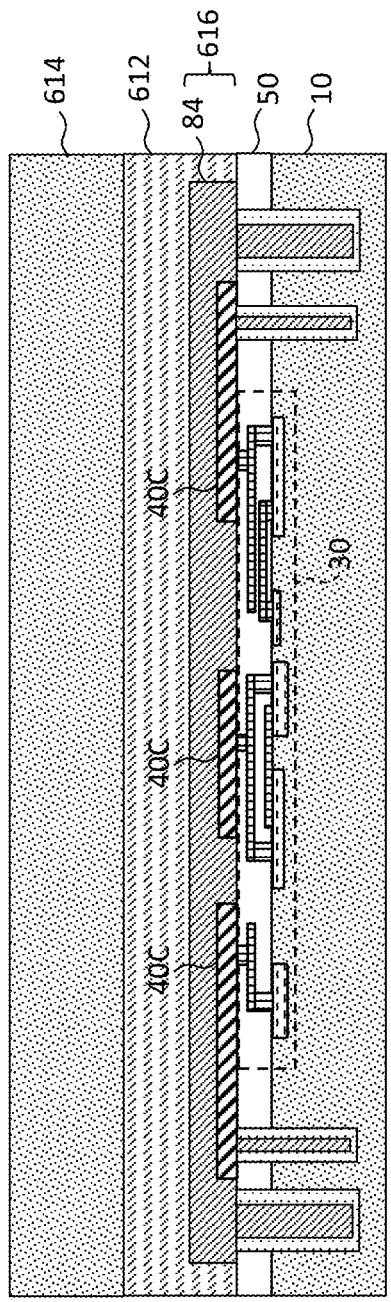

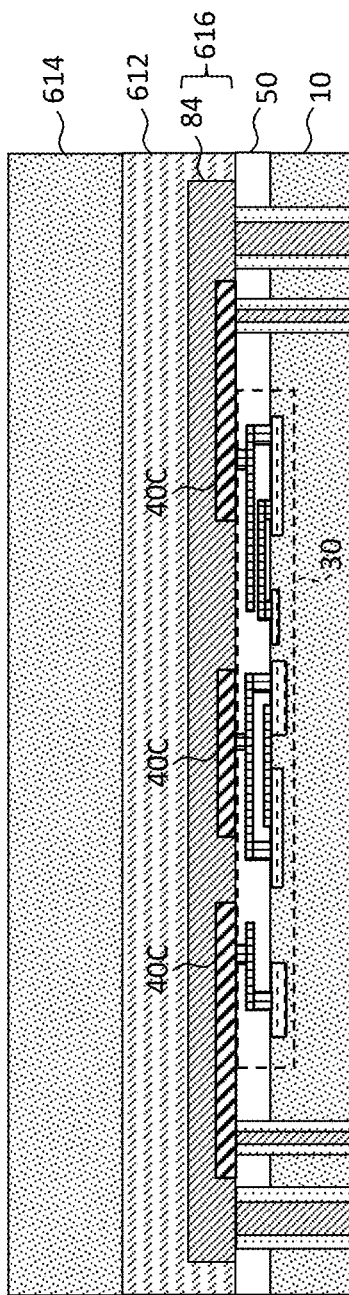
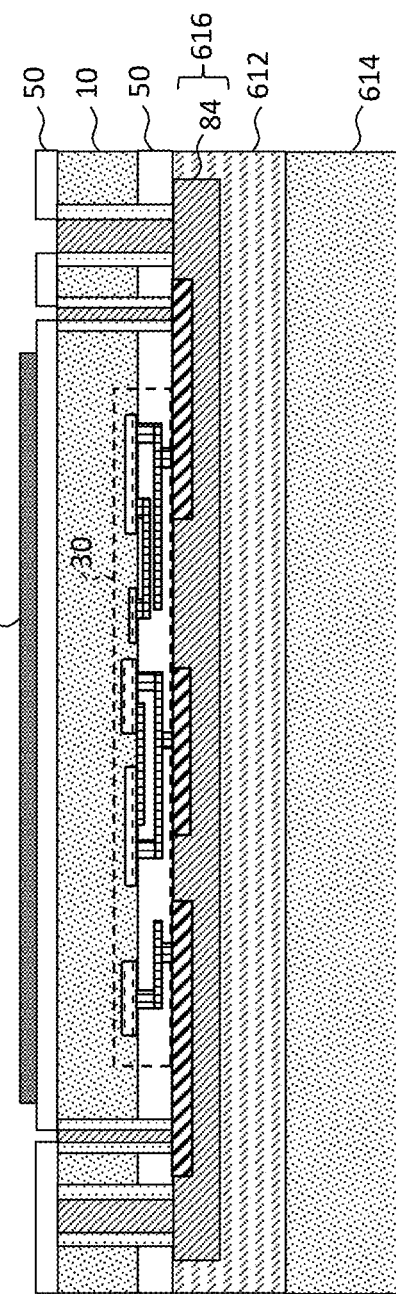
FIG. 31I
FIG. 31J

MODULES WITH INTEGRATED CIRCUITS AND DEVICES

PRIORITY APPLICATION

This application is a continuation-in-part of U.S. patent application Ser. No. 16/442,142, filed Jun. 14, 2019, entitled Pixel Modules with Controllers and Light Emitters, which is incorporated by reference herein in its entirety.

CROSS REFERENCE TO RELATED APPLICATIONS

Reference is made to U.S. Pat. No. 10,153,256 filed Dec. 9, 2016 entitled Micro-Transfer Printable Electronic Component by Cok et al, to U.S. Pat. No. 10,224,231 filed Nov. 14, 2017 entitled Micro-Transfer Printable Flip-Chip Structures and Methods by Bower et al, to U.S. patent application Ser. No. 15/876,949 filed Jan. 22, 2018 entitled Stacked Pixel Structures by Cok et al, to U.S. Pat. No. 9,368,683 filed Jul. 23, 2015 entitled Printable Inorganic Semiconductor Method by Meitl et al, to U.S. Pat. No. 10,074,768 filed Jun. 10, 2016 entitled Printable Inorganic Semiconductor Method by Meitl et al, to U.S. Pat. No. 10,224,231 filed Nov. 14, 2017 entitled Micro-Transfer Printable Flip-Chip Structures and Methods by Meitl et al, to U.S. patent application Ser. No. 16/192,779 filed Nov. 15, 2018 entitled Micro-Transfer Printable Flip-Chip Structures and Methods by Meitl et al, and to U.S. patent application Ser. No. 15/944,223 filed Apr. 3, 2018 entitled Micro-Transfer Printable Flip-Chip Structures and Methods by Meitl et al, the relevant contents of each of which are incorporated by reference herein.

TECHNICAL FIELD

The present disclosure relates generally to physical pixel structures for use in a display and, in some embodiments, structures having stacked inorganic light emitters and pixel controllers.

BACKGROUND

Flat-panel displays comprise an array of pixels distributed in a display viewing area over a planar display substrate. The pixels are electrically controlled using matrix addressing with the intersections of row and column wires on the substrate defining pixel locations. Rows of pixels in the array are sequentially provided with control signals and columns of pixels in the array are provided with data signals. Passive-matrix control relies on row and column controllers external to the display viewing area to sequentially enable rows of pixels to emit light, so that only one row of pixels at a time emits light. Active-matrix control relies on local storage and control provided in the display viewing area for each pixel, for example with a storage capacitor and driving transistor as disclosed in U.S. Pat. No. 9,117,940. Data is provided from the external column controller to each pixel in a selected row of pixels and the rows are sequentially selected with the row controller. The pixels in each selected row receive data on the column wires and store the data locally in the pixel. Once the data is received and stored, it is displayed at each pixel by the control circuitry in the pixel by providing power to the pixel control circuitry, for example transistors driving electrodes controlling a liquid crystal (in the case of a liquid crystal display) or an organic light-emitting diode (in the case of an OLED display). Inorganic light-emitting diodes are also used in flat-panel displays.

Inorganic light-emitting diode (iLED) displays have many advantages, such as efficiency, color purity, and lifetime, and are found today in digital signage and large-format displays, for example in sporting venues. The iLEDs in these displays are relatively large, for example having a dimension of one mm or more, are mounted in a display frame, for example in an array of tiles, and are controlled by circuitry external to the display frame. It is difficult, therefore, to construct a high-resolution iLED display with relatively smaller iLEDs. Existing iLED displays often have pixel pitches of approximately 25 ppi, a relatively low resolution, especially compared to OLED or liquid crystal flat-panel displays.

Approaches to providing high-performance electronic devices distributed over a substrate are described in U.S. Pat. No. 8,722,458 entitled Optical Systems Fabricated by Printing-Based Assembly. This patent teaches, inter alia, transferring light-emitting, light-sensing, or light-collecting semiconductor elements from a wafer substrate to a destination substrate or backplane. U.S. Pat. No. 7,972,875 entitled Optical Systems Fabricated by Printing Based Assembly discloses, inter alia, assembling printable semiconductor elements on a substrate by way of contact printing. *Inorganic light-emitting diode displays using microtransfer printing* (Journal of the Society for Information Display, 2017, DOI #10.1002/jsid.610, 1071-0922/17/2510-0610, pages 589-609) describes high-performance electronic control circuits and micro-LEDs distributed over a large display substrate. In an example from this paper, small integrated circuits and micro-LEDs (devices) are formed over a sacrificial layer on the process side of corresponding crystalline semiconductor wafers, for example a silicon wafer for the integrated circuit and GaN or GaAs wafers for the micro-LEDs. The small integrated circuits and micro-LEDs are released from the various wafers by etching the sacrificial layers formed beneath the devices. A PDMS stamp is successively pressed against the process side of each wafer and the devices are adhered to the stamp. The devices are then pressed against a display substrate coated with an adhesive and thereby adhered to the display substrate. The adhesive is subsequently cured, electrodes are formed using photolithographic methods and materials, and the devices are encapsulated to form arrays of light-emitting pixels.

U.S. Pat. No. 9,818,725 entitled Inorganic-Light-Emitter Displays with Integrated Black Matrix describes, inter alia, an inorganic light-emitting display with micro-transfer printed light-emitting diodes and pixel controllers distributed over a flat-panel display substrate with an integrated black matrix. Certain embodiments of such approaches provide an LED display with improved optical performance but there remains a need for inorganic LED displays with improved manufacturability, increased resolution, reduced cost, and pixel structures that facilitate such improved manufacturability and increased resolution.

SUMMARY

The present disclosure provides, inter alia, integrated-circuit modules comprising a semiconductor substrate having a native side and an opposing device side, a non-native device (and, in some embodiments, a plurality of non-native devices) disposed on or over the device side, a native integrated circuit formed on or in the native side of the semiconductor substrate, and an electrode via comprising an electrode extending through the semiconductor substrate, the electrode electrically connected to the native integrated circuit and to the non-native device.

According to some embodiments, an integrated-circuit-module wafer comprises a semiconductor substrate having a native side and an opposing device side, an integrated circuit formed on or in the native side of the semiconductor substrate, an electrode via comprising an electrode extending into the semiconductor substrate, the electrode electrically connected to the integrated circuit, and an etch via extending into the semiconductor substrate forming a wall disposed at least partially around (e.g., at least partially surrounding) the integrated circuit and the electrode via. According to some embodiments, a device is disposed on or over the device side of the semiconductor substrate, the device non-native to the semiconductor substrate and electrically connected to the electrode.

According to some embodiments, an integrated-circuit-module wafer comprises a patterned sacrificial layer disposed on or over the native side (e.g., directly over in a direction orthogonal to the native side), the patterned sacrificial layer comprising a sacrificial portion, and the entire integrated circuit and at least a portion of the etch via are disposed over the sacrificial portion.

In some embodiments, the electrode via and the etch via extend through the semiconductor substrate. In some embodiments, the electrode via and the etch via extend into but not through the semiconductor substrate.

According to some embodiments, an integrated-circuit-module wafer comprises a bonding layer disposed on or over the patterned sacrificial layer and a carrier wafer bonded to the bonding layer on a side of the bonding layer opposite the semiconductor substrate.

According to some embodiments, a device is disposed on or over the device side of the semiconductor substrate, the device non-native to the semiconductor substrate and electrically connected to the electrode.

In some embodiments of the present disclosure, the integrated-circuit module can be a pixel module, an integrated-circuit module can be a controller, and a device can be an LED or light emitter. Thus, in embodiments of the present disclosure, a pixel module can be more generally an integrated-circuit module, a controller can be more generally an integrated circuit, and an LED or light emitter can be can be more generally a device. As used herein, over and under are relative terms and can be exchanged in embodiments of the present disclosure.

According to some embodiments, a pixel module comprising a module substrate having a light-emitter surface and a controller surface opposed to the light-emitter surface, one or more light emitters disposed on the light-emitter surface of the module substrate, a controller disposed on the controller surface of the module substrate, and module electrodes. At least one module electrode can be electrically connected to the controller and at least one module electrode can be electrically connected to each light emitter of the one or more light emitters. Module electrodes can electrically connect the controller to one or more light emitters so that the controller is operable to control the one or more light emitters (e.g., when provided with appropriate input, such as one or more signals). One or more module electrodes can pass through a module substrate or wrap around an edge of a module substrate.

In some embodiments of the present disclosure, one or more light emitters comprise a red-light emitter operable to emit red light, a green-light emitter operable to emit green light, and a blue-light emitter operable to emit blue light. One or more light emitters can be one or more horizontal inorganic light-emitting diodes that are disposed to emit light in a direction away from a light-emitter surface of a module substrate. Horizontal inorganic light-emitting diodes can comprise a top side opposite a bottom side. Electrical conductors, such as module electrodes, can be electrically connected to the top side. Horizontal inorganic light-emitting diodes can emit light through the top side or can emit light through the bottom side. One or more light emitters can be one or more vertical inorganic light-emitting diodes that are disposed to emit light in a direction away from a light-emitter surface of a module substrate.

Each light emitter of the one or more light emitters can comprise one or more light-emitter connection posts each electrically connected to a module electrode. A controller can comprise one or more controller assembly connection posts each electrically connected to a module electrode. One or more module connection posts can be disposed on a controller surface of a module substrate and each module connection post can be electrically connected to a module electrode. One or more module connection posts can protrude from a controller surface of a module substrate a distance that is greater than a thickness of the controller. The distance can be at least 1.1 times, at least 1.2 times, or at least 1.5 times the thickness of the controller.

In some embodiments of the disclosure, one or more module connection posts are disposed on a light-emitter surface of a module substrate and each module connection post can be electrically connected to a module electrode. One or more module connection posts can protrude from a light-emitter surface of a module substrate a distance that is greater than a thickness of each of the one or more light emitters. The distance can be at least 1.1 times, at least 1.2 times, or at least 1.5 times the thickness of the one or more light emitters.

One or more module connection posts can be disposed on a controller so that the controller is disposed between the one or more module connection posts and a module substrate. A module connection post of the one or more module connection posts disposed on the controller can be electrically connected to a module electrode.

In some embodiments of the present disclosure, (i) each light emitter of the one or more light emitters comprises a broken or separated light-emitter tether, (ii) a controller comprises a broken or separated controller tether, (iii) a module substrate comprises a module tether (e.g., a broken or separated tether or wherein the module tether is physically connected to an anchor portion of a source wafer), or (iv) any combination of (i), (ii), and (iii). A module substrate can comprise a broken or separated module tether.

Each of the one or more light emitters can be non-native to the module substrate, the controller can be non-native to the module substrate, or both.

In some embodiments, (i) a dielectric is disposed between the controller and at least a portion of each of the at least one of the module electrodes directly electrically connected to the controller, (ii) a dielectric is disposed between the at least one light emitter and at least a portion of each of the at least one of the module electrodes directly electrically connected to the at least one light emitter, or (iii) both (i) and (ii). An encapsulating layer can be disposed over the controller, an encapsulating layer can be disposed over the one or more light emitters, or both. Any one or more encapsulating layers can comprise a broken or separated module tether. One or more module connection posts can protrude through any one or more encapsulating layers. A pixel module can be fully encapsulated by any one or more encapsulating layers and, optionally, a module substrate.

According to some embodiments, a pixel module has at least one of: at least one of a width and a length of no more than 400 microns (e.g., no more than 300 microns, no more than 200 microns, or no more than 100 microns), and a thickness of no more than 150 microns (e.g., no more than 100 microns, no more than 75 microns, no more than 50 microns, or no more than 25 microns).

According to some embodiments of the present disclosure, a pixel-module wafer comprises a module source wafer comprising sacrificial portions and module anchors. Each sacrificial portion is laterally separated from an adjacent sacrificial portion by a module anchor and a pixel module is disposed entirely over each sacrificial portion. Each pixel module can comprise a module substrate having a light-emitter surface and a controller surface opposed to the light-emitter surface, one or more light emitters disposed on the light-emitter surface of the module substrate, a controller disposed on the controller surface of the module substrate, and module electrodes, wherein at least one module electrode is electrically connected to the controller, at least one module electrode is electrically connected to at least one light emitter of the one or more light emitters, and at least one module tether physically connects each of the pixel modules to at least one of the module anchors.

According to some embodiments of the present disclosure, a pixel-module display comprises a display substrate and one-or-more pixel modules disposed on the display substrate. Each of the one or more pixel modules can comprise a module substrate having a light-emitter surface and a controller surface opposed to the light-emitter surface, one or more light emitters disposed on the light-emitter surface of the module substrate, a controller disposed on the controller surface of the module substrate, and module electrodes, wherein at least one module electrode is electrically connected to the controller and at least one module electrode is electrically connected to at least one light emitter of the one or more light emitters. Display electrodes are disposed on the display substrate, each display electrode is electrically connected to a module electrode of the one-or-more pixel modules. The one-or-more pixel modules can be non-native to the display substrate. Each of the pixel modules can comprise a broken or separated module tether.

In some embodiments, each pixel module comprises one or more module connection posts, where each module connection post of the one or more module connection posts is electrically connected to a display electrode. The one-or-more pixel modules can be a plurality of pixel modules that are disposed in a regular array for example on a target substrate, such as a display substrate. The regular array can be regular in one or two dimensions. The one or more light emitters can be disposed between the display substrate and a module substrate. The controller can be disposed between the display substrate and the module substrate.

According to some embodiments of the present disclosure, a method of making a pixel module comprises providing (i) a light-emitter source wafer comprising a light emitter, (ii) a controller source wafer comprising a controller, and (iii) a module substrate having a controller surface and a light-emitter surface, transferring (i) the light emitter from the light-emitter source wafer to the light-emitter surface of the module substrate, (ii) the controller from the controller source wafer to the controller surface of the module substrate, or (iii) both (i) and (ii), and forming one or more vias through the module substrate and forming module electrodes electrically connecting the controller to the light emitter through the one or more vias.

Methods of the present disclosure can comprise (i) adhering a light-emitter source wafer to a module carrier (e.g., a handle substrate for a pixel module) and removing the light-emitter source wafer, (ii) adhering the controller source wafer to a module carrier and removing the controller source wafer, or (iii) both (i) and (ii). Providing the controller source wafer can comprise providing the module substrate and the controller disposed on the controller surface of the module substrate, and the method comprises transferring the one or more light-emitters from a light-emitter source wafer onto the light-emitting side of the module substrate. Providing the light-emitter source wafer can comprise providing the module substrate and the one or more light emitters disposed on the light-emitter surface of the module substrate and transferring the controller from a controller source wafer onto the controller surface of the module substrate. Transferring the light emitter can comprise (i) micro-transfer printing the light emitter from the light-emitter source wafer to the light-emitter surface of the module substrate, (ii) transferring the controller comprises micro-transfer printing the controller from the controller source wafer to the controller surface of the module substrate, or (iii) both (i) and (ii).

Methods of the present disclosure can comprise providing a display substrate and transferring a pixel module to the display substrate. Transferring the pixel module to the display substrate can comprise micro-transfer printing the pixel module from a module carrier to the display substrate.

According to some embodiments of the present disclosure a light-emitter assembly comprises a dielectric light-emitter assembly substrate having a first side and a second side opposite the first side, one or more light emitters disposed on the light-emitter assembly substrate, wherein the one or more light emitters are non-native to the light-emitter assembly substrate, one or more light-emitter assembly connection posts disposed on the first side of the light-emitter assembly substrate, one or more module connection posts disposed on the second side of the light-emitter assembly substrate, and light-emitter electrodes that electrically connect the one or more light emitters to the one or more light-emitter assembly connection posts and to the one or more module connection posts. One or more light emitters can be disposed on the second side of the light-emitter assembly substrate. The light-emitter assembly substrate can comprise a broken or separated light-emitter assembly tether (e.g., a broken, fractured, or separated light-emitter tether or a light-emitter tether that is physically connected to an anchor portion of a source substrate). The one or more light emitters can be each a micro-LED, the one or more light emitters can be horizontal light-emitting diodes, the one or more light emitters can be vertical light-emitting diodes, and each of the one or more light emitters can comprise a broken or separated light-emitter tether.

In some embodiments, ones of the light-emitter electrodes pass through the light-emitter assembly substrate or ones of the light-emitter electrodes each wrap around an edge of the light-emitter assembly substrate. Each of the one or more light-emitter assembly connection posts or each of the one or more module connection posts can be a multi-layer connection post or a single-layer connection post.

In some embodiments, each of the one or more module connection posts or each of the light-emitter assembly connection posts can protrude from a light-emitter assembly substrate a distance that is greater than a thickest thickness of one or more light emitters. The distance can be at least 1.1 times (e.g., at least 1.2 times) and no more than 3 times the thickest thickness.

In some embodiments, a light-emitter assembly comprises a module substrate and one or more contact pads disposed on or in the module substrate and one or more light-emitter assembly connection posts is disposed in electrical connection with one of the one or more contact pads. The module substrate can comprise a module tether (e.g., a broken or separated module tether or a module tether that is physically connected to an anchor portion of a source substrate).

In some embodiments, a light-emitter assembly comprises a controller disposed on a side of the module substrate opposite the one or more light emitters, wherein the one or more light emitters are electrically connected to the controller. The light-emitter assembly can have at least one of: at least one of a width and a length of no more than 400 microns (e.g., no more than 300 microns, no more than 200 microns, or no more than 100 microns), and a thickness of no more than 150 microns (e.g., no more than 100 microns, no more than 75 microns, no more than 50 microns, or no more than 25 microns).

According to some embodiments of the present disclosure, a controller assembly comprises a controller assembly substrate having a first side and a second side opposite the first side, a controller disposed on or in the controller assembly substrate, one or more controller assembly connection posts disposed on the first side of the controller assembly substrate, one or more module connection posts disposed on the second side of the controller assembly substrate, and controller electrodes that electrically connect the controller to the one or more controller assembly connection posts and to the one or more module connection posts. A controller can be disposed on a second side of a controller assembly substrate. A controller assembly substrate can comprise a broken or separated controller assembly tether. A controller assembly substrate can be a dielectric substrate or a semiconductor substrate. A controller can be disposed on a controller assembly substrate and can be non-native to an assembly substrate. A controller can comprise a broken or separated controller tether. Ones of the controller electrodes can pass through a controller assembly substrate or can each wrap around an edge of the controller assembly substrate.

In some embodiments, a controller assembly comprises a module substrate, wherein each of the one or more controller assembly connection posts is disposed in electrical connection with a contact pad disposed on or in the module substrate. The module substrate can comprise a module tether (e.g., a broken or separated tether or wherein the module tether is physically connected to an anchor portion of a source substrate). A controller assembly can comprise one or more light emitters disposed on a side of a module substrate opposite a controller, wherein one or more light emitters are electrically connected to the controller. A controller assembly can have at least one of: at least one of a width and a length of no more than 400 microns (e.g., no more than 300 microns, no more than 200 microns, or no more than 100 microns) and a thickness of no more than 150 microns (e.g., no more than 100 microns, no more than 75 microns, no more than 50 microns, or no more than 25 microns).

In some embodiments, one or more module connection posts are disposed on a controller such that the controller is disposed between one or more module connection posts and a controller assembly substrate. Each of the one or more controller assembly connection posts or module connection posts can be a multi-layer connection post or a single-layer connection post. One or more module connection posts can protrude from a controller assembly substrate a distance that is greater than a thickness of the controller and the distance can be at least 1.1 times (e.g., at least 1.2 times), no more than 3 times the thickness, or both.

In some embodiments of the present disclosure, a controller assembly comprises a controller assembly substrate, a controller disposed on a first side of the controller assembly substrate, one or more module connection posts disposed on the controller, one or more controller assembly connection posts disposed on a second side of the controller assembly substrate that is opposite the first side, and controller electrodes disposed at least partially on the controller assembly substrate, wherein the controller electrodes are electrically connected to the controller, the one or more controller assembly connection posts, and the one or more module connection posts. The controller assembly substrate can be a dielectric substrate, or a semiconductor substrate, and the controller can be non-native to the controller assembly substrate. A controller can comprise a broken or separated controller tether. A controller assembly substrate can comprise a broken or separated controller assembly tether. A dielectric can be disposed between the controller and at least a portion of each of the controller electrodes. Ones of the controller electrodes can pass through a controller assembly substrate or wrap around an edge of the controller assembly substrate.

According to some embodiments of the present disclosure, a pixel module comprises a dielectric module substrate having a light-emitter surface and a controller surface that is opposite the light-emitter surface, a controller assembly disposed on the controller surface of the module substrate, one or more light emitters disposed on or over the module substrate, and module electrodes that electrically connect the one or more light emitters to the controller. One or more light emitters can be a light-emitter assembly.

In some embodiments, an adhesive layer is disposed on a controller surface of a module substrate. One or more controller assembly connection posts of a controller assembly can penetrate through an adhesive layer and each can physically contact a contact pad disposed on or in the module substrate. The adhesive layer can be in direct contact with the controller assembly. Ones of the module electrodes can pass through a module substrate or wrap around an edge of a module substrate. In some embodiments, a pixel module according to the present disclosure comprises an adhesive layer disposed on a light-emitter surface of a module substrate. One or more light-emitter connection posts of each of the one or more light emitters can penetrate through an adhesive layer such that the one or more light emitters are electrically connected to a controller. The adhesive layer can be disposed over ones of the module electrodes.

In some embodiments of the present disclosure, one or more light emitters each comprise a broken or separated light-emitter tether, one or more light emitters are horizontal light-emitting diodes, one or more light emitters are vertical light-emitting diodes, or each of the one or more light emitters comprises one or more light-emitter connection posts and the one or more light emitters are electrically connected to the controller in part through the one or more light-emitter connection posts.

According to some embodiments, a module substrate comprises a broken or separated module tether. A light-emitter encapsulation layer can be disposed over the one or more light emitters and the light-emitter encapsulation layer can comprise a broken or separated module tether. A controller encapsulation layer can be disposed over the controller assembly and one or more module connection posts can protrude through the controller encapsulation layer.

In some embodiments of the present disclosure, a pixel module comprises a target substrate, such as a display substrate. One or more module connection posts of the controller assembly can be disposed in electrical contact with a corresponding one or more contact pads disposed on or in the target substrate. An adhesive layer can be disposed on the target substrate and one or more module connection posts can penetrate through the adhesive layer such that the controller and the one or more light emitters are electrically connected to one or more module electrodes disposed on or in the target substrate. The target substrate can be a display substrate and the pixel module can be a pixel in an array of pixels disposed on the display substrate that are operable to display information (e.g., an image and/or text) to a viewer.

According to embodiments of the present disclosure, a method of making a pixel module comprises providing a controller, module electrodes, and module connection posts disposed on a module substrate that is disposed on or in a module source wafer, wherein the module electrodes are in electrical contact with the controller, transferring the controller, the module electrodes, the module connection posts, and the module substrate to a carrier such that the controller is disposed between the carrier and the module substrate, removing the module source wafer without removing the module substrate, disposing a light emitter on the module substrate such that the module substrate is disposed between the controller and the light emitter, wherein the light emitter is non-native to the module substrate, and electrically connecting the light emitter to the controller in order to form the pixel module. The providing step can comprise disposing the controller on the module substrate, wherein the controller is non-native to the module substrate, disposing a patterned first dielectric layer on the controller, disposing the module electrodes on the patterned first dielectric layer and in electrical contact with the controller, and disposing the module connection posts. The providing step can further comprise disposing a second dielectric layer on the module electrodes such that the module connection posts protrude from the second dielectric layer. The second dielectric layer and the dielectric substrate can together encapsulate the module electrodes and the controller. Methods of the present disclosure can comprise forming a patterned sacrificial release layer on the second dielectric layer prior to the transferring step, wherein the patterned sacrificial release layer covers the one or more module connection posts. The patterned sacrificial release layer can be at least partially removed, for example by etching, after disposing the light emitter. A portion of the second dielectric layer can be disposed in a common plane with the module substrate such that the controller and the light emitter remain connected to the carrier by the portion of the second dielectric layer after the patterned sacrificial release layer is at least partially removed. Methods of the present disclosure can comprise printing (e.g., micro-transfer printing) a pixel module from a carrier to a target substrate (e.g., a display substrate).

Methods of the present disclosure can comprise forming additional module electrodes on a surface of the module substrate opposite the controller. A light emitter can be printed such that light emitter connection posts electrically connected to the light emitter come into electrical contact with the additional module electrodes. An unpatterned adhesive layer can be provided on the additional module electrodes and the module substrate prior to disposing the light emitter and the adhesive layer can be patterned after disposing the light emitter such that the adhesive layer after patterning does not extend beyond the module substrate.

According to some embodiments, a light emitter comprises a broken or separated tether or a controller comprises a broken or separated tether.

Methods of the present disclosure can comprise providing a first encapsulating layer disposed on or over the controller such that the module substrate and the first encapsulating layer together encapsulate the controller and disposing a second encapsulating layer on or over the light emitter such that the module substrate and the second encapsulating layer together encapsulate the light emitter.

A controller can be electrically connected to the light emitter at least in part by one or more module electrodes that pass through or around the edge of the module substrate. Methods of the present disclosure can comprise printing (e.g., micro-transfer printing) a pixel module from a carrier to a target substrate (e.g., a display substrate).

According to some embodiments of the present disclosure, one or more light emitters, a controller, or both the one or more light emitters and the controller are bare, unpackaged die.

According to some embodiments of the present disclosure, a controller comprises a controller top side and a controller bottom side. The controller top side can be electrically connected to a module electrode or an electrical conductor electrically connected to a module electrode. The controller bottom side can be in contact with the module substrate or layers disposed on the module substrate.

According to some embodiments of the present disclosure, an integrated-circuit module, for example a pixel module, comprises a semiconductor substrate having a native side and an opposing device side (e.g., an LED or light-emitter side), a device (e.g., a light emitter such as a light-emitting diode or LED) disposed on (e.g., on or over) the device side of the semiconductor substrate, a native integrated circuit (e.g., a controller) formed on or in the native side of the semiconductor substrate, and an electrode via comprising an electrode extending through the semiconductor substrate, the electrode electrically connected to the integrated circuit (e.g., controller) and to the device (e.g., LED), wherein the integrated circuit (e.g., controller) is native to the semiconductor substrate and the device (e.g., LED) is non-native to the semiconductor substrate. The semiconductor substrate can be a semiconductor wafer. The integrated-circuit module (e.g., pixel module) can comprise a plurality of electrode vias, each electrode via of the plurality of electrode vias comprising an electrode extending through the semiconductor substrate, the electrode electrically connected to the integrated circuit (e.g., controller) and to the device (e.g., LED). The integrated-circuit module (e.g., pixel module) can comprise a plurality of devices (e.g., LEDs), each disposed on or over the device side. The plurality of LEDs can comprise a red LED operable to emit red light, a green LED operable to emit green light, and a blue LED operable to emit blue light. The integrated circuit can be operable to control the device, the device can be operable to control the integrated circuit, or the controller can be operable to control the LED. The LED can be disposed to emit light in a direction away from the semiconductor substrate.

According to some embodiments, the integrated circuit has an integrated-circuit (controller) surface on a side of the integrated circuit opposite the native side of the semiconductor substrate and the integrated circuit (or integrated-circuit module) comprises an integrated-circuit connection post disposed on or over the integrated-circuit (controller)

surface or on or over the native side of the semiconductor substrate. The integrated-circuit connection post can extend in a direction away from the semiconductor substrate and beyond the integrated circuit. The integrated-circuit connection post can electrically connect to at least one of the electrode and the native integrated circuit, or both.

According to some embodiments, a device connection post is disposed on or over the device side extending in a direction away from the semiconductor substrate and beyond the LED. The device connection post can be electrically connected to the device (e.g., LED), to the integrated circuit (e.g., controller), or to the electrode.

According to some embodiments, the electrode via comprises a sidewall dielectric disposed around a perimeter of the electrode via that electrically insulates the electrode from the semiconductor substrate. The electrode can be surrounded by the sidewall dielectric.

According to some embodiments, a light shield is disposed between the LED and the semiconductor substrate.

According to some embodiments, the device (e.g., LED) is non-native to the semiconductor substrate and comprises (i) a fractured, broken, or separated device tether, (ii) the device is a bare, unpackaged die, or (iii) both (i) and (ii). The device can have at least one of a width and a length of no more than 100 microns, e.g., no more than 50 microns, no more than 20 microns, no more than 10 microns, or no more than 5 microns.

According to some embodiments, an integrated-circuit module or pixel module can comprise an encapsulation layer disposed over the device (e.g., LED). The encapsulation layer can comprise a fractured, broken, or separated module tether. Thus, according to some embodiments, the integrated-circuit module or pixel module can comprise a fractured, broken, or separated module tether. According to some embodiments, the integrated-circuit module or pixel module can comprise a bare, unpackaged die. According to some embodiments, the semiconductor substrate has at least one of a width and a length of no more than 400 microns (e.g., no more than 200 microns, no more than 50 microns, or no more than 25 microns).

According to some embodiments, the native integrated circuit or controller comprises one or more circuit connections (e.g., wires), one or more active elements (e.g., transistors and diodes), or a combination of both one or more circuit connections and one more active components and a resolution of the one or more circuit connections or one or more active elements, or the combination of both the one or more circuit connections and the one more active components is greater than a resolution of the electrode. The active elements can be at least partially formed in a material (e.g., semiconductor material such as silicon) of the semiconductor substrate with or without material doping, diffusing or implantation.

According to some embodiments, the semiconductor substrate is made of single crystalline silicon such that the integrated circuit comprises the single crystalline silicon and the LED comprises a compound semiconductor. According to some embodiments, a pixel module comprises a dielectric layer disposed on the semiconductor substrate such that the dielectric layer is disposed between the LED and the semiconductor substrate and the LED is electrically insulated from the semiconductor substrate by the dielectric layer. According to some embodiments, a pixel module comprises a light shield disposed between the semiconductor substrate and the LED.

According to some embodiments of the present disclosure, a pixel-module display comprises a display substrate and one or more pixel modules disposed on the display substrate (for example in an array) and electrically connected to one or more electrical conductors disposed on the display substrate. An adhesive layer can be disposed on the display substrate that adheres the one or more pixel modules to the display substrate. The pixel modules can be pixels in the pixel-module display and emit light responsive to signals from a display controller.

According to some pixel-module display embodiments of the present disclosure, for each of the one or more pixel modules, a pixel module comprises a connection post extending away from the semiconductor substrate (semiconductor wafer) and electrically connected to the electrode and to the electrical conductor. The pixel modules can be disposed on the pixel substrate and electrical conductor by micro-transfer printing. According to some embodiments, the controller of each pixel module of the one or more pixel modules is disposed between the LED and the display substrate. The LED can emit light away from the display substrate. According to some embodiments, the LED of each pixel module of the one or more pixel modules is disposed between the controller and the display substrate, the display substrate is at least 20% (e.g., at least 40%, 50%, 60%, 70%, 80%, 85%, 90%, or 95%) transparent to light emitted by the LED, and the LED is disposed to emit light through the display substrate.

According to embodiments of the present disclosure, a module wafer, (e.g., an integrated-circuit-module wafer or a pixel-module wafer) comprises a semiconductor substrate having a native side and an opposing device side, a plurality of native integrated circuits (e.g., native controller) formed on or in the native side of the semiconductor substrate, a plurality of electrode vias each comprising an electrode extending into the semiconductor substrate, the electrode electrically connected to a corresponding native integrated circuit (e.g., native controller), and a plurality of etch vias extending into the semiconductor substrate, each etch via forming a wall disposed at least partially around (e.g., at least partially surrounding) each native integrated circuit (e.g., native controller) and corresponding electrode via. Each native integrated circuit and corresponding electrode forms an integrated-circuit module. According to some embodiments, the pixel-module wafer comprises a patterned sacrificial layer disposed on or over the native side, the patterned sacrificial layer comprising a sacrificial portion, and the entire controller and at least a portion of the etch via are disposed over (e.g., directly over in a direction orthogonal to the native side) the sacrificial portion. According to some embodiments, the electrode via and the etch via extend through the semiconductor substrate. According to some embodiments, the electrode via and the etch via extend into but not through the semiconductor substrate. The etch via can be filled with a via sacrificial material or filled with a combination of sidewall dielectric and via sacrificial material, where the via sacrificial material extends entirely through the etch via.

A non-native device (e.g., a non-native LED) can be disposed on or over the device side of the semiconductor substrate, the non-native device (e.g., the non-native LED) electrically connected to the electrode. The non-native device (e.g., non-native LED) is non-native to the semiconductor substrate and the non-native device (e.g., non-native LED) can be originally constructed on a device source wafer or substrate separate, individual, and independent from the semiconductor substrate and transferred to the device side of the semiconductor substrate (or transferred to a layer, such as a dielectric layer, disposed on the device side of the semiconductor substrate), for example by micro-transfer printing.

According to embodiments of the present disclosure, a module wafer comprises a bonding layer disposed a side of the patterned sacrificial layer opposite the semiconductor substrate and a carrier wafer bonded to the bonding layer on a side of the bonding layer opposite the patterned sacrificial layer and the semiconductor substrate.

According to some embodiments of the present disclosure, a module wafer (e.g., an integrated-circuit-module wafer or a pixel-module wafer) comprises a plurality of electrode vias, each electrode via comprising an electrode, and a plurality of LEDs, wherein the electrode of each of the plurality of electrode vias is electrically connected to the native integrated circuit (e.g., a native controller), and comprising a plurality of devices (e.g., LEDs). Each device of the plurality of devices is disposed on or over the device side of the semiconductor substrate and electrically connected to an electrode of the plurality of electrode vias.

An encapsulation layer can be disposed over the device(s) (e.g., LED(s)). The encapsulation layer can be patterned to expose at least a portion of the etch via and to extend over and beyond a portion of the etch via. The portion of the encapsulation layer extending over and beyond the portion of the etch via can form a tether that physically connects the module (e.g., comprising a native integrated circuit such as a controller and a non-native device such as an LED) to the semiconductor substrate. The etch via can be etched forming a gap in the semiconductor substrate and the patterned sacrificial layer can be etched forming a gap between the controller and the bonding layer, so that the integrated-circuit module (e.g., pixel module) is suspended over the semiconductor substrate.

According to some embodiments, a module wafer (e.g., an integrated-circuit-module wafer or a pixel-module wafer), for each of the one or more integrated-circuit modules or pixel modules, comprises one or more connection posts extending away from the semiconductor substrate and electrically connected to the electrode.

According to some embodiments, a module wafer (e.g., an integrated-circuit-module wafer or a pixel-module wafer) comprises a single semiconductor substrate (e.g., a bulk semiconductor wafer, such as silicon) having a device side and an opposing native side. A plurality of integrated-circuit modules (e.g., pixel modules) comprising a corresponding plurality of native integrated circuits (e.g., native controllers) are disposed on or in the native side of the semiconductor substrate and a plurality of electrode vias are disposed in the semiconductor substrate, each electrode via of the plurality of electrode vias comprising an electrode extending into the semiconductor substrate, the electrode electrically connected to a corresponding native integrated circuit (e.g., native controller) of the plurality of native integrated circuits (e.g., native controllers). An etch via is disposed around each native integrated circuit (e.g., each native controller) of the plurality of native integrated circuits (e.g., native controllers) and each corresponding electrode via of the plurality of electrode vias. Each controller and corresponding electrode via forms a pixel module surrounded by a corresponding etch via. Each electrode via of the plurality of electrode vias and each etch via of the plurality of etch vias can extend through the semiconductor substrate. The module wafer can comprise a plurality of devices (e.g., LEDs) disposed on the device side and electrically connected to each native integrated circuit (e.g., native controller) of the plurality of native integrated circuits (e.g., native controllers).

According to some embodiments, a method of making a module (e.g., a pixel module) comprises providing a semiconductor substrate having a native side and an opposing device side, forming a native integrated circuit (e.g., a native controller) in or on the native side of the semiconductor substrate, forming an electrode via comprising an electrode extending into the semiconductor substrate and an etch via forming a wall around at least a portion of the native integrated circuit (e.g., native controller) and the electrode via, electrically connecting the electrode to the native integrated circuit (e.g., native controller) with an integrated-circuit contact pad, disposing a patterned sacrificial layer comprising sacrificial portions over the native integrated circuit (e.g., native controller), the electrode, and the etch via, providing a carrier wafer and bonding the carrier wafer to the patterned sacrificial layer with a bonding layer, optionally removing a portion of the semiconductor substrate to expose the electrode via and the etch via, optionally forming a device contact pad on or over the light-emitting side of the semiconductor substrate in electrical contact with the electrode, and disposing a non-native device (e.g., a non-native LED) on or over the device side of the semiconductor substrate and electrically connecting the non-native device (e.g., the non-native LED) to the electrode, thereby forming the pixel module that comprises the LED, the semiconductor substrate, the controller, and the electrode via comprising the electrode.

According to some embodiments, a method of making a module (e.g., a pixel module) comprises disposing a patterned encapsulation layer over the non-native device (e.g., the non-native LED), the patterned encapsulation layer exposing at least a portion of the etch via and extending over and beyond a portion of the etch via. According to some embodiments, a method of making a module (e.g., a pixel module) comprises etching the etch via and the patterned sacrificial portion forming a gap in the semiconductor substrate and forming a gap between the native integrated circuit (e.g., a native controller) and the bonding layer, thereby forming a tether and suspending the controller over the bonding layer. According to some embodiments, a method of making a module (e.g., a pixel module) comprises micro-transfer printing the module (e.g., pixel module) from the carrier wafer to a target or destination substrate (e.g., a display substrate). According to some embodiments, a method of making a module (e.g., a pixel module) comprises micro-transfer printing a non-native device (e.g., a non-native LED) from a device source wafer (e.g., an LED source wafer) to the device side or to a layer, such as a dielectric layer, disposed on the device side.

According to some embodiments of the present disclosure, an integrated-circuit module comprises a plurality of devices disposed on the device side, wherein each of the plurality of devices is non-native to the semiconductor substrate. The integrated-circuit module can be unpackaged. The integrated circuit can be operable to control the device.

In some embodiments, a pixel-module wafer comprises a plurality of pixel modules, each comprising a respective controller formed on or in a native side of a respective semiconductor substrate and a respective electrode via extending through the respective semiconductor substrate, the respective electrode via comprising a respective electrode, the respective electrode electrically connected to the respective controller; and a respective etch via disposed around the respective controller of each of the plurality of pixel modules (e.g., and the respective electrode via) [e.g., wherein the respective semiconductor substrate of each of the plurality of pixel modules is formed from a common semiconductor substrate (e.g., a single crystal of silicon)]. In some embodiments, the respective electrode via and the respective etch via extend through the respective semiconductor substrate, and each of the plurality of pixel modules comprises one or more non-native light-emitting diodes (LEDs) disposed on a device side of the semiconductor substrate opposite the native side and electrically connected to the respective controller.

In some embodiments, an integrated-circuit module wafer comprises a plurality of pixel modules, each comprising a respective integrated circuit formed on or in a native side of a respective semiconductor substrate and a respective electrode via extending through the respective semiconductor substrate, the respective electrode via comprising a respective electrode, the respective electrode electrically connected to the respective integrated circuit; and a respective etch via disposed around the respective integrated of each of the plurality of integrated-circuit modules (e.g., and the respective electrode via) [e.g., wherein the respective semiconductor substrate of each of the plurality of integrated-circuit modules is formed from a common semiconductor substrate (e.g., a single crystal of silicon)]. In some embodiments, the respective electrode via and the respective etch via extend through the respective semiconductor substrate, and each of the plurality of integrated-circuit modules comprises one or more non-native devices disposed on a device side of the semiconductor substrate opposite the native side and electrically connected to the respective integrated circuit.

Certain embodiments of the present disclosure provide methods, devices, and structures for a highly-integrated module that incorporates high-performance crystalline semiconductor light emitters and controllers in a transfer-printable configuration suitable for printing to a display substrate to construct a high-performance and high-resolution display.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 1-3 are cross sections of various pixel modules according to illustrative embodiments of the present disclosure;

FIGS. 5-8 are cross sections of various light-emitter assemblies according to illustrative embodiments of the present disclosure;

FIGS. 11A-11C are cross sections of printing structures from a source wafer according to illustrative embodiments of the present disclosure;

FIGS. 15A-15I are successive cross sections of structures according to illustrative methods and embodiments of the present disclosure;

FIGS. 16A-16M are successive cross sections of structures according to illustrative methods and embodiments of the present disclosure;

FIGS. 17A-17L are successive cross sections of structures according to illustrative embodiments of the present disclosure;

Figure 1:
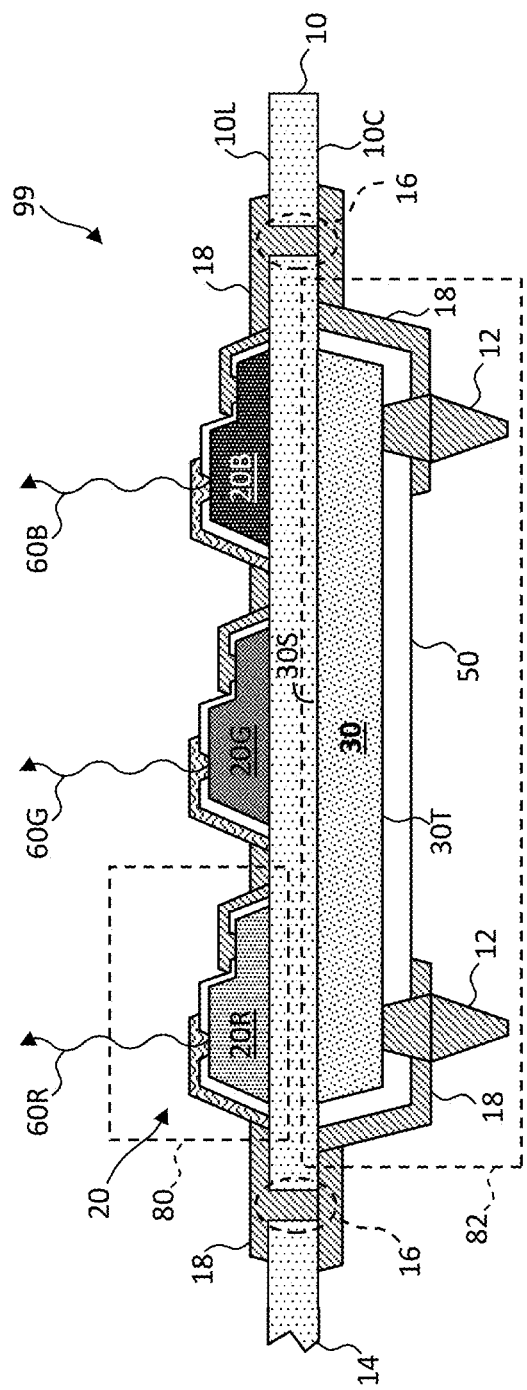

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

Certain embodiments of the present disclosure provide, inter alia, integrated circuit modules having a native integrated circuit disposed on one side of a semiconductor substrate and a non-native device (and, in some embodiments, a plurality of non-native devices) disposed on an opposing side of the semiconductor substrate and methods of making and using the same. The modules can be made on a module source wafer and disposed on a target substrate in an electronic or opto-electronic system. Such an arrangement provides increased circuit density, module testability, and flexible integration in a variety of formats and configurations for a variety of applications.

Certain embodiments of the present disclosure provide an integrated pixel module comprising one or more inorganic micro-light-emitting diodes (micro-iLEDs) and at least one integrated circuit controller that controls the one or more micro-iLEDs. A pixel module can comprise (i) a single pixel with a single micro-iLED light emitter and a single controller, (ii) a single pixel with multiple micro-iLEDs and a single controller, for example emitting red, green, and blue light, (iii) multiple pixels comprising a common single controller, each pixel controlled by the same controller, or (iv) multiple pixels comprising multiple pixel controllers, for example one controller in each pixel. Thus, a pixel module can comprise one or multiple pixels, each pixel comprising one or multiple micro-iLEDs. Where certain examples of pixel modules are shown and described herein below with reference to a single controller and a single light emitter or multiple light emitters, pixel modules with multiple controllers and/or multiple light emitters (e.g., corresponding to a plurality of pixels) with similar relative arrangements of elements are also contemplated. In some embodiments, a pixel is a picture element in a display that is separately controlled from all other pixels to emit light corresponding to a picture element of an image. A plurality of pixel modules can be mounted on a display substrate and electrically connected to form a display. Each pixel module comprises a single module substrate that is separate and independent from other pixel module substrates, and that is separate and independent from, and non-native to, the display substrate. Pixel modules can be constructed using printing techniques, for example micro-transfer printing, and can be assembled on a target substrate, such as a display substrate or a surface-mount device substrate, using similar methods, materials, and tools.

Flat-panel displays according to certain embodiments of the present disclosure have improved performance compared to flat-panel displays using thin-film circuits disposed on the display substrate, e.g., low-temperature polysilicon or amorphous silicon thin-film circuits. Micro-transfer printed pixel integrated-circuit controllers (pixel control circuits) made in monocrystalline silicon, such as CMOS, can provide better performance in less space over a display substrate and micro-transfer printed micro-iLEDs can provide improved color saturation, lifetime, and efficiency in a flat-panel display. Micro-iLEDs can be much smaller than conventional LEDs used in large-format displays and can therefore provide displays with much greater resolution. According to certain embodiments of the present disclosure, micro-iLEDs and pixel controller integrated circuits have different, separate, independent, and distinct substrates comprising a variety of materials and are provided in different layers over the same area of the module substrate, thereby reducing the pixel area over the display substrate and facilitating increased display resolution and improved operational performance.

Figure 2:
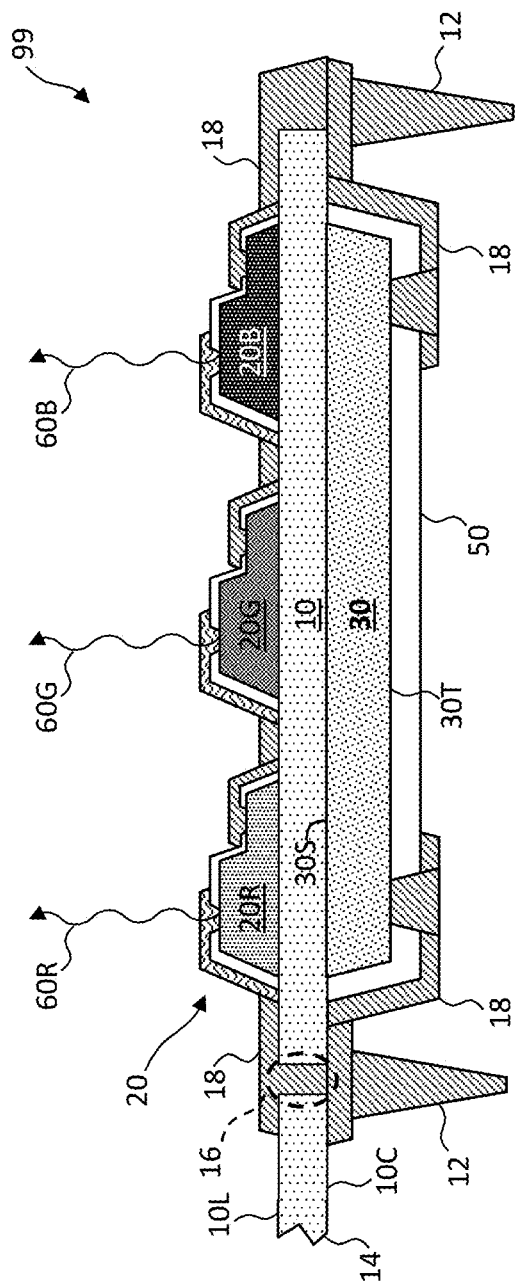

Referring to FIGS. 1-3, and according to some embodiments of the present disclosure, a pixel module 99 comprises a module substrate 10 having a module light-emitter surface 10L and a module controller surface 10C on a side of module substrate 10 opposite module light-emitter surface 10L. Module light-emitter surface 10L can be a module light-emitter side 10L of module substrate 10 and module controller surface 10C can be a module controller side 10C of module substrate 10. One or more light emitters 20 are disposed on module light-emitter surface 10L of module substrate 10. As shown in FIGS. 1-3, the one or more light emitters 20 comprises red-, green-, and blue-light emitters 20R, 20G, 20B that emit red light 60R, green light 60G, and blue light 60B, respectively. Red-light, green-light, and blue-light emitters 20R, 20G, 20B are collectively referred to as light emitters 20 and red light, green light, and blue light 60R, 60G, 60B are collectively referred to as light 60. (It is noted that reference herein to light emitters 20 herein does not necessarily imply that the light emitters 20 comprise a red-, green-, or blue-light emitter 20R, 20G, 20B and reference herein to light 60 does not necessarily imply that the light 60 comprises a distinct red, green, or blue frequency.) A controller 30 is disposed on module controller surface 10C of module substrate 10. Controller 30 is operable to and can control the one or more light emitters 20, for example in response to one or more input signals, through module electrodes 18. Controller 30 can be made in an epitaxial layer disposed on module substrate 10 (e.g., a buried oxide (BOx) layer, for example as found in a semiconductor-on-insulator (SOI) wafer) and can be constructed before any bulk silicon of the SOI wafer is removed and light emitters 20 are disposed on module light-emitter surface 10L. Each module electrode 18 is an electrical conductor that conducts electrical signals, such as, for example, power, ground, or control signals. At least one module electrode 18 passes through module substrate 10, for example through via 16. In some embodiments, at least one module electrode 18 wraps around an edge of module substrate 10 (e.g., as shown in FIG. 2). At least one module electrode 18 is electrically connected to controller 30. At least one module electrode 18 is electrically connected to at least one light emitter 20 of the one or more light emitters 20. Each pixel module 99 can be an individual (e.g., separate), discrete, and independent module with a separate, different, distinct, discrete, and individual module substrate 10 that is distinct and different from the module substrate 10 of any other pixel module 99 or any light-emitter assembly substrate 52 of a light-emitter assembly 80 or controller assembly substrate 54 of a controller assembly 82, if present. Each pixel module 99 can be a printable pixel module 99, for example comprising at least a portion of a module tether 14.

Any number of module electrodes 18 can be included in a pixel module 99, for example four, a ground and a power control signal for each of the three light emitter 20. Some module electrodes 18 can connect only to controller 30, only to one or more light emitters 20, or to an external power, ground, or signal source. Light emitters 20 can emit light 60 in a direction away from controller 30 and module substrate 10, as shown in FIGS. 1-3. Module substrate 10 can be at least partially coated with a black matrix to absorb ambient light and improve the contrast of light emitters 20 (not shown in the Figures). For example, module light-emitter surface 10L of module substrate 10 can be at least partially coated with a black matrix, as can module controller surface 10C.

Figure 6:
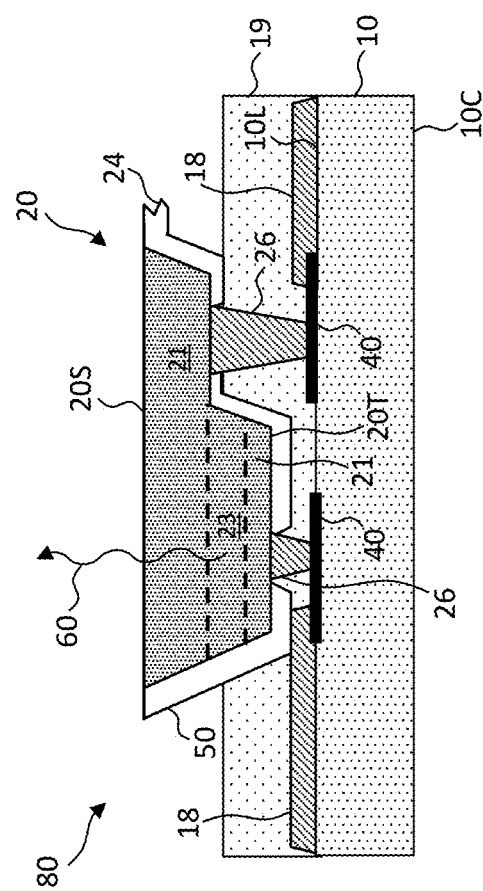

Module substrate 10 can be any suitable substrate, for example as found in the display or integrated circuit industry. In some embodiments, module substrate 10 is glass, polymer, sapphire, quartz, or a semiconductor such as silicon and can be coated with, or comprise, an adhesive layer 19 (e.g., as shown in FIG. 6, discussed below). Module substrate 10 can be a free-standing substrate that is applied to or disposed on a surface, for example a wafer or other substrate surface or can be constructed or formed on a surface, for example a wafer or other substrate surface (e.g., for later transfer printing to a target substrate 70). Module substrate 10 can comprise multiple layers, for example any combination of an oxide or nitride layer, a seed layer, and a semiconductor layer. Module substrate 10 can be or comprise a buried-oxide layer of an SOI wafer. Useful semiconductor layers can be any one or combination of silicon, crystalline silicon, and anisotropically etchable silicon. In some embodiments of the present disclosure, module substrate 10 has sufficient mechanical rigidity, strength, and thickness to support light emitters 20 and controllers 30 and to enable printing (e.g., micro-transfer printing) pixel module 99, for example in the absence of other layers or structures that are co-extensive with module substrate 10. For example, module substrate 10 has light emitters 20 and controller 30 are disposed thereon, rather than a layer coated over light emitters 20 or controller 30. Module light-emitter surface 10L and module controller surface 10C of module substrate 10 can each be substantially or effectively planar, can be substantially or effectively parallel to each other, or can be substantially or effectively both planar and parallel to each other. Module substrate 10 can be relatively thin, for example a few microns (e.g., 1 to 100 microns) or relatively thick (e.g., 100 microns to 1 mm).

Light emitters 20 can be micro-iLEDs made in crystalline semiconductor materials, such as compound semiconductors GaN or GaAs with suitable dopants such as indium, aluminum, or phosphorus, using photolithographic methods and materials, and can emit light of various colors, such as red, green, blue, yellow, or cyan. Light emitters 20 can be bare, unpackaged die with patterned insulating dielectric structures 50 insulating the bare, unpackaged die from electrodes (e.g., module electrodes 18). Light emitters 20 can be relatively small, for example a few microns in length and/or width (e.g., 1 to 50 microns) or somewhat larger in length and/or width (e.g., 50 to 500 microns or even 1 mm) and, optionally, can be relatively thin, for example a few microns thick (e.g., 1-10 microns) or somewhat thicker (e.g., 10-100 microns).

Figure 9:
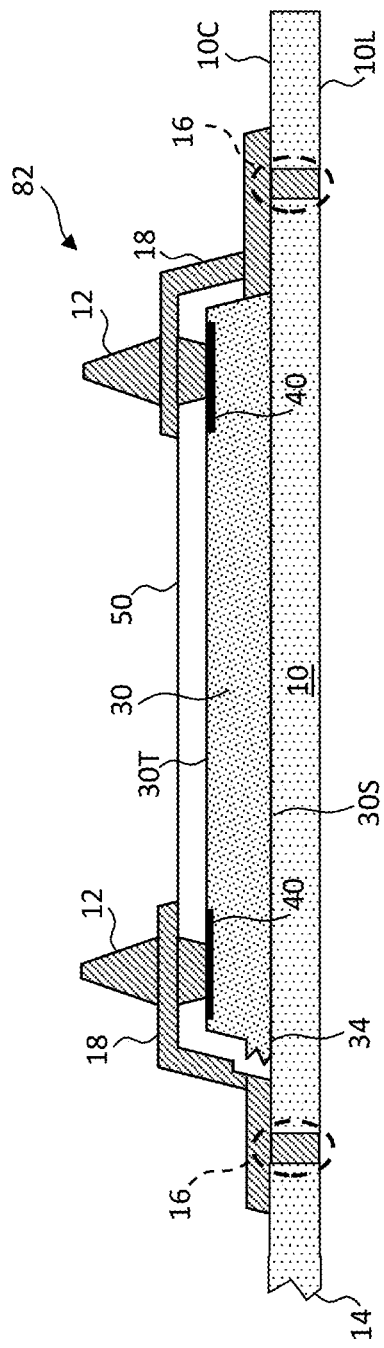
FIGS. 9 and 10A-10C are cross sections of various controller assemblies according to illustrative embodiments of the present disclosure.

Controller 30 can be an integrated circuit made using photolithographic methods and materials, for example CMOS circuits made using a semiconductor such as crystalline silicon. GaAs circuits or other compound semiconductors can also be used. Controller 30 can be a bare, unpackaged die with patterned insulating dielectric structures 50 insulating the bare, unpackaged die from electrodes (e.g., module electrodes 18). Controller 30 can be formed in and native to an epitaxial layer disposed on module substrate 10. Controller 30 can be relatively small, for example having at least one of a length and a width less than or equal to one mm (e.g., less than or equal to 750 microns, less than or equal to 500 microns, less than or equal to 250 microns, less than or equal to 100 microns, less than or equal to 50 microns, less than or equal to 25 microns, less than or equal to 10 microns, less than or equal to 5 microns, or less than or equal to 2 microns), and can be made at any suitable resolution, as is practiced in the integrated circuit arts. Controller 30 can have a controller top side 30T and an opposing controller bottom side 30S. In some embodiments, controller top side 30T has electrical contact pads 40 (e.g., as shown in FIG. 9) or is otherwise electrically connected to electrodes (e.g., module electrodes 18 or electrical conductors electrically connected to module electrodes 18) and controller bottom side 30S is in contact with module substrate 10 or layers disposed on module substrate 10.

Module electrodes 18 can be electrically conductive traces or wires, for example constructed in a patterned metal layer using photolithographic processes, for example comprising metals such as aluminum, gold, silver, copper, titanium, tantalum, tin, or other metals or metal alloys, or transparent conductive oxides such as indium tin oxide. Module electrodes 18 can, for example, pass through or wrap around module substrate 10, for example through vias 16 formed in module substrate 10. Module electrodes 18 can be at least partially disposed on a surface of module substrate 10, for example module light-emitter surface 10L and module controller surface 10C, as well as on light emitters 20 or controller 30 (when suitably insulated from semiconductor materials or active components with patterned dielectric 50) or other layers (e.g., dielectric or cured adhesive layers 19) disposed on module substrate 10. Thus, module electrodes 18 can electrically connect controller 30 to one or more light emitters 20 so that controller 30 can control light emitters 20 with control, power, or ground signals. Module electrodes 18 can also connect external controllers and power and ground signals to one or more elements in a pixel module 99. One module electrode 18 can electrically connect multiple light emitters 20 in common, for example providing a power or ground signal connection or can be individually connected to each light emitter 20 to provide individual control signals to corresponding light emitters 20.

Referring to FIG. 1, light-emitter assembly 80 comprises light emitter 20, any light-emitter electrical contact pads 40, light-emitter circuits, or light-emitter electrodes 28 (not shown in FIG. 1, see FIG. 8 discussed further below) and portions of module electrodes 18 electrically connected to light emitters 20. Controller assembly 82 comprises controller 30, any controller electrical contact pads 40, controller circuits, or controller electrodes 38 (not shown in FIG. 1, see FIGS. 10A-10C discussed below) and portions of module electrodes 18 electrically connected to light emitters 20. Pixel module 99 can comprise module tether 14 (e.g., which may be broken or separated) and also comprises module connection posts 12, described further below with reference to different module connection post 12 embodiments illustrated in FIGS. 1, 2, and 3.

Figure 4A:
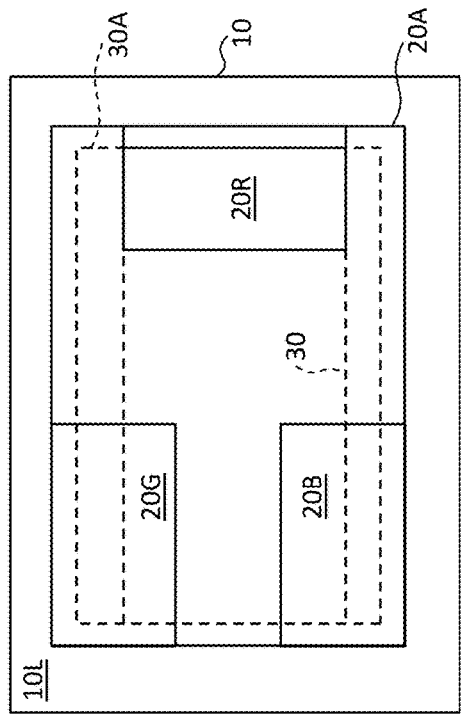
FIGS. 4A-4C are plan views of a module substrate according to illustrative embodiments of the present disclosure.
Figure 4B:
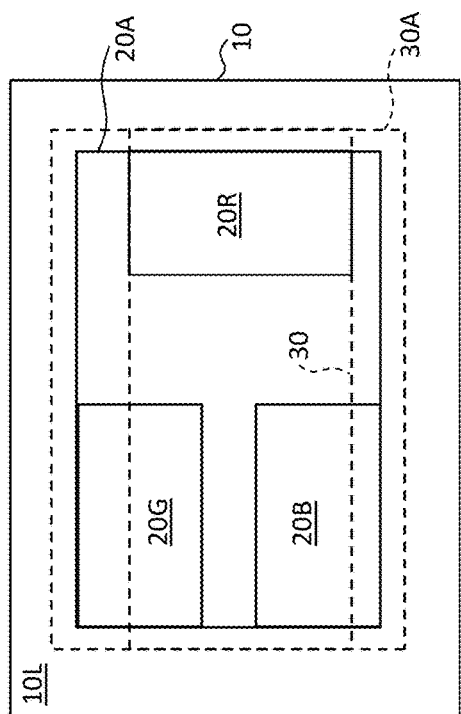
Figure 4C:
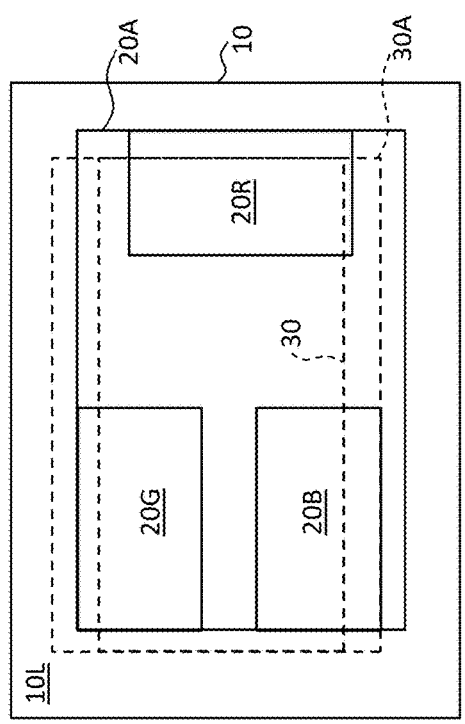

Referring to FIGS. 4A-4C, light-emitter assemblies 80 can be disposed within a light-emitter area 20A on module light-emitter surface 10L of module substrate 10, for example within an area or convex hull including all light emitters 20 such as red-, green-, and blue-light emitters 20R, 20G, 20B. Controller assembly 82 can be disposed within a controller area 30A on module controller surface 10C (not indicated) that is opposite light-emitter surface 10L, for example within an area or convex hull including controller 30. Light-emitter area 20A can overlap controller area 30A on module substrate 10 when viewed from a vertical direction orthogonal to a surface of module substrate 10 (although light-emitter area 20A is vertically displaced with respect to controller area 30A in a direction orthogonal to module light-emitter surface 10L or module controller surface 10C because light emitters 20 are on module light-emitter surface 10L and controller 30 is on module controller surface 10C of module substrate 10). In some embodiments, light-emitter area 20A is smaller than or equal to and disposed entirely within controller area 30A (as shown in FIG. 4A). In some embodiments, controller area 30A is smaller than or equal to and disposed entirely within light-emitter area 20A. In some embodiments, controller area 30A and light-emitter area 20A overlap but neither is entirely within the area of the other. (As intended herein, an area can be within another area if they have a common edge. For example, if light-emitter area 20A is the same size as and congruent with controller area 30A, light-emitter area 20A is within controller area 30A, and vice versa.) Thus, in some embodiments of the present disclosure, pixels have a smaller area over a display substrate (e.g., display substrate 70 in FIG. 12A, discussed below) because light emitters 20 are vertically stacked over controller 30, increasing the number of pixels that can be disposed on a display substrate 70 and improving the potential resolution of a display constructed with pixel modules 99.

FIGS. 5-8 illustrate light-emitter assemblies 80 according to certain embodiments of the present disclosure that are disposed on module light-emitter surface 10L of module substrate 10. Module electrodes 18 conduct electricity to light emitter 20. Micro-iLED light emitters 20 can comprise two conduction layers 21 (e.g., an n-doped electron-conduction layer and a p-doped hole-conduction layer) that are electrically connected to module electrodes 18 and a light-emission layer 23 disposed between the two conduction layers 21 from which light 60 is emitted in response to electrical current provided through module electrodes 18. Module electrodes 18 can be reflective, for example made of a metal or metal alloy, or partially or substantially transparent, for example made of a conductive oxide. Light 60 can be emitted from either a light-emitter top side 20T or a light-emitter bottom side 20S opposite the light-emitter top side 20T and can be emitted through module electrodes 18 if they are at least partially transparent.

Figure 5:
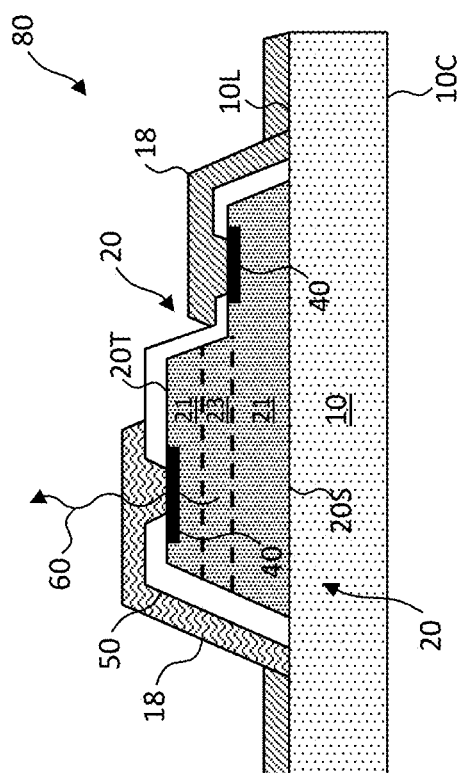

Referring to FIG. 5, light emitter 20 is a horizontal light emitter 20 with electrical contacts (e.g., contact pads 40) spaced apart on a same light-emitter top side 20T of light emitter 20 opposite light-emitter bottom side 20S adjacent to or in contact with module light-emitter surface 10L of module substrate 10. Module electrode 18 or an electrical conductor electrically connected to a module electrode 18 (e.g., light-emitter electrode 28 shown in FIG. 8) can be electrically connected to light-emitter top side 20T. One conduction layer 21 extends in a cantilever structure beyond the other conduction layer 21 to provide electrical contacts on light-emitter top side 20T of light emitter 20. Light 60 can be emitted from light-emitter top side 20T if module electrode 18 over light-emission layer 23 is effectively transparent, as shown in FIG. 5 with differentiated shading. Referring to FIG. 6, light-emitter top side 20T is in contact with or adjacent to module light-emitter surface 10L of module substrate 10 and light is emitted through light-emitter bottom side 20S of light emitter 20. In this disclosure, an orientation of light emitter 20 relative to module substrate 10 as shown in FIG. 6 is called an inverted configuration, whereas FIG. 5 illustrates a non-inverted configuration of light emitter 20 relative to module substrate 10. In some embodiments, light emitter 20 is in an inverted horizontal configuration and at least some module electrodes 18 are opaque and reflective. In some embodiments, and as discussed further below, a light emitter 20 is in a horizontal configuration and one or more light-emitter connection posts 26 are used to electrically connect light emitter 20 in a light-emitter assembly 80 of a pixel module 99 (e.g., as shown in FIG. 6).

A vertical micro-iLED light emitter 20 with electrical contacts provided on opposite sides of light emitter 20 is illustrated in FIG. 7. Typically, one of the module electrodes 18 is effectively transparent, for example module electrode 18 on light-emitter top side 20T, and the other on light-emitter bottom side 20S adjacent to module light-emitter surface 10L of module substrate 10 can be opaque and reflective, so that light 60 is efficiently emitted from light emitter 20 in a direction away from module substrate 10 and controller 30.

When disposed (e.g., constructed or printed) on module substrate 10, components such as light emitters 20 and controllers 30 can be electrically connected (for example to an external control device or power source) using photo-lithographically disposed and patterned module electrodes 18. As shown in FIGS. 1, 2, 3, and 5, photolithographically defined module electrodes 18 extend from module light-emitter surface 10L over patterned dielectric structures 50 onto light emitters 20. Module electrodes 18 can comprise an opaque material, such as a metal or metal alloy, a transparent conductive oxide, or a combination, as shown with the different module electrode shading in the cited figures.

In some embodiments, referring to FIG. 6, electrical connections to light emitter 20 are made through one or more light-emitter connection posts 26 that extend from light emitter 20 (for example from a light-emitter contact pad, not shown) to module electrode 18. Such a configuration is useful, for example, when light-emitter top side 20T is adjacent to module light-emitter surface 10L of module substrate 10 (an inverted configuration). Light-emitter connection posts 22 extending from light-emitter top side 20A adjacent to module light-emitter surface 10L enable light emitter 20 to emit light through light-emitter bottom side 20S without requiring that light 60 emitted by light emitter 20 pass through a module electrode 18 or light-emitter contact pad, thereby possibly improving light-emission efficiency. Light-emitter connection posts 26 disposed on a common light emitter 20 can have different lengths or sizes (e.g., as shown in FIG. 6). For example, light-emitter connection posts 26 with different lengths or sizes can be used to accommodate electrical contacts on a horizontal light-emitting diode that are in different layers. In some such embodiments, the light-emitter connection posts 26 can orient light emitter 20 so that light-emitter bottom side 20S is approximately parallel to module light-emitter surface 10L of module substrate 10 and the direction of light emission is more orthogonal to module light-emitter surface 10L, improving uniformity of light emission for an array of such light emitters 20. Light-emitter connection posts 26 (or module connection posts 12, controller assembly connection posts 32, or light-emitter assembly connection posts 22, described further below) can be constructed using photolithographic processes and examples are described in U.S. patent application Ser. No. 15/876,949, U.S. Pat. Nos. 10,153,256, and 10,224,231, referenced above, the disclosure of each of which is hereby incorporated by reference herein its entirety.

According to some embodiments of the present disclosure, light-emitter assembly connection posts 22 have an advantage in that they enable electrical connections to be formed by printing (e.g., micro-transfer printing with a stamp 90, see, e.g., FIG. 11C discussed below) light emitters 20 onto module light-emitter surface 10L of module substrate 10, thus precluding the need to photolithographically construct module electrodes 18 that extend over patterned dielectric structures 50 onto light emitters 20. Referring to FIG. 8, according to some embodiments of the present disclosure, a light-emitter assembly 80 comprises light-emitter assembly connection posts 22 that extend from one side of a light-emitter assembly substrate 52 (comprising dielectric layer 50) and a light emitter 20 is disposed on an opposite side of dielectric layer 50. Light-emitter 20 can be disposed on light-emitter assembly substrate 52 (dielectric layer 50) by printing (e.g., micro-transfer printing) from a native light-emitter source wafer 25 (see, e.g., FIG. 11A, discussed below) to dielectric layer 50, thereby breaking (e.g., fracturing) or separating light-emitter tether 24. Light-emitter electrodes 28 electrically connected to contact pads 40 for light emitter 20 electrically connect through vias 16 in dielectric 50 to light-emitter assembly connection posts 22. Light-emitter assembly connection posts 22 are in direct contact with, pierce, or otherwise form an electrical connection with contact pads 40 on module light-emitter surface 10L of module substrate 10 and to module electrodes 18. Light-emitter assembly 80 can be constructed by photolithographically etching pyramidal depressions in a sacrificial portion 84 of a source wafer (see, e.g., FIGS. 11A-11C), patterning the depressions with metal to form light-emitter assembly connection posts 22, forming vias 16 in dielectric layer 50, transfer printing (e.g., micro-transfer printing) light emitter 20 onto dielectric layer 50 (or an adhesive layer on dielectric layer 50, not shown) and forming light-emitter electrodes 28 to electrically connect light-emitter assembly connection posts 22 with contact pads 40 of light emitters 20. Light-emitter assembly 80 can be printed, for example micro-transfer printed) to module substrate 10, thereby breaking (e.g., fracturing) or separating light-emitter assembly tether 24A.

Thus, some embodiments of the present disclosure comprise a light-emitter assembly 80 comprising a dielectric light-emitter assembly substrate 52 having a first side and a second side opposite the first side and one or more light emitters 20 disposed on light-emitter assembly substrate 52. The one or more light emitters 20 can be non-native to light-emitter assembly substrate 52. One or more light-emitter assembly connection posts 22 can be disposed on the first side of light-emitter assembly substrate 52 and one or more module connection posts 12 can be disposed on the second side of light-emitter assembly substrate 52. Light-emitter assembly 80 can comprise light-emitter assembly tethers 24A (e.g., which are broken or separated upon transfer printing to a module substrate 10) and light-emitters 20 can comprise light-emitter tethers 24. Light-emitter electrodes 28 electrically connect the one or more light emitters 20 to one or more light-emitter assembly connection posts 22 and to one or more module connection posts 12. One or more module connection posts 12 are subsequently used to electrically connect a pixel module 99, of which light-emitter assembly 80 is a part, to a target substrate 22. One or more of the light-emitter electrodes 28 can pass through light-emitter assembly substrate 52, for example through vias 16, or can wrap around an edge of light-emitter assembly substrate 52. Light-emitter assembly connection posts 22 and module connection posts 12 can be single-layer connection posts (e.g., formed by building up conductive material) or multi-layer connection posts (e.g., comprising an electrically conductive outer layer disposed on a dielectric inner layer made of the same material as light-emitter assembly substrate 52). Each of the one or more module connection posts 12 or each of the light-emitter assembly connection posts 22 of light-emitter assembly 80 can protrude from light-emitter assembly substrate 52 a distance that is greater than a thickest thickness of one or more light emitters 20, so that light-emitter assembly 80 can be printed to a target substrate and the connection posts can make electrical contact with the target substrate. The distance can be at least 1.1 times, and optionally no more than 3 times, the thickest thickness. In some embodiments, light-emitter assembly 80 comprises a module substrate 10 having one or more contact pads 40 disposed on or in module substrate 10 and each of the one or more light-emitter assembly connection posts 22 is disposed in electrical connection with one of the one or more contact pads 40. Module substrate 10 can comprises a module tether 14 (e.g., a broken or separated module tether 14 or a module tether 14 that is physically connected to a module anchor 17 of a source substrate). In some embodiments, light-emitter assembly 80 comprises a controller 30 disposed on a side of module substrate 10 opposite the one or more light emitters 20 and the one or more light emitters 20 are electrically connected to controller 30. Light-emitter assembly 80 can have at least one of a width and a length of no more than 400 microns (e.g., no more than 300 microns, no more than 200 microns, or no more than 100 microns) and a thickness of no more than 150 microns (e.g., no more than 100 microns, no more than 75 microns, no more than 50 microns, or no more than 25 microns).

Figure 10A:
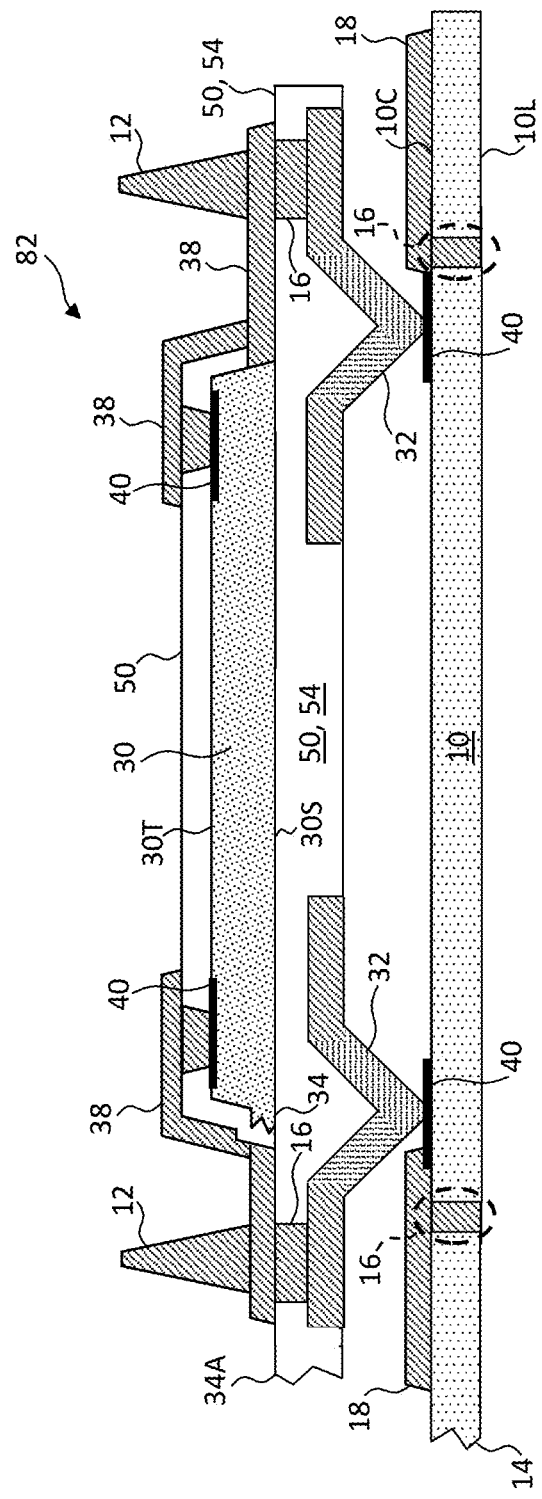
Figure 10B:
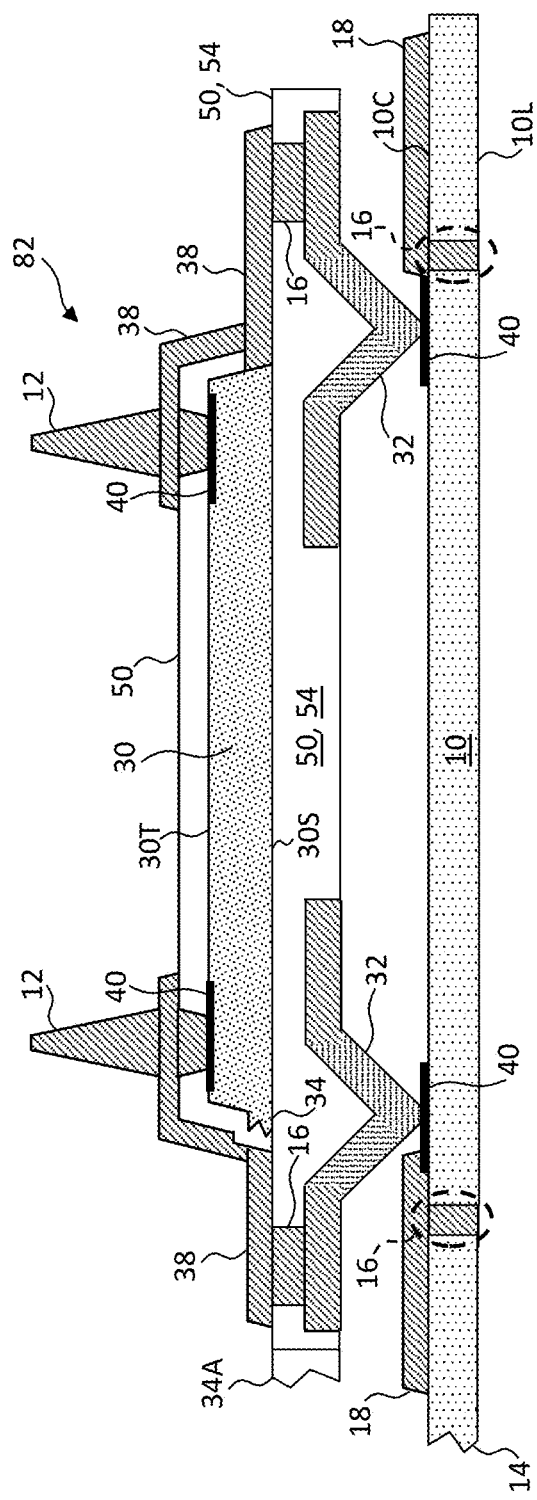

FIGS. 9 and 10A-10B illustrate certain embodiments of controller assemblies 82. Referring to FIG. 9, controller 30 is disposed (e.g., constructed or printed) on module controller surface 10C of module substrate 10. Module electrodes 18 are insulated from controller 30 with dielectric structure 50 and electrically connected to contact pads 40 of controller 30 and in vias 16. module electrodes 18 are photolithographically patterned after controller 30 is disposed on module substrate 10 and module connection posts 12 (discussed further below) are formed on or over controller 30.

FIGS. 10A and 10B illustrate certain embodiments in which controller 30 is electrically connected with controller assembly connection posts 32 (similarly to light-emitter assembly connection posts 22 of FIG. 8), obviating the need for further photolithographic patterning after controller 30 is disposed on module substrate 10. Referring to FIG. 10A, according to some embodiments of the present disclosure, a controller assembly 82 comprises controller assembly connection posts 32 that extend from a side of a dielectric layer 50 opposite a side on which a controller 30 is disposed. Controller electrodes 38 electrically connected to contact pads 40 for controller 30 electrically connect through vias 16 in dielectric 50 to controller assembly connection posts 32. Controller assembly connection posts 32 are in direct contact with, pierce, or otherwise form an electrical connection with contact pads 40 on module controller surface 10C of module substrate 10 and to module electrodes 18. Controller assembly 82 can be constructed by photolithographically etching pyramidal depressions in a sacrificial portion 84 of a source wafer, patterning the depressions with metal to form controller assembly connection posts 32, forming vias 16 in dielectric layer 50, transfer printing (e.g., micro-transfer printing) light emitter 20 onto dielectric layer 50 (or an adhesive layer 19 on dielectric layer 50, not shown) and forming controller electrodes 38 to electrically connect controller assembly connection posts 32 with contact pads 40 of controller 30. Module connection posts 12 are disposed on or over and extend away from dielectric layer 50.

Thus, some embodiments of the present disclosure comprise a controller assembly 82 comprising a controller assembly substrate 54 having a first side and a second side opposite the first side and a controller 30 disposed on controller assembly substrate 54. Controller assembly substrate 54 can be a dielectric substrate or a semiconductor substrate. Controller 30 can, for example, be constructed on controller assembly substrate 54 or transfer printed (e.g., micro-transfer printed) to controller assembly substrate 54. Thus, in some embodiments, controller 30 can be non-native to controller assembly substrate 54. Controller 30 can be formed in controller assembly substrate 54, for example if controller assembly substrate 54 is a semiconductor substrate or can be disposed on a dielectric controller assembly substrate 54. One or more controller assembly connection posts 32 can be disposed on the first side of controller assembly substrate 54 and one or more module connection posts 12 can be disposed on the second side of controller assembly substrate 54. Controller electrodes 38 electrically connect controller 30 to one or more controller assembly connection posts 32 and to one or more module connection posts 12. One or more of the controller electrodes 38 can pass through controller assembly substrate 54, for example through vias 16, or can wrap around an edge of controller assembly substrate 54. Controller assembly connection posts 32 and module connection posts 12 can be single-layer connection posts (e.g., formed by building up conductive material) or multi-layer connection posts (e.g., comprising an electrically conductive outer layer disposed on a dielectric inner layer made of the same material as controller assembly substrate 54). Each of the one or more module connection posts 12 or each of the controller assembly connection posts 32 of controller assembly 82 can protrude from controller assembly substrate 54 a distance that is greater than a thickest thickness of controller 30, so that controller assembly 82 can be printed to a target substrate and the connection posts can contact the target substrate. The distance can at least 1.1 times, and optionally no more than 3 times, the thickest thickness. In some embodiments, controller assembly 82 comprises a module substrate 10 having one or more contact pads 40 disposed on or in module substrate 10 and each of the one or more controller assembly connection posts 32 is disposed in electrical connection with one of the one or more contact pads 40. Module substrate 10 can comprises a module tether 14 (e.g., a broken or separated module tether 14 or a module tether 14 that is physically connected to a module anchor 17 of a source substrate). In some embodiments, controller assembly 82 comprises one or more light-emitters 20 disposed on a side of module substrate 10 opposite controller 30 and the one or more light emitters 20 are electrically connected to controller 30. Controller assembly 82 can have at least one of a width and a length of no more than 400 microns (e.g., no more than 300 microns, no more than 200 microns, or no more than 100 microns) and a thickness of no more than 150 microns (e.g., no more than 100 microns, no more than 75 microns, no more than 50 microns, or no more than 25 microns).

The module connection post 12 configuration shown in FIG. 9 can also be applied to controller assembly 82 of FIG. 10A, as shown in FIG. 10B. Thus, some embodiments of the present disclosure comprise a controller assembly 82 comprising a controller assembly substrate 54 and a controller 30 disposed on a first side of controller assembly substrate 54. One or more module connection posts 12 are disposed on controller 30 so that controller 30 is between the one or more module connection posts 12 and controller assembly substrate 54. One or more controller assembly connection posts 32 are disposed on a second side of controller assembly substrate 54 that is opposite the first side. Controller electrodes 38 are disposed at least partially on controller assembly substrate 54 and are electrically connected to controller 30, the one or more controller assembly connection posts 32, and the one or more module connection posts 12. Controller assembly substrate 54 can be, for example, a dielectric substrate or a semiconductor substrate. Controller 30 can be non-native to controller assembly substrate 54. Controller 30 can comprise a broken or separated controller tether 34. Controller assembly substrate 54 can comprise a broken or separated controller assembly tether 34A. A dielectric layer or structure can be disposed between controller 30 and at least a portion of each of the controller electrodes 38 (e.g., to prevent shorting). In some embodiments, one or more of the controller electrodes 38 pass through controller assembly substrate 54 or one or more of the controller electrodes 38 each wrap around an edge of controller assembly substrate 54.

Figure 10C:
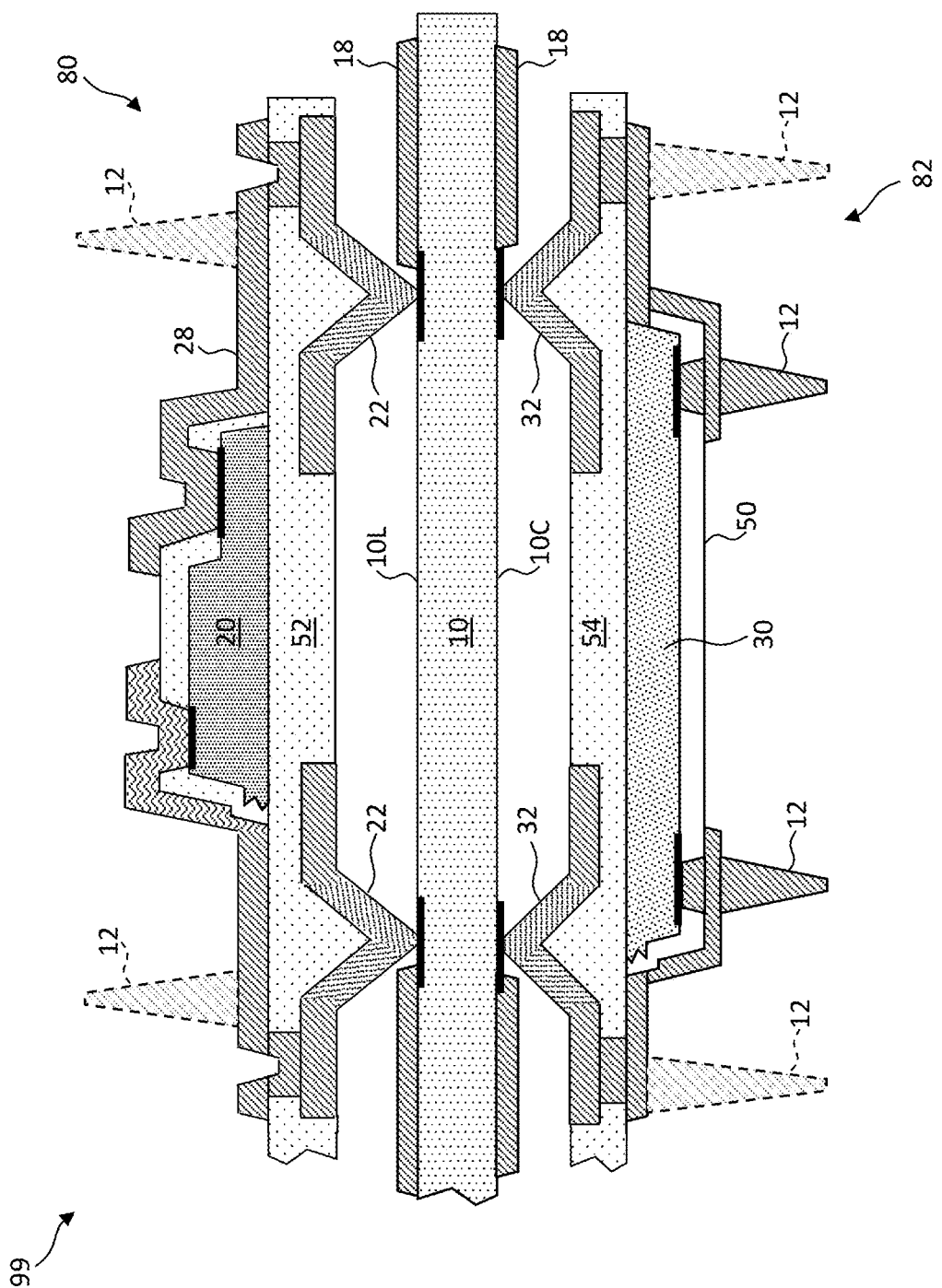

Assemblies in accordance with FIGS. 8 and 10A or 10B can be combined into a pixel module 99, for example as shown in FIG. 10C, in which light-emitter assembly 80 is illustrated in FIG. 8 and controller assembly 82 is illustrated in either of FIG. 10A or 10B. In some embodiments, a controller assembly 82 in accordance with FIG. 9 is used in combination with a light-emitter assembly 80 in accordance with FIG. 8 (as further discussed below with reference to FIG. 12K). As shown in FIG. 10C, according to some embodiments of the present disclosure, a pixel module 99 comprises a dielectric module substrate 10 having a module light-emitter surface 10L and a module controller surface 10C that is opposite module light-emitter surface 10L. A controller assembly 82 is disposed on module controller surface 10C of module substrate 10. Controller assembly 82 can be any of the controller assemblies 82 described herein. One or more light emitters 20 are disposed on or over module substrate 10, for example on module light-emitter surface 10L, and module electrodes 18 electrically connect the one or more light emitters 20 to controller 30. In some embodiments of the present disclosure, one or more light emitters 20 are a light-emitter assembly 80 that can be any of the light-emitter assemblies 80 described herein.

Module connection posts 12 are shown in the embodiments of FIG. 10C as projecting from controller 30 but, in similar embodiments, could project from controller assembly substrate 54 or, in the other direction, from light-emitter assembly substrate 52. These alternative module connection posts 12 are illustratively shown in lighter shading with dashed outlining. Any one of these embodiments can be employed in pixel modules 99 of the present disclosure. Likewise, light emitters 20 are illustrated as non-inverted horizontal light emitters 20 (e.g., as in FIG. 5), but could be inverted light emitters 20 (e.g., as in FIG. 6), or vertical light emitters 20 (e.g., as in FIG. 7). It is contemplated that the particular choice of materials (e.g., for module electrodes 18, assembly substrates 52, 54, or module substrate 10) as well as orientations and positions of elements (e.g., of controller 30, light emitters 20, or module connection posts 12) can be interdependent and vary depending on a particular application for which pixel module 99 is to be used. For example, a certain orientation position of module connection posts 12 and material may be chosen based on which direction light is to be emitted from pixel module 99.

In some embodiments, pixel module 99 comprises an adhesive layer (e.g., adhesive layer 19, not shown in FIG. 10C for clarity) disposed on module controller surface 10C of module substrate, 10. In some embodiments, one or more controller assembly connection posts 32 of controller assembly 82 penetrate through adhesive layer 19 and each physically contact a contact pad 40 disposed on or in module substrate 10. Adhesive layer 19 can be in direct contact with controller assembly 82. In some embodiments, one or more light-emitter assembly connection posts 22 of light-emitter assembly 80 penetrate through adhesive layer 19 and each physically contact a contact pad 40 disposed on or in module substrate 10. Adhesive layer 19 can be in direct contact with light-emitter assembly 80. As can be understood from FIG. 10C, an adhesive layer 19 can be provided on both controller surface 10C and light-emitter surface 10L of module substrate 10 to improve physical adherence of controller assembly 82 and light-emitter assembly 80, respectively. In some embodiments, pixel module 99 comprises an adhesive layer (e.g., adhesive layer 19, not shown in FIG. 10C for clarity) disposed on module light-emitter surface 10L of module substrate 10 and one or more light-emitter assembly connection posts 22 of each of one or more light emitters 20 penetrate through adhesive layer 19 so that one or more light emitters 20 are electrically connected to controller 30. Adhesive layer 19 can be disposed at least partially on or over one or more module electrodes 18.

In some embodiments, ones of the module electrodes 18 pass through module substrate 10 or wrap around an edge of module substrate 10. In some embodiments of the present disclosure, the one or more light emitters 20 can each comprise a broken or separated light-emitter tether 24, the one or more light emitters 20 are horizontal light-emitting diodes, or the one or more light emitters 20 are vertical light-emitting diodes. Each of the one or more light emitters 20 can comprise one or more light-emitter connection posts 26 and the one or more light emitters 20 can be electrically connected to controller 30 in part through the one or more light-emitter connection posts 26.

In some embodiments of the present disclosure, module substrate 10 comprises a broken or separated module tether 14. A light-emitter encapsulation layer 29 (not shown in FIG. 10C, but shown, for example, in FIGS. 16L and 16M) can be disposed over one or more light emitters 20 and can comprise a broken or separated module tether 14. Similarly, pixel module 99 can comprise a controller encapsulation layer 39 disposed over controller assembly 82 and one or more module connection posts 12 can protrude through controller encapsulation layer 39 (e.g., as shown in FIGS. 16L and 16M). In some embodiments, one or more module connection posts 12 protrude through light-emitter encapsulation layer 29. Pixel module 99 can comprise a target substrate 70 (not shown in FIG. 10C, see FIGS. 12A-12K discussed below, for example), and one or more module connection posts 12 of controller assembly 82 are disposed in electrical contact with a corresponding one or more contact pads 40 disposed on or in target substrate 70. An adhesive layer 19 (not shown in FIG. 10C) can be disposed on target substrate 70, and one or more module connection posts 12 can penetrate through adhesive layer 19 so that controller 30 and one or more light emitters 20 are electrically connected to one or more module electrodes 18 disposed on or in the target substrate 70. Target substrate 70 can be a display substrate 70 and pixel module 99 can be a pixel in an array of pixels disposed on display substrate 70 that are operable to display information (e.g., an image and/or text) to a viewer.

Either light emitters 20 or controller(s) 30, or both, can be formed or disposed on module substrate 10. Light emitters 20 can comprise micro-iLEDs that are advantageously made on compound semiconductor substrates such as GaN or GaAs. In contrast, controller 30 is typically (although not necessarily) formed in crystalline silicon. Thus, some embodiments of pixel module 99 are desirably heterogeneous modules comprising components made in different materials that are disposed on opposite sides of module substrate 10. According to some embodiments of the present disclosure, pixel modules 99 are therefore constructed using components printed (e.g., micro-transfer printed) from different component source wafers to module substrate 10.

Referring to FIG. 11A, a light emitter 20, for example a micro-iLED, is formed on a light-emitter source wafer 25 (e.g., a compound semiconductor source wafer) and can be encapsulated with a light-emitter encapsulation layer 29. Encapsulation layer 29 can be a dielectric layer. A sacrificial portion 84 of light-emitter source wafer 25 beneath light emitter 20 is etched to form a gap 84 so that light emitter 20 is suspended over gap 84 by light-emitter tether 24. Light-emitter tether 24 attaches light emitter 20 to light-emitter anchor 27 and holds light emitter 20 in position over light-emitter source wafer 25. A printing device, for example a stamp 90 with one or more stamp posts 92, contacts light emitter 20 (including light-emitter encapsulation layer 29), adheres light emitter 20 to stamp post 92, and moves away from light-emitter source wafer 25, fracturing light-emitter tether 24 at fracture line 11 to remove light emitter 20 from light-emitter source wafer 25 and making a broken (e.g., fractured) or separated light-emitter tether 24. Stamp 90 then travels to module substrate 10 and light emitter 20 is pressed against module light-emitter surface 10L of module substrate 10 to adhere light emitter 20 to module substrate 10 (or to an adhesive layer 19 disposed on, or a part of, module substrate 10). Multiple light emitters 20 can be printed (e.g., micro-transfer printed) from a light-emitter source wafer 25 in a single operation, for example using a stamp 90 having multiple stamp posts 92.

Similarly, with respect to FIG. 11B, a controller 30, for example a CMOS circuit formed in crystalline silicon, is formed on a controller source wafer 35 and can be encapsulated with a controller encapsulation layer 39. Encapsulation layer 39 can be a dielectric layer. A sacrificial portion 84 of controller source wafer 35 beneath controller 30 is etched to form gap 84 so that controller 30 is suspended over gap 84 by controller tether 34. Controller tether 34 attaches controller 30 to controller anchor 37 and holds controller 30 in position over controller source wafer 35. A printing device, for example stamp 90 with stamp post 92, contacts controller 30 (including controller encapsulation layer 39), adheres controller 30 to stamp post 92, and moves away from light-emitter source wafer 25, fracturing controller tether 34 at fracture line 11 to remove controller 30 from controller source wafer 35 and making a broken (e.g., fractured) or separated controller tether 34. Stamp 90 then travels to module substrate 10 and controller 30 is pressed against module controller surface 10C of module substrate 10 to adhere controller 30 to module substrate 10 (or to an adhesive layer 19 disposed on, or a part of, module substrate 10). Multiple controllers 30 can be printed (e.g., micro-transfer printed) from a controller source wafer 35 in a single operation, for example using a stamp 90 having multiple stamp posts 92.

Figure 11C:
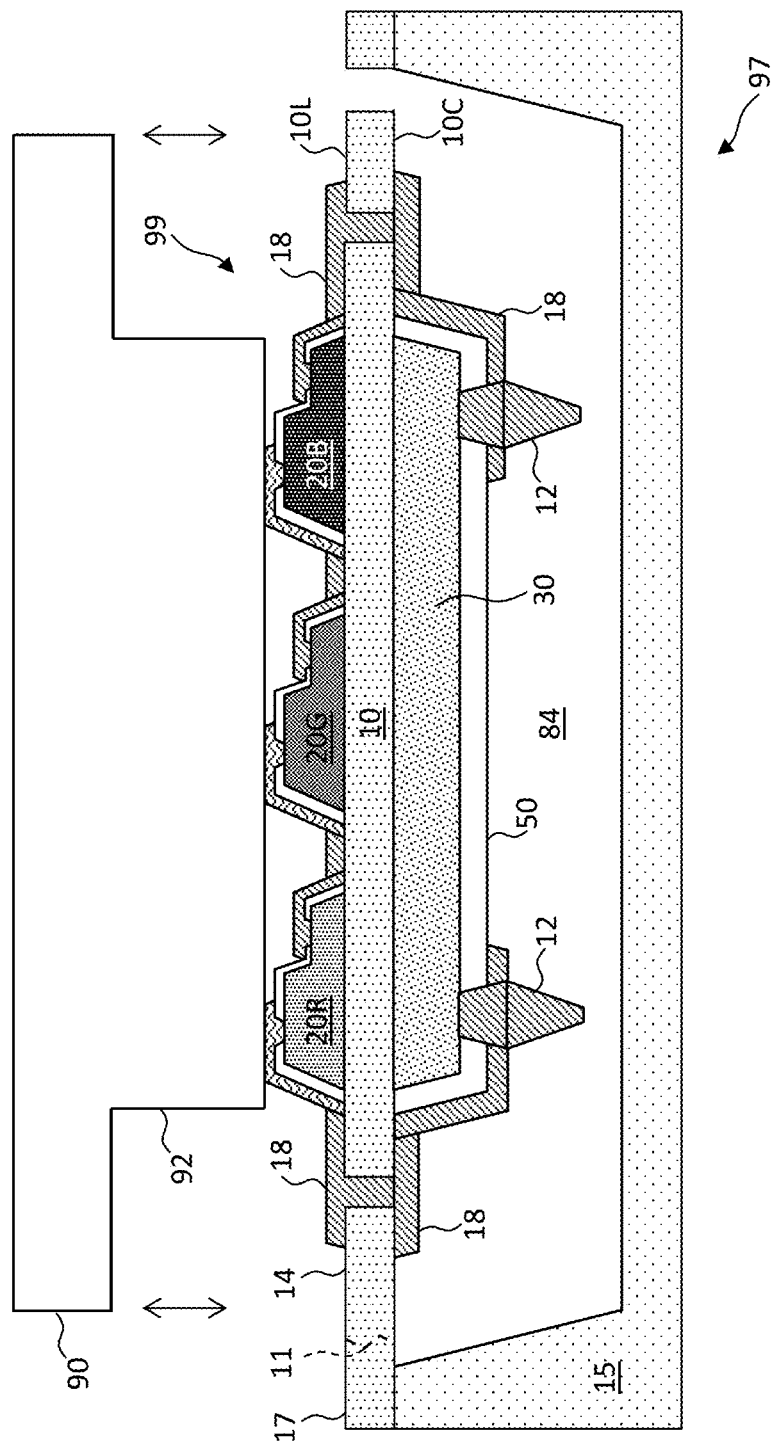

Just as either light emitter 20 or controller 30, or both, can be printed to module substrate 10, pixel module 99 can also be printed, for example micro-transfer printed, to a target substrate 70, for example a display substrate 70. As shown in FIG. 11C, a pixel-module wafer 97 comprises a module source wafer 15 that can comprise a plurality of pixel modules 99, each pixel module 99 disposed over a sacrificial portion 84 or gap 84 in module source wafer 15 and physically connected to a module anchor 17 (an anchor portion of module source wafer 15) with a module tether 14 so that each sacrificial portion 84 is laterally separated from an adjacent sacrificial portion by a module anchor 17. An encapsulation layer (not shown) can be provided, as in FIGS. 11A and 11B, but is not necessarily required. A printing device, for example stamp 90 with stamp post 92, contacts pixel module 99, adheres pixel module 99 to stamp post 92, and moves away from module source wafer 15, fracturing module tether 14 at fracture line 11 to remove pixel module 99 from module source wafer 15 and making a broken (e.g., fractured) or separated module tether 14. In some embodiments, a module tether 14 is separated, instead of fractured, during printing. Stamp 90 then travels to a target substrate 70, such as a display substrate 70 (discussed further below) or surface-mount device substrate, and pixel module 99 is pressed against the target substrate to adhere pixel module 99 to the target substrate (or to an adhesive layer 19 disposed on, or a part of, the target substrate).

As shown in FIGS. 8-10 and 11A-11C, one or more of light emitters 20, controllers 30, and pixel modules 99 can all be printed (e.g., micro-transfer printed) components. Referring to FIGS. 12A-12K, 13A-13B, and 14A-14D, in some embodiments of the disclosure pixel modules 99 are printed to a display substrate 70 to construct a pixel-module display 98. Thus, pixel modules 99 can be non-native to display substrate 70, can be disposed in a regular array in either one or two dimensions (for example as shown in FIGS. 14A-14D and FIG. 24 discussed below), and can form pixels in a display. Moreover, module substrate 10 of each pixel module 99 is different, distinct, and separate from display substrate 70 so that each module substrate 10 is a different substrate from display substrate 70. Pixel modules 99 can include module connection posts 12 that are in electrical contact with contact pads 40 disposed on or in target substrate 70, contact pads 40 being electrically connected to display electrodes 74. Contact pads 40 can be portions of display electrodes 74 that are sized and positioned to contact module connection posts 12 when pixel module 99 is disposed on target substrate 70 (e.g., as shown in FIGS. 12I and 12J).

FIGS. 12A-12K show examples of pixel modules 99 where controller 30 is disposed between module substrate 10 and target substrate 70. The pixel modules 99 shown in FIGS. 12A and 12B do not include module connection posts 12. The pixel modules 99 shown in FIGS. 12C and 12D have module connection posts 12 disposed on controller 30. The pixel modules 99 shown in FIGS. 12E and 12F have module connection posts 12 disposed on module substrate 10 rather than on controller 30. The pixel modules 99 shown in FIGS. 12G and 12H include a controller assembly 82 that includes module connection posts 12 disposed on controller assembly substrate 54. The pixel modules 99 shown in FIGS. 12I and 12J include module connection posts 12 disposed on module substrate 10 and a controller assembly 82 that does not include module connection posts 12. The pixel module 99 shown in FIG. 12K includes a light-emitter assembly 80 and module connection posts disposed on controller 30.

Figure 13A:
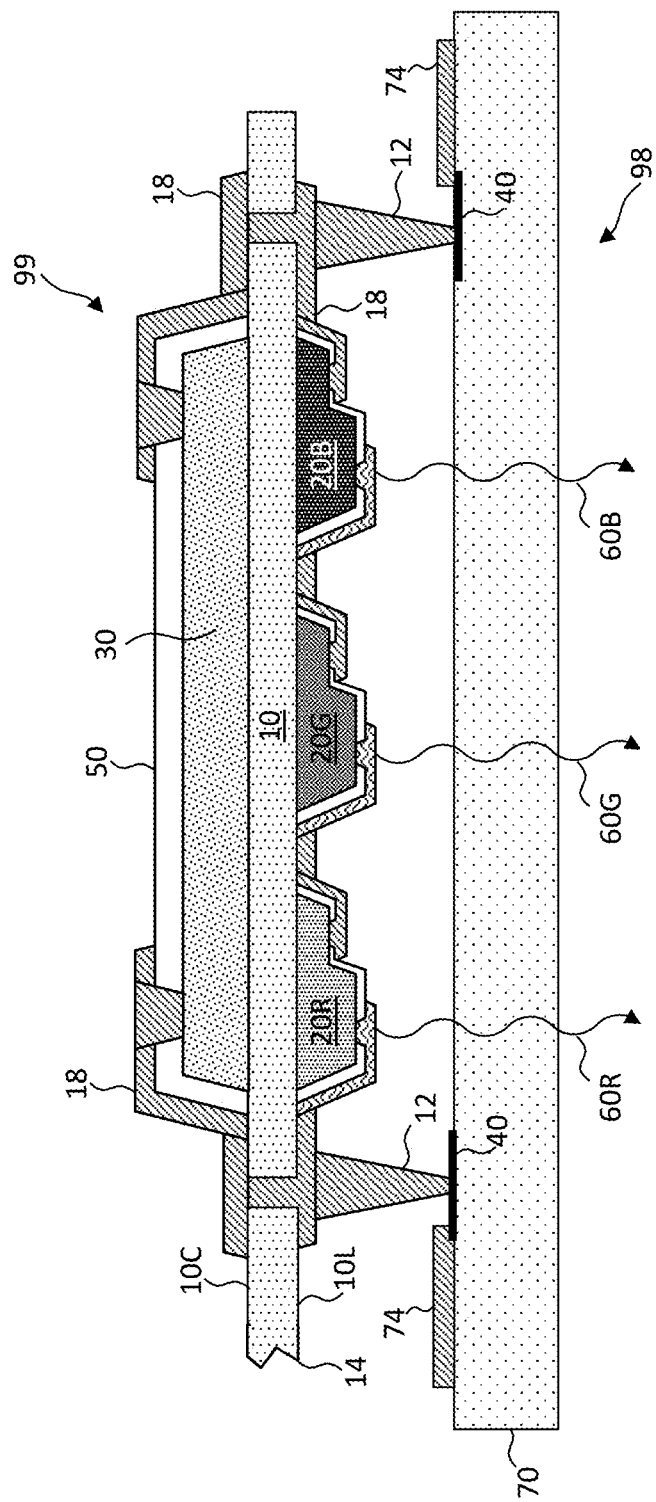
FIGS. 13A-13C are cross sections of a display comprising various printed pixel modules according to illustrative embodiments of the present disclosure.
Figure 13B:
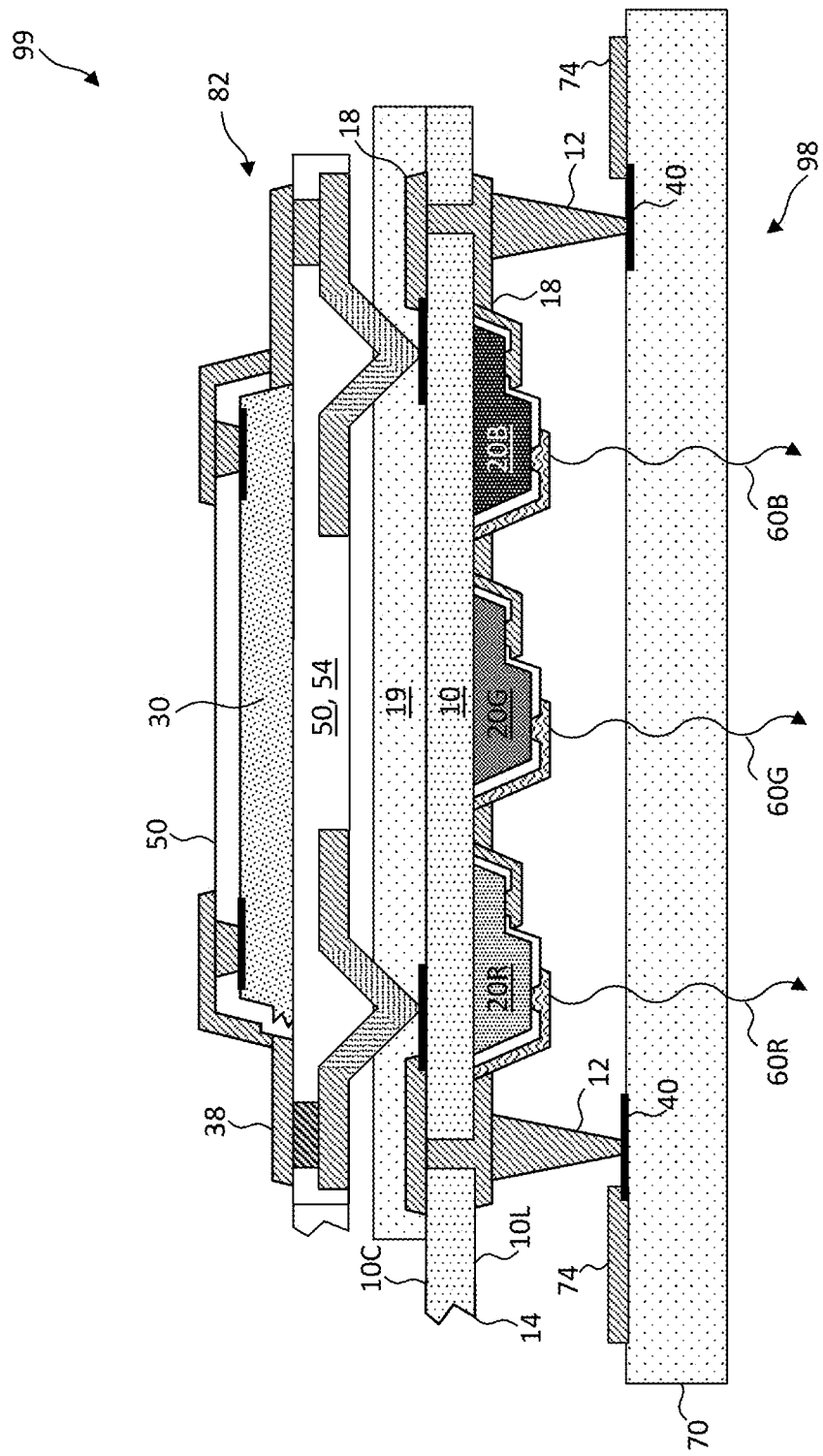
Figure 13C:
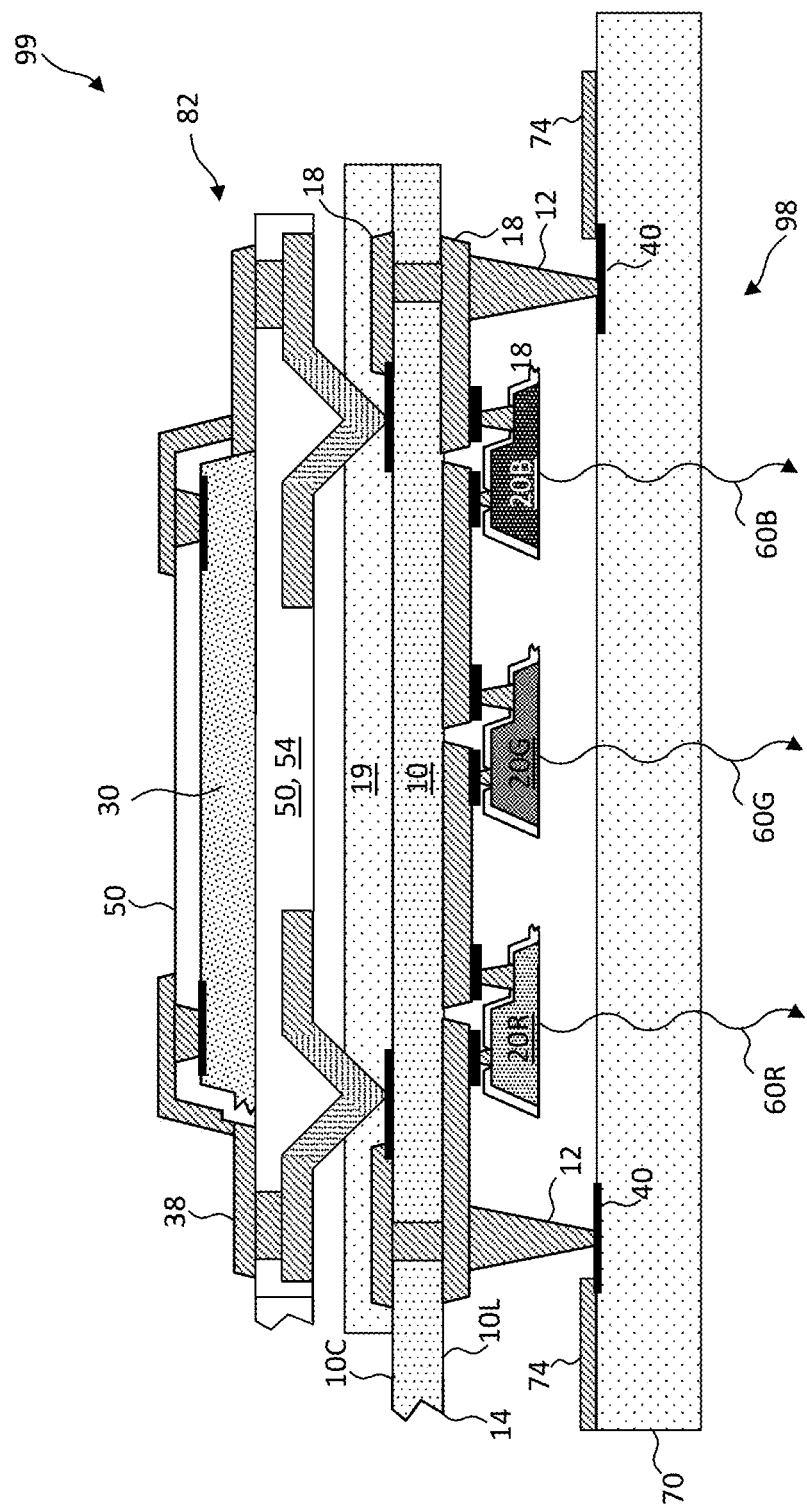
Figure 14A:
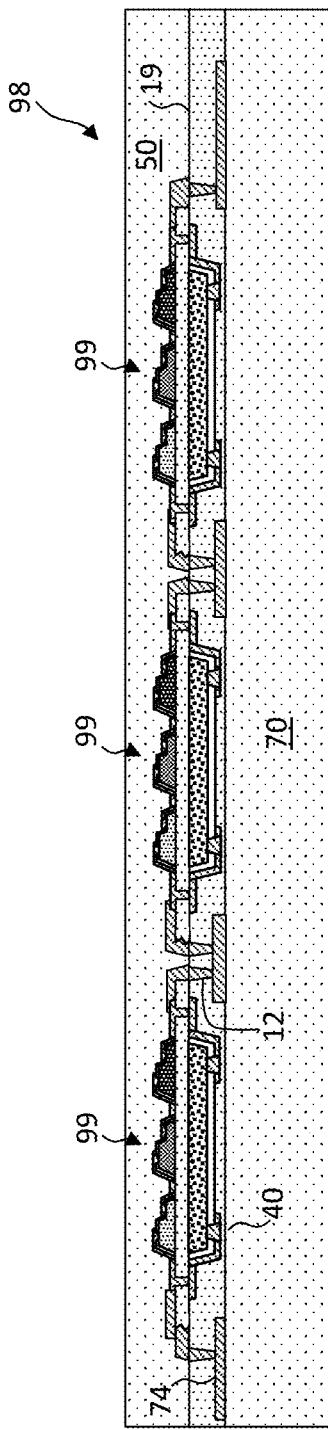
FIGS. 14A-14D are cross sections of a display comprising a plurality of printed pixel modules according to illustrative embodiments of the present disclosure.
Figure 14B:
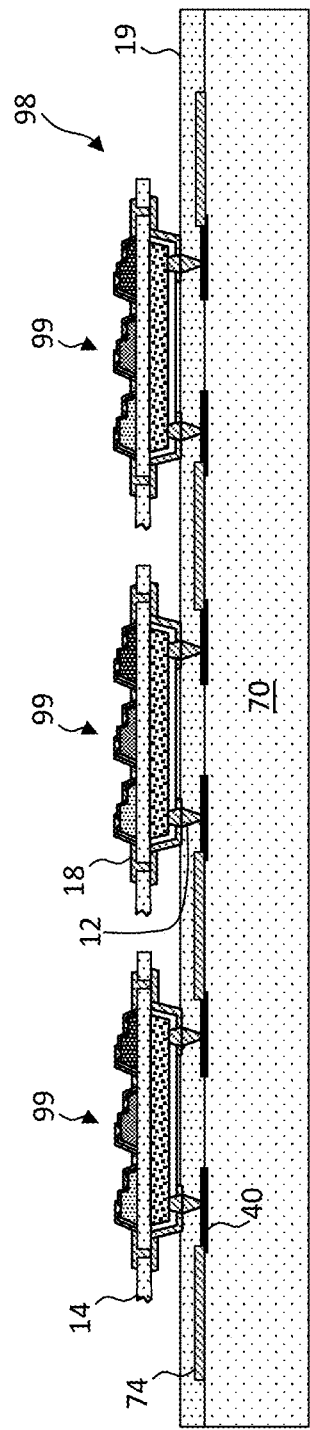
Figure 14C:
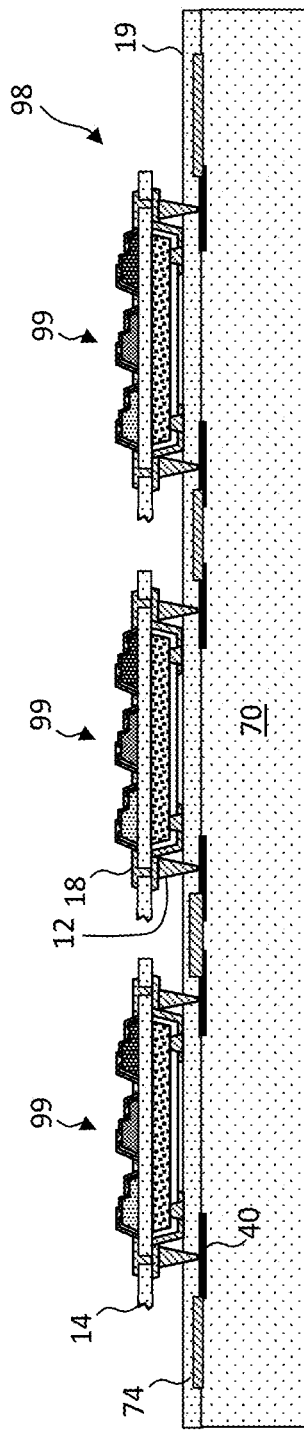
Figure 14D:
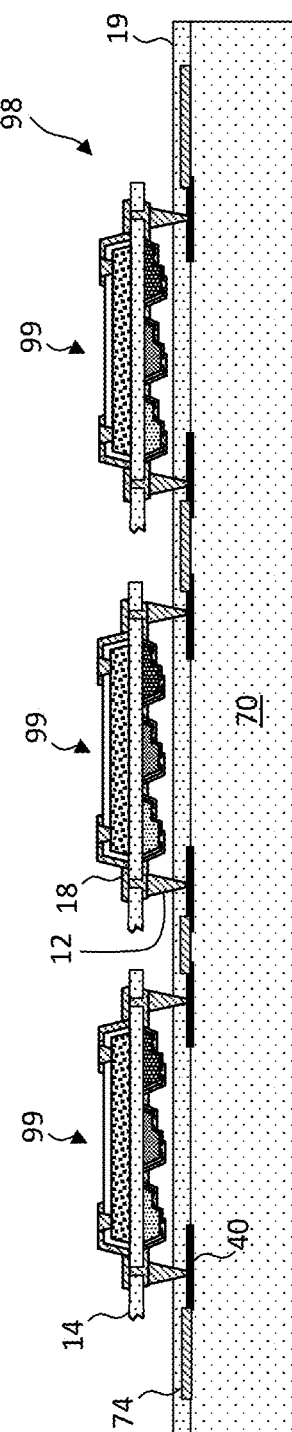

FIGS. 13A-13C show examples of pixel modules 99 where light emitters 20 are disposed between module substrate 10 and target substrate 70. The pixel modules 99 shown in FIGS. 13A-13C includes module connection posts 12 that extend beyond light emitters 20. The pixel modules 99 shown in FIGS. 13B and 13C include a controller assembly 82. The pixel modules 99 shown in FIGS. 13A-13C are disposed to emit light 60 through target substrate 70.

Figure 12A:
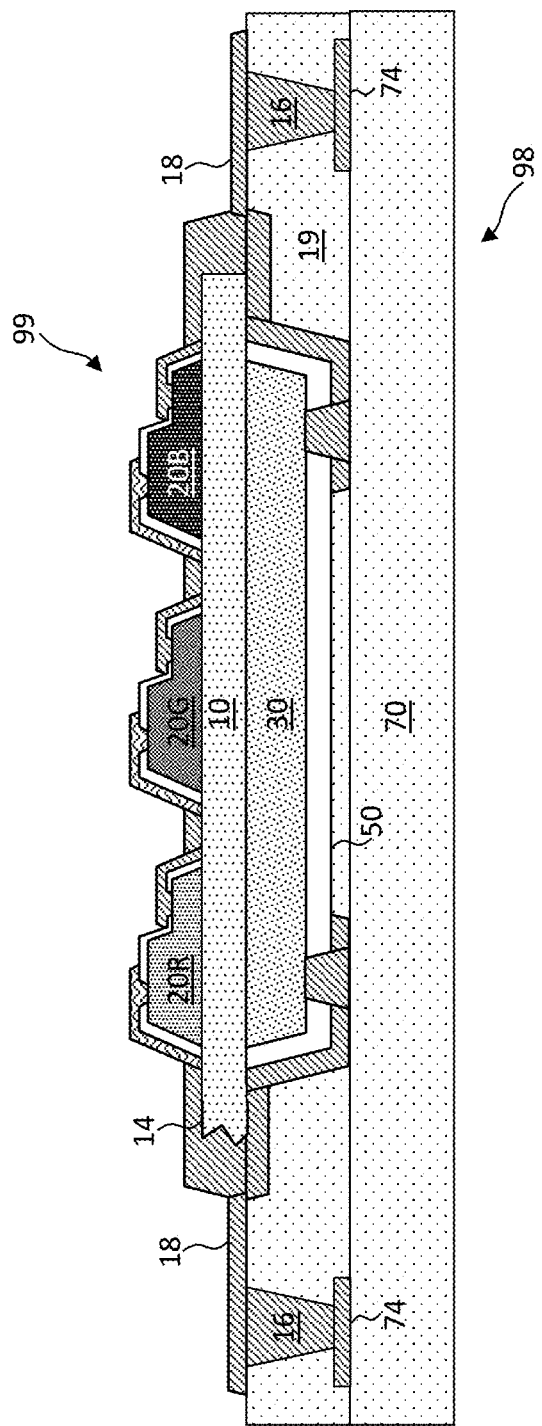
FIGS. 12A-12K are cross sections of a display comprising various printed pixel modules according to illustrative embodiments of the present disclosure.
Figure 12B:
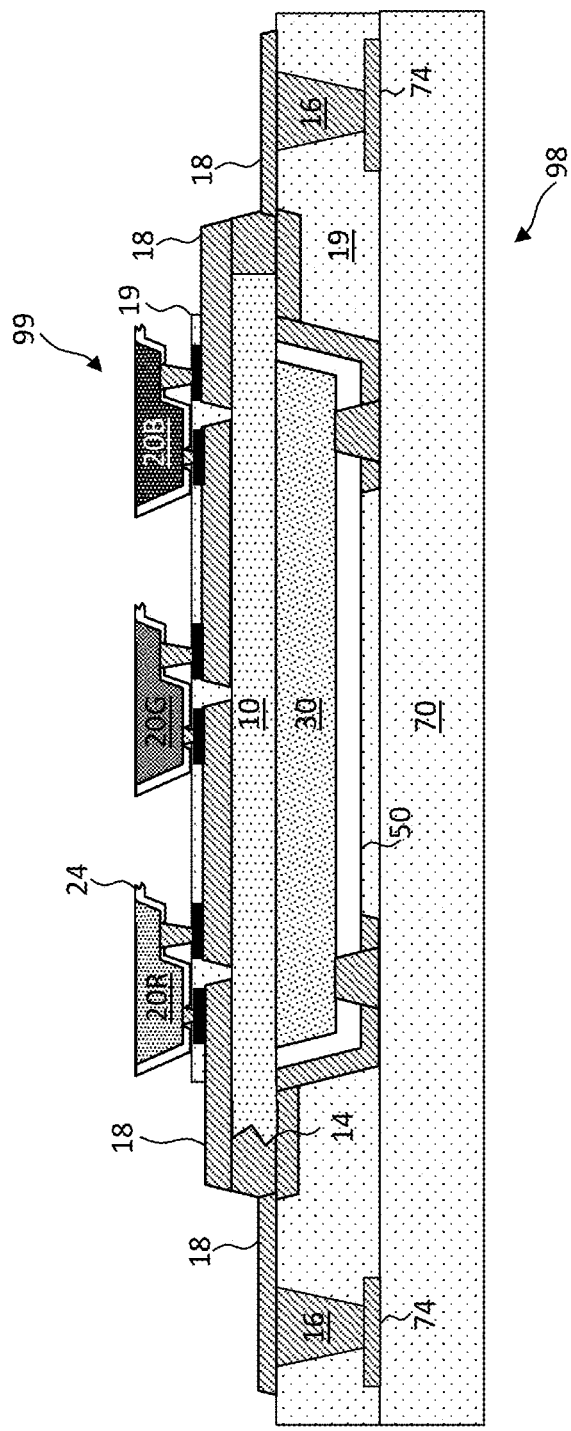
Figure 12C:
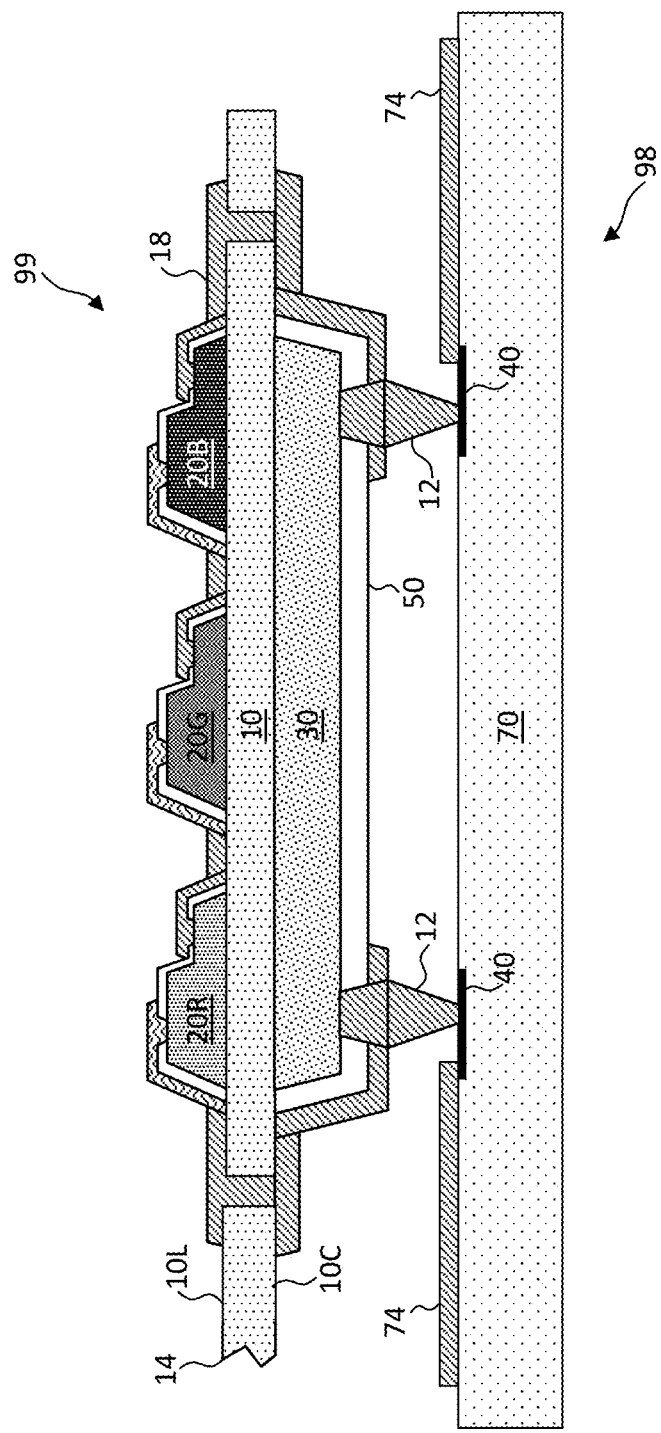

Pixel modules 99 can be disposed on display substrate 70, for example by micro-transfer printing onto display substrate 70 or onto a layer of adhesive 19 disposed on display substrate 70, as shown in FIGS. 12A and 12B. (Adhesive 19 is omitted from FIGS. 12C-12K for clarity.) Because pixel modules 99 can be printed (e.g., micro-transfer printed), they can comprise module tethers 14, for example broken (e.g., fractured) or separated module tethers 14. As shown in FIG. 12A, after printing pixel modules 99, module electrodes 18 can be electrically connected to electrical conductors (e.g., wires) such as photolithographically defined display electrodes 74 disposed on display substrate 70. Electrical connections can be made through vias 16 made in any layer of adhesive 19. In FIG. 12A, light emitters 20 (red-light emitter 20R, green-light emitter 20G, and blue-light emitter 20B) are horizontal micro-iLEDs disposed with light-emitter bottom side 20S adjacent to module light-emitter surface 10L of module substrate 10 in a non-inverted configuration, as also shown in FIG. 5. In some embodiments, and as shown in FIG. 12B and FIG. 6, light emitters 20 can be inverted, with light-emitter top side 20T adjacent to module light-emitter surface 10L of module substrate 10. In some embodiments, referring to FIG. 7, light emitters 20 are vertical micro-iLEDs and can be printed (e.g., micro-transfer printed). In some embodiments, and as shown in FIGS. 12A and 12B, light emitters 20, controllers 30, or both, are printed (e.g., micro-transfer printed) from a corresponding source wafer to module light-emitter surface 10L and module controller surface 10C, respectively, of module substrate 10, as described above with respect to FIGS. 11A and 11B and as illustrated in FIGS. 8-10.

As with light emitters 20 and controllers 30 and as shown in FIGS. 12C-12K and 13A-13B, module connection posts 12 can electrically connect module electrodes 18 to display electrodes 74 by printing (e.g., micro-transfer printing) pixel modules 99 to display substrate 70 or a surface-mount device substrate. Module connection posts 12 can be provided in various configurations and in accordance with corresponding embodiments of the present disclosure.

Figure 12D:
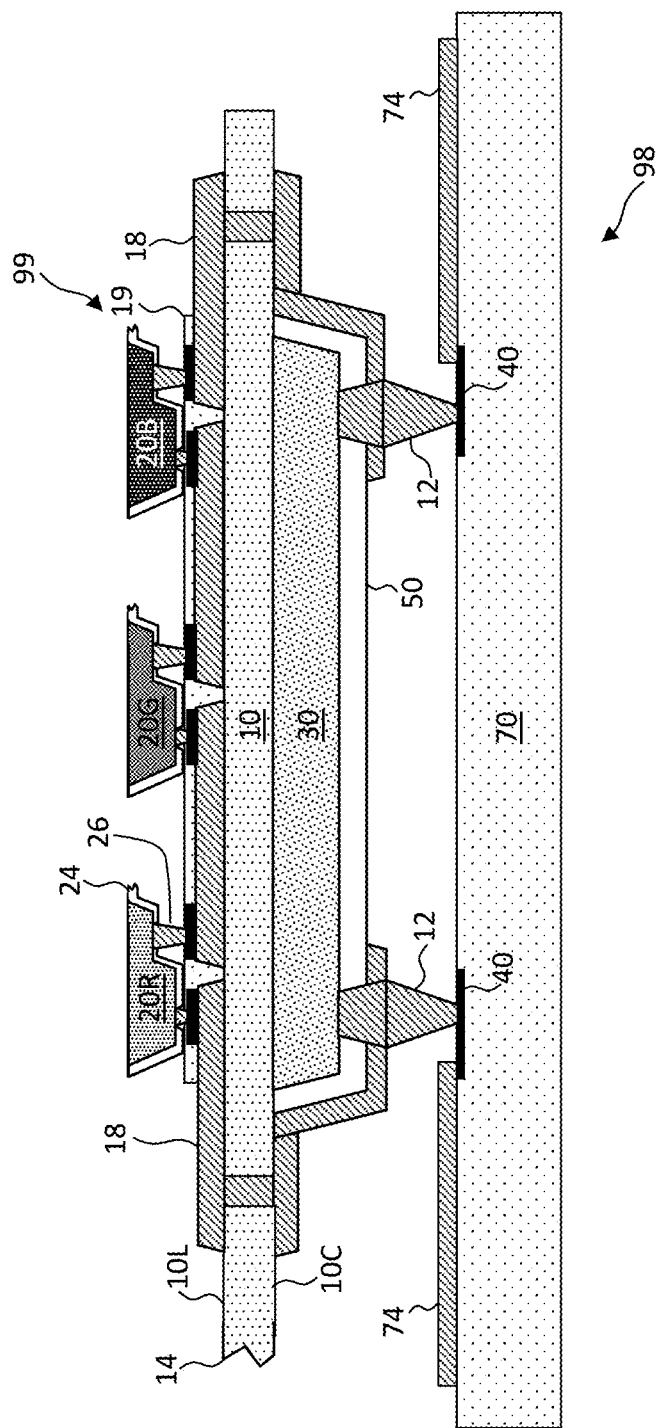
Figure 12E:
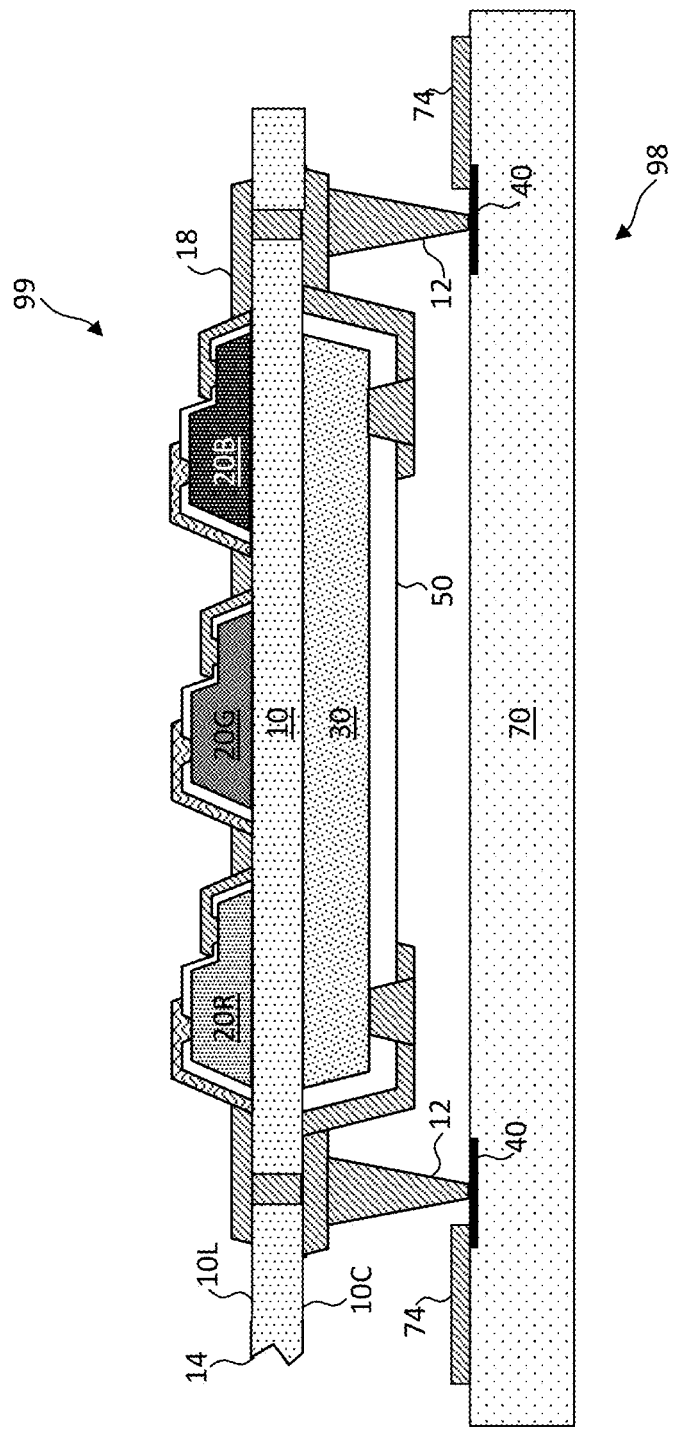

Referring to FIGS. 1, 9, 11C, and 12C, module connection posts 12 are disposed on controller 30 and extend in a direction away from module substrate 10. Light emitters 20 are shown as horizontal emitters in a non-inverted configuration, as shown in FIG. 5, but can be inverted, as shown in FIG. 12D. Referring to FIGS. 2 and 12E, module connection posts 12 are disposed on module electrodes 18 on module controller surface 10C of module substrate 10 and extend in a direction away from module substrate 10. Module connection posts 12 can protrude from module controller surface 10C of module substrate 10 a distance that is greater than a thickness of controller 30 to extend beyond controller 30 and enable electrical contact between module connection posts 12 and contact pads 40 on target substrate 70 without contacting controller 30 (or layers disposed on controller 30) to target substrate 70. For example, the distance can be at least 1.1 times, at least 1.2 times, or at least 1.5 times the thickness of controller 30 (together with any layers disposed on controller 30). In some embodiments, the distance is less than or equal to 3 times or less than or equal to 2 times the thickness of controller 30, to avoid making pixel module 99 too thick. In some embodiments, contact pads 40 on target substrate 70 have a thickness sufficient to allow electrical contact to pixel module 99 to be made when pixel module 99 is disposed on target substrate 70 even though module connection posts 12 do not extend beyond controller 30 or light emitters 20 (depending on which side of module substrate 10 module connection posts 12 are disposed).

Figure 12F:
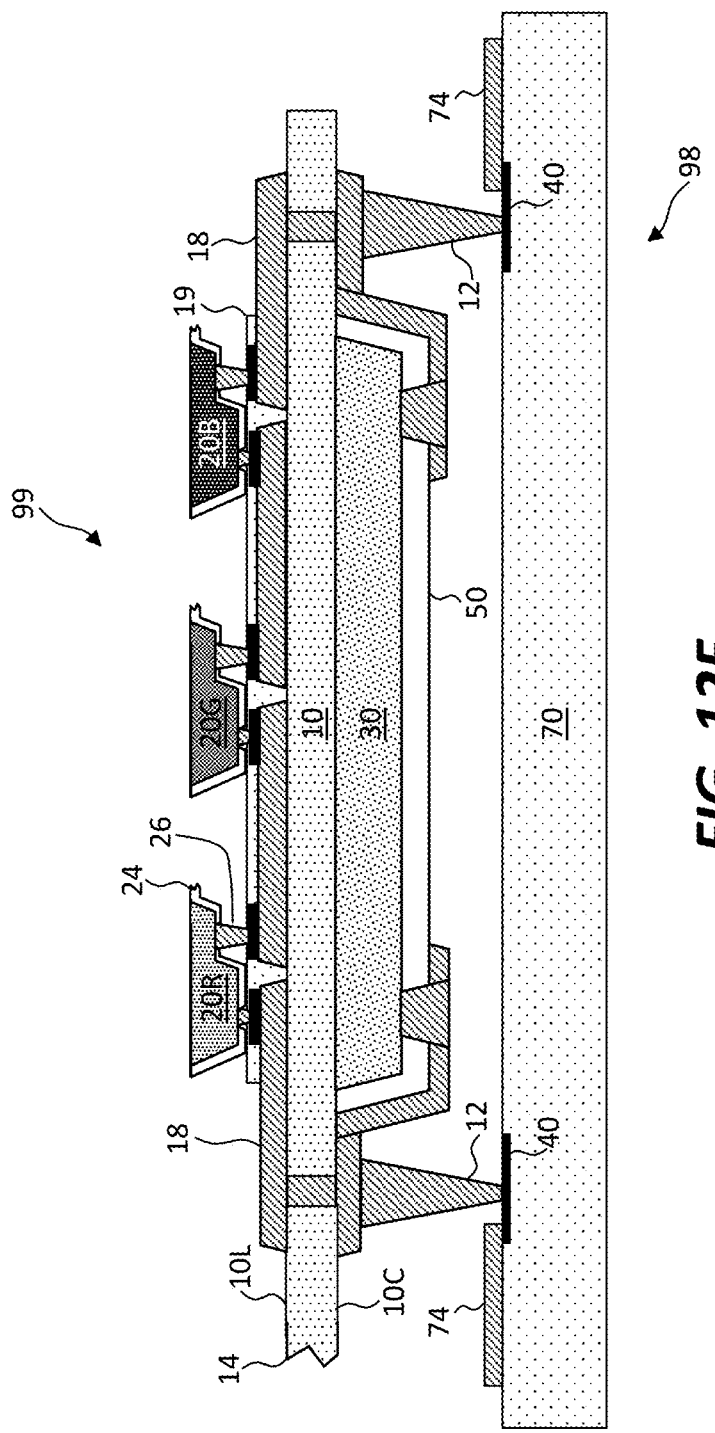

Light emitters 20 can be horizontal emitters in a non-inverted configuration, as shown in FIG. 5, but can alternatively be inverted, as shown in FIG. 12F and FIG. 6. Referring to FIGS. 3, 13A-13B, and 17C-17L, module connection posts 12 are disposed on module electrodes 18 on module light-emitter surface 10L of module substrate 10 and extend in a direction away from module substrate 10. Module connection posts 12 protrude from module light-emitter surface 10L of module substrate 10 a distance that is greater than a thickness of light emitters 20 to extend beyond light emitters 20 and enable electrical contact between module connection posts 12 and contact pads 40 on target substrate 70 without contacting light emitters 20 (or layers disposed on light emitters 20) to target substrate 70. As non-limiting examples, the distance can be at least 1.1 times, at least 1.2 times, or least 1.5 times the thickness of light emitters 20 (together with any layers disposed on light emitters 20). In some embodiments, the distance is less than or equal to 3 times or less than or equal to 2 times the thickness of light emitters 20 to avoid making pixel module 99 too thick.

In some embodiments, controller 30 is disposed on a printable controller assembly 82 with a controller assembly substrate 54 (e.g., a dielectric layer 50) and controller electrodes 38 from which module connection posts 12 extend, as shown in FIGS. 10, 12G, 12H, and 19D. In some such embodiments, module connection posts 12 are understood to extend from controller 30. Similarly, in some embodiments, light emitters 20 are provided in a printable light-emitter assembly 80 with a light-emitter assembly substrate 52 (e.g., a dielectric layer 50) and light-emitter electrodes 28 from which module connection posts 12 extend, as shown in FIG. 8. In some such embodiments, module connection posts 12 can be understood to extend from light-emitter assembly substrate 52 or light-emitter assembly 80.

The electrical connections (e.g., with module electrodes 18) shown in the Figures are illustrative and do not necessarily represent actual circuit connections. Those knowledgeable in electrical circuit design will understand that a variety of circuits connecting controller 30 to light emitters 20 can be employed to provide appropriate electrical connections to control light emitters 20.

Figure 12G:
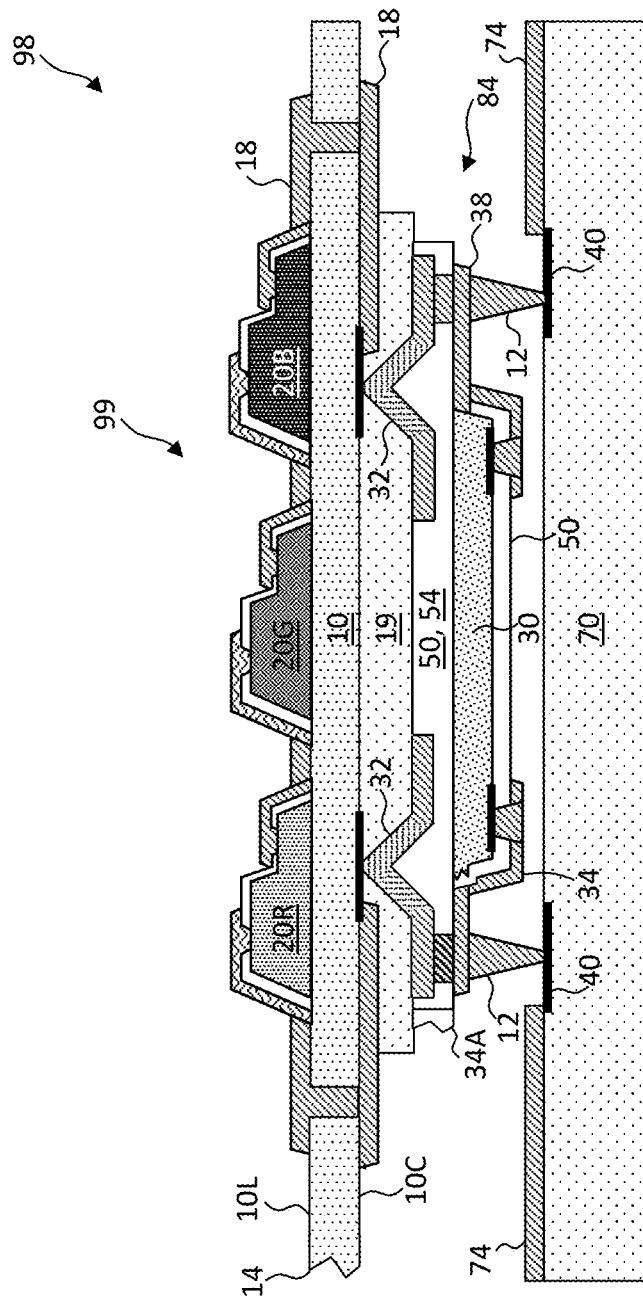
Figure 12H:
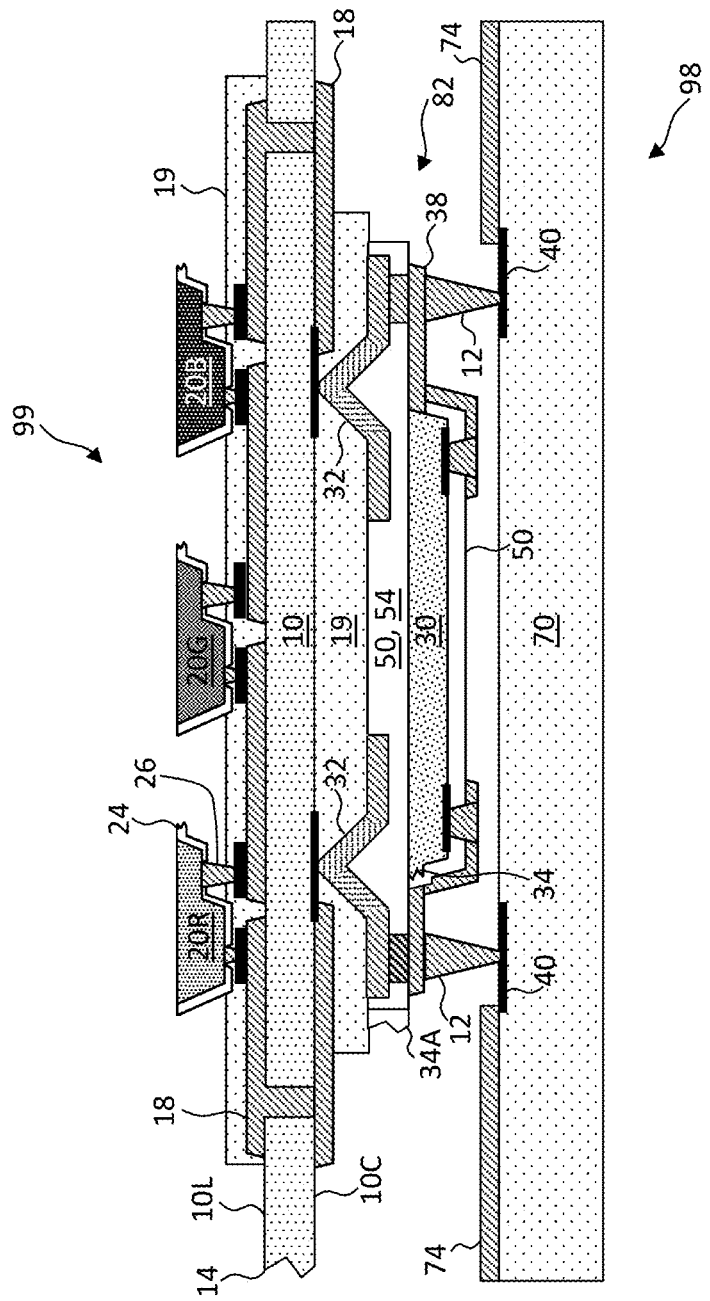
Figure 12I:
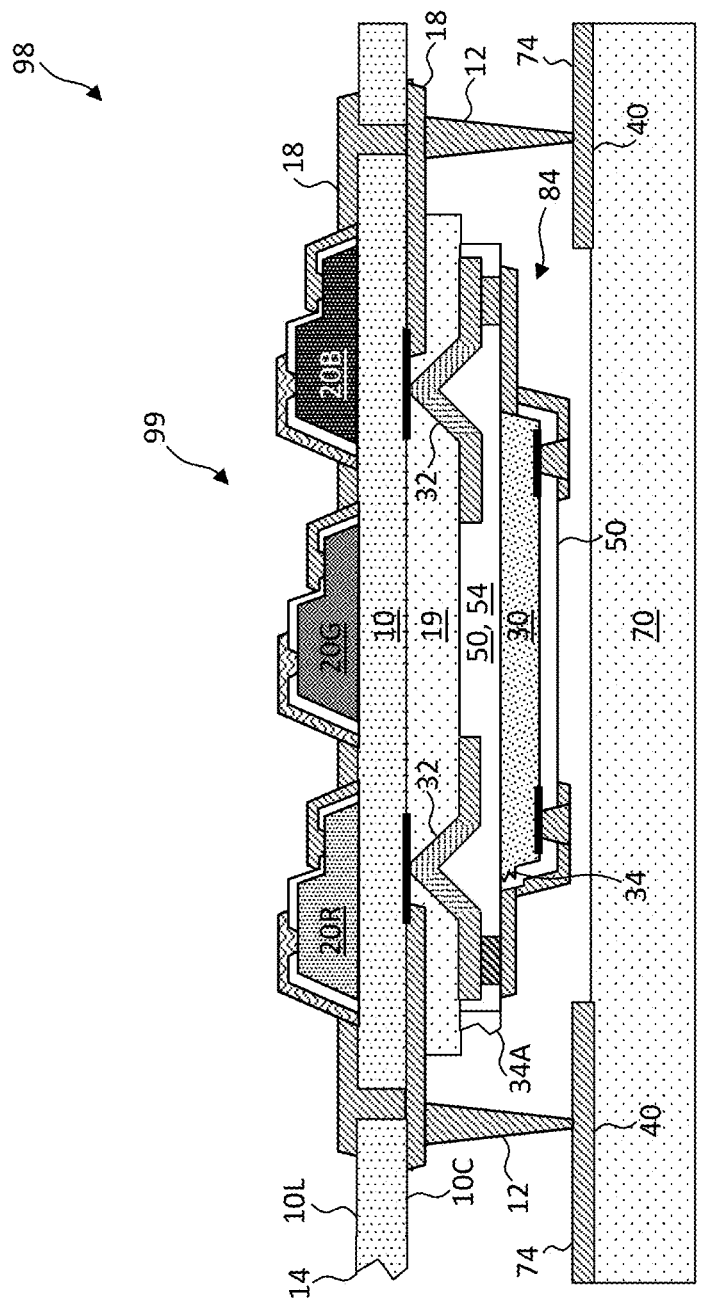
Figure 12J:
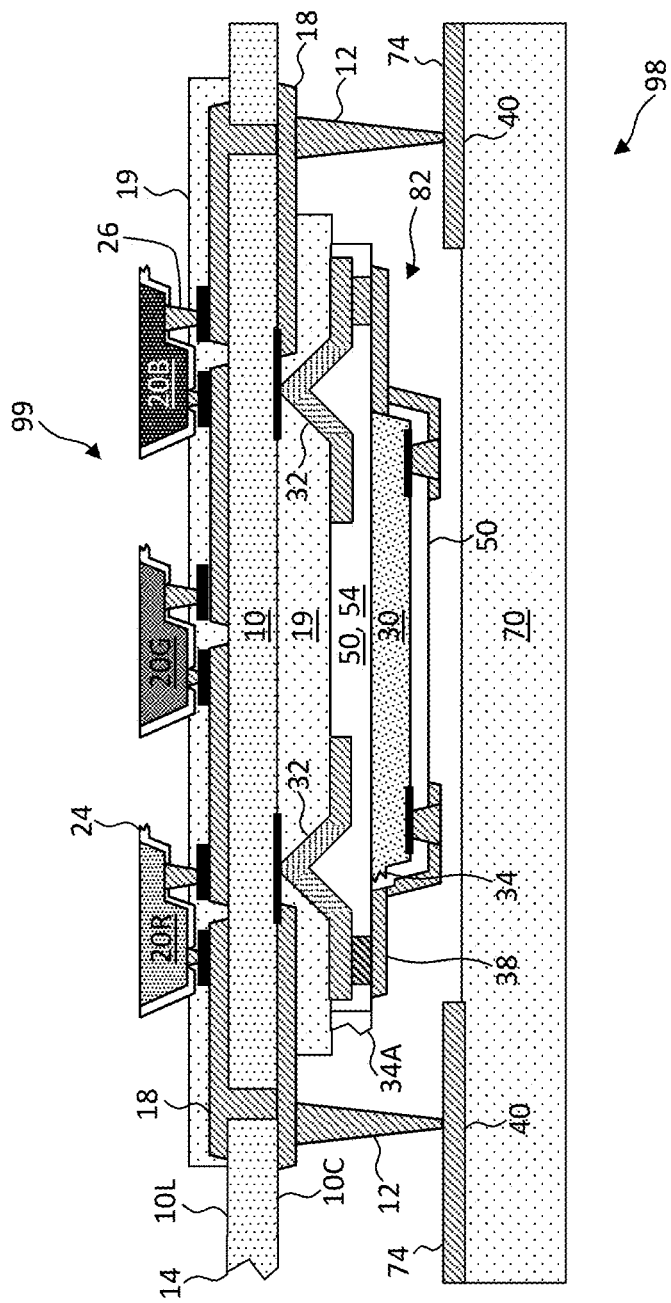

Referring to FIGS. 12G-12J, controller 30 is micro-transfer printed onto module substrate 10 with controller assembly connection posts 32 forming an electrical connection to module electrodes 18. As shown in FIGS. 12G and 12H, module connection posts 12 are disposed on controller 30 and extend in a direction away from module substrate 10. Light emitters 20 are shown as horizontal emitters in a non-inverted configuration in FIG. 12G (e.g., in accordance with FIG. 5), but can be inverted, as shown in FIG. 12H and FIG. 6. As shown in FIGS. 12I and 12J, module connection posts 12 are disposed on module electrodes 18 on module controller surface 10C of module substrate 10 and extend in a direction away from module substrate 10. Light emitters 20 are shown as horizontal emitters in a non-inverted configuration in FIG. 12I and as shown in FIG. 5, but can be non-inverted, as shown in FIG. 12J and FIG. 6.

Figure 12K:
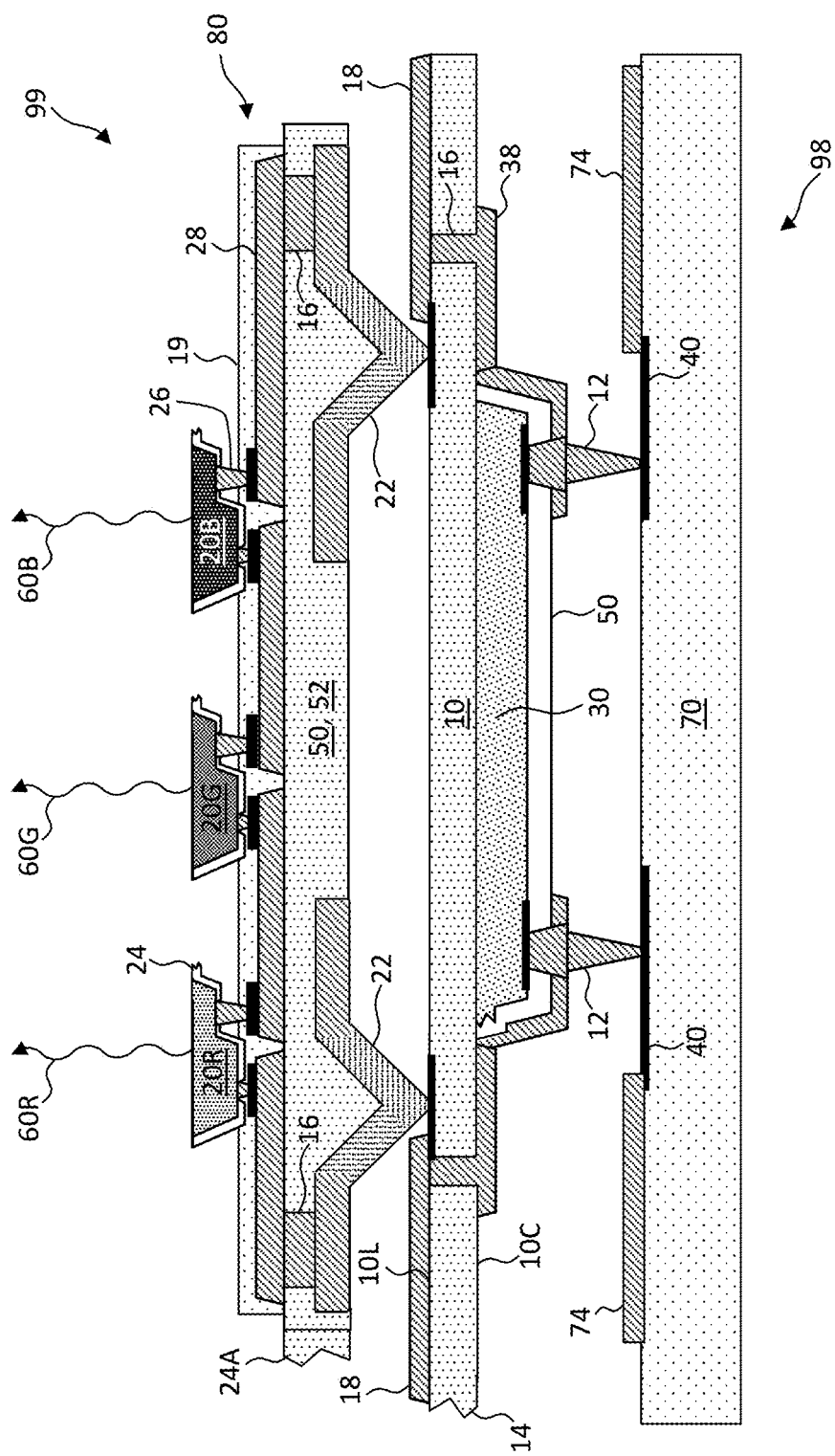

Referring to FIG. 12K, controller 30 is disposed on module controller surface 10C of module substrate 10 and a light-emitter assembly 80 is transfer printed with light-emitter assembly connection posts 22 onto module light-emitter surface 10L of module substrate 10. Light-emitter assembly 80 comprises red, green, and blue inverted light emitters 20R, 20G, 20B on a common light-emitter assembly substrate 52 that emit light 60R, 60G, 60B respectively in a direction opposite module substrate 10 and display substrate 70. Controller 30 could be included in a controller assembly 82 that includes module connection posts 12, for example as shown in FIGS. 10A-10C.

Referring to FIGS. 12C-12K, pixel module 99 is printed (e.g., micro-transfer printed) onto display substrate 70 so that module connection posts 12 are in electrical contact with (e.g., in direct contact with and can pierce) contact pads 40 on display substrate 70. Contact pads 40 on display substrate 70 can be electrically connected to display electrodes 74 formed on display substrate 70 using photolithographic methods and materials, such as are conventionally known in the display and integrated circuit arts. In general, and as illustrated in FIGS. 12A-12K, any of the light emitters 20 can be printed (e.g., micro-transfer printed) vertical micro-iLEDs or horizontal micro-iLEDs in an inverted or non-inverted configuration and can have, for appropriate configurations, light-emitter connection posts 26. Similarly, controller 30 can be disposed by printing (e.g., micro-transfer printing) and can have controller assembly connection posts 32, for example as shown in FIG. 10, or not, as shown in FIGS. 1-3.

FIGS. 12A-12K illustrate embodiments in which light 60 can be emitted in a direction opposite display substrate 70 (a top-emitter configuration) so that light 60 does not intentionally pass through and is not absorbed by display substrate 70, improving efficiency. In these illustrated embodiments, controller 30 is disposed between module substrate 10 and display substrate 70 and pixel module 99 is non-native to display substrate 70. In some embodiments, for example as shown in FIGS. 13A-13C, light 60 can be emitted through display substrate 70 in a bottom-emitter configuration in which display substrate 70 is at least partially transparent, for example at least 50% transparent (e.g., at least 75% 80%, 90%, or 95% transparent) to light emitted by light emitters 20. In some such configurations, pixel modules 99 are on a side of display substrate 70 opposite the viewing side and are more protected from mechanical or environmental damage, particularly from users of a pixel-module display 98, for example touch-screen users. Referring to FIGS. 13A and 13B, pixel modules 99 are printed to a display substrate 70 to construct a pixel-module display 98. Pixel modules 99 can be disposed on display substrate 70, for example by micro-transfer printing onto display substrate 70 or a layer of adhesive 19 disposed on display substrate 70 (omitted from FIGS. 13A-13B for clarity but shown in FIGS. 12A and 12B). In FIGS. 13A and 13B, light emitters 20 (red-light emitter 20R, green-light emitter 20G, and blue-light emitter 20B) are horizontal micro-iLEDs disposed with light-emitter bottom side 20S, for example as shown in FIG. 5, adjacent to module light-emitter surface 10L of module substrate 10. In some embodiments, light emitters 20 can be inverted, as shown in FIG. 13C, with light-emitter top side 20T adjacent to module light-emitter surface 10L of module substrate 10 and in some embodiments, referring also to FIG. 7, light emitters 20 are vertical micro-iLEDs. Adhesive layer 19 and encapsulation layers (not shown in FIG. 13C) can be used in any of these embodiments.

In some embodiments, for example as shown in FIGS. 13A-13B, light emitters 20, controllers 30, or both, are printed (e.g., micro-transfer printed) from a corresponding source wafer to module light-emitter surface 10L and module controller surface 10C, respectively, of module substrate 10, as described above with respect to FIGS. 11A and 11B and as illustrated in FIGS. 8-10. As shown in FIGS. 13A-13B, pixel module 99 is printed (e.g., micro-transfer printed) onto display substrate 70 so that module connection posts 12 and module electrodes 18 are in electrical contact with (e.g., in direct contact with and can pierce) contact pads 40 on display substrate 70. In these illustrated embodiments, light emitters 20 are disposed between module substrate 10 and display substrate 70 and pixel module 99 is non-native to display substrate 70. Contact pads 40 on display substrate 70 can be electrically connected to display electrodes 74 formed on display substrate 70 using photolithographic methods and materials, such as are conventionally known in the display and integrated circuit arts. As with the embodiments illustrated in FIG. 12A-12K, any of light emitters 20 can be printed (e.g., micro-transfer printed) vertical micro-iLEDs or horizontal micro-iLEDs in an inverted or non-inverted configuration and can have, for appropriate configurations, light-emitter connection posts 26. Similarly, controller 30 can be disposed by printing (e.g., micro-transfer printing) and can have controller assembly connection posts 32, for example as shown in FIG. 10, or not, for example as shown in FIGS. 1-3.

Referring to FIGS. 14A-14D, and according to some embodiments of the present disclosure, multiple pixel modules 99 can be printed (e.g., micro-transfer printed) in an array on display substrate 70 to construct a pixel-module display 98 with module connection posts 12 electrically connected to display substrate 70 contact pads 40 and display electrodes 74. The multiple pixel-module display 98 configuration illustrated in FIG. 14A corresponds to that of FIG. 12A (together with an encapsulating dielectric layer 50 that can, together with module substrate 10, adhesive 19, or display substrate 70, fully encapsulate pixel modules 99), the multiple pixel-module display 98 configuration illustrated in FIG. 14B corresponds to that of FIG. 12C, the multiple pixel-module display 98 configuration illustrated in FIG. 14C corresponds to that of FIG. 12E, and the multiple pixel-module display 98 configuration illustrated in FIG. 14D corresponds to that of FIG. 13A. The embodiments illustrated in FIGS. 12B, 12D, 12F-12J, and FIG. 13B can also be used in a pixel-module display 98 with multiple pixel modules 99 but are not separately shown.

Module connection posts 12 for any of the embodiments described above can be constructed using photolithographic methods and materials, for example depositing a dielectric layer 50, forming vias 16 in the layer at module connection post 12 locations, filling the vias 16 with a conductor, such as metal or a metal alloy, removing any unwanted excess conductor material, and stripping the dielectric layer.

Figure 20:
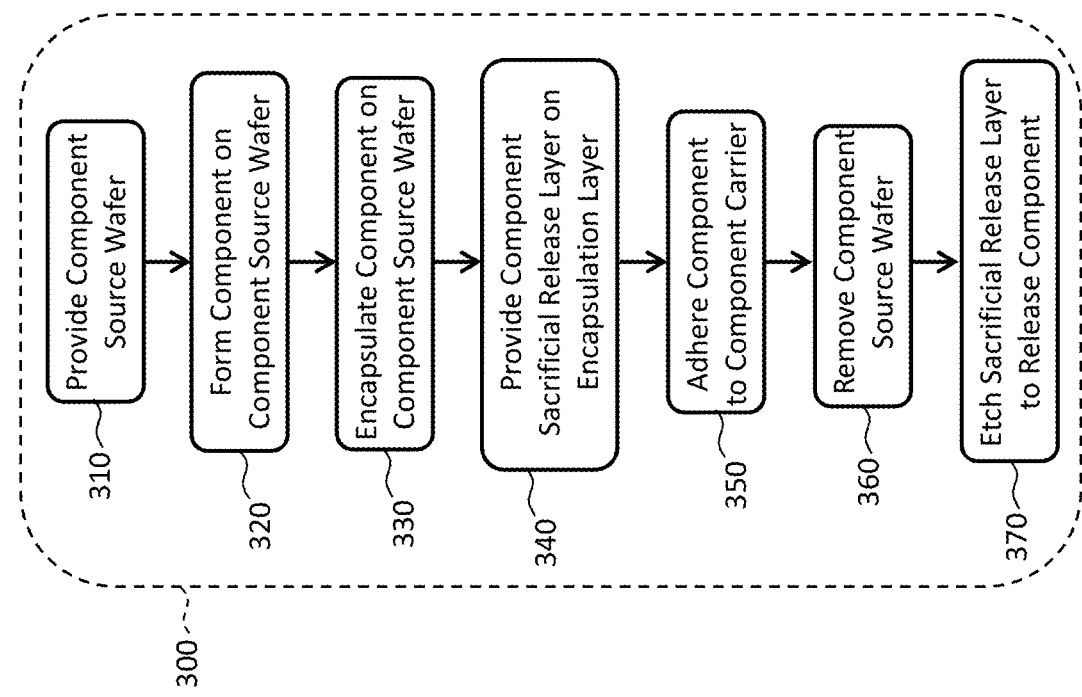
FIGS. 20-23 are flow charts of exemplary methods according to illustrative embodiments of the present disclosure.

In some embodiments of the present disclosure, components can be constructed on a component source wafer and printed to a target substrate in an inverted configuration using a flip-chip process. For example, light emitters 20, such as micro-iLEDs, are typically constructed in a non-inverted configuration but, as illustrated in FIG. 6, can be disposed on module substrate 10 in an inverted configuration, for example to enable light-emission from light-emitter bottom side 20S without requiring emitted light 60 to pass through a light-emitter electrode 28 or module electrode 18. Moreover, in some embodiments, component source substrates can be unsuitable for printing so that a flip-chip carrier substrate is necessary to enable printing (e.g., micro-transfer printing). The successive structures of FIGS. 15A-15I and the flow diagram of FIG. 20 illustrate a generic process method for flip-chip printing that can be applied to any components, including light emitters 20, controllers 30, and pixel modules 99.

Figure 15E:
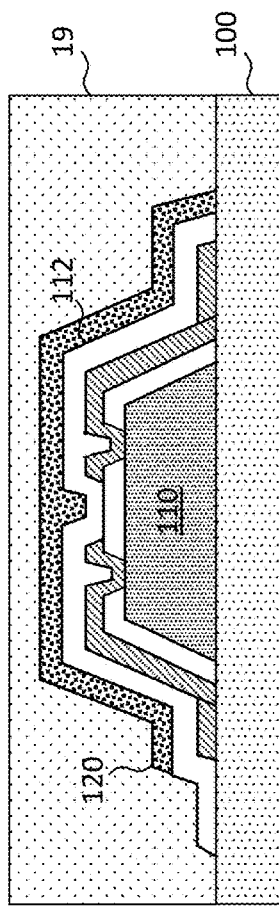

Referring to FIG. 15A, a source wafer 100 for a component is provided in step 310. Referring to FIG. 15B, a component 110 is formed on component source wafer 100 in step 320. As described with reference to FIGS. 15A-15I, source wafer 100 is a generic source wafer 100 that can be used as a source wafer for any of multiple light emitters 20, controllers 30, or pixel modules 99 and can comprise a substrate material (such as a semiconductor) and any layers (e.g., etch-stop layers, dielectric layers, adhesive layers, oxide layers, or seed layers) useful for forming components 110 on source wafer 100 or for receiving components 110 by printing onto source wafer 100. Component 110 is a generic component 110 that can be any one of light emitters 20, controllers 30, or pixel modules 99. Component 110 can comprise a patterned dielectric layer or structure 50 to insulate component 110 from component electrodes 118 (e.g., any of module electrodes 18, light-emitter electrodes 28, and controller electrodes 38) that provide power and signals to operate component 110 in order to prevent electrical shorting. An optional layer of adhesive 19 (e.g., a curable resin, not shown in FIG. 15B) can be applied to component source wafer 100, for example by coating, and cured after component 110 is disposed on component source wafer 100, for example by heat or radiation.

Figure 15F:
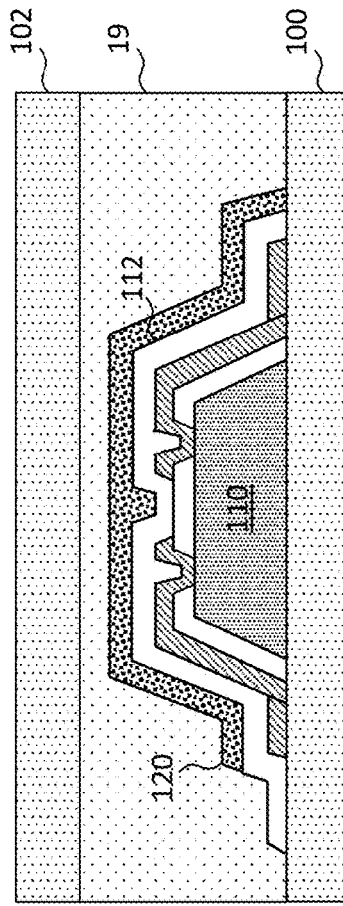

Referring to FIG. 15C, in step 330 a dielectric encapsulant (encapsulating layer) 112 can be applied to component 110 and can extend over component source wafer 100. In step 340 and as shown in FIG. 15D, a sacrificial release layer 120, for example comprising a differentially etchable material from dielectric encapsulant 112, is disposed over dielectric encapsulant 112. Dielectric encapsulant 112 and sacrificial release layer 120 can be deposited and patterned by using photolithographic methods, for example coating, evaporation, or sputtering and pattern-wise etching with optical masks. As shown in FIG. 15E, a layer of adhesive 19 is disposed over sacrificial release layer 120 and at least portions of dielectric encapsulant 112 and optionally component source wafer 100, for example by coating. Layer of adhesive 19 is adhered to carrier 102 to adhere component 110 and component source substrate to carrier 102 in step 350 and as shown in FIG. 15F. In some embodiments, adhesive 19 is first disposed on carrier 102, for example by coating, and then adhered to sacrificial release layer 120 and at least portions of dielectric encapsulant 112 and optionally component source wafer 100 to adhere component 110 and component source substrate to carrier 102 in step 350 resulting in the structure shown in FIG. 15F. Carrier 102 can be a substrate, for example a glass, polymer, or semiconductor substrate.

Figure 15G:
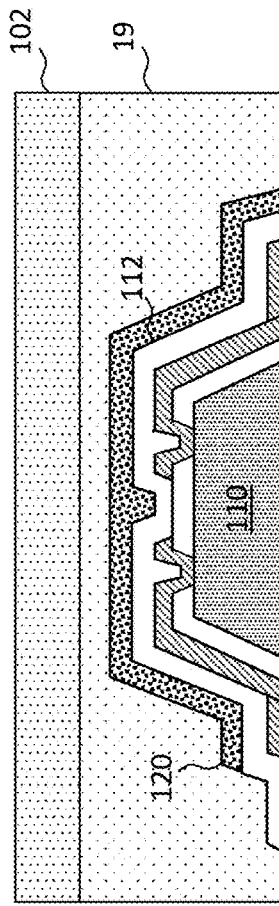

Referring to FIG. 15G, in step 360, component source wafer 100 is removed, for example by any combination of back grinding, wet etching, dry etching, or laser liftoff. In step 370 and as shown in FIG. 15H, sacrificial release layer 120 is etched to release component 110 from carrier 102 so that component 110 is physically connected to component anchor 117 of carrier 102 (or adhesive 19) by component tether 114. The component structure with carrier 102 of FIG. 15H provides a printable (e.g., micro-transfer printable) component 110 that can be printed in an inverted configuration upside-down from the configuration in which component 110 was constructed on component source wafer 100, as shown in FIG. 15I. Referring to FIG. 15I, stamp 90 and stamp post 92 fracture component tether 114 from component anchor 117 at fracture line 11 when removing component 110 from component source wafer 100. Steps 310-370 as illustrated in FIGS. 15A-15H and as shown in FIG. 20 are collectively step 300 and can be applied to any desired component 110, for example light emitters 20, controllers 30, or pixel modules 99.

According to some embodiments of the present disclosure, a method of making a pixel module 99 comprises providing a light-emitter source wafer 25 comprising a light emitter 20, providing a controller source wafer 35 comprising a controller 30, and providing a module substrate 10 having a module controller surface 10C and an opposing module light-emitter surface 10L. In some embodiments, (i) a light emitter 20 is transferred from light-emitter source wafer 25 to module light-emitter surface 10L of module substrate 10, (ii) controller 30 is transferred from controller source wafer 35 to module controller surface 10C of module substrate 10, or (iii) both (i) and (ii). One or more vias 16 are formed through module substrate 10 and module electrodes 18 are formed to electrically connect controller 30 to light emitter 20 through the one or more vias 16. As noted above with respect to FIGS. 15A-15H, methods of the present disclosure can comprise (i) adhering light-emitter source wafer 25 to a light-emitter carrier 102 and removing light-emitter source wafer 25, (ii) adhering controller source wafer 35 to a module carrier 102, and removing controller source wafer 35, or (iii) both (i) and (ii).

Figure 16H:
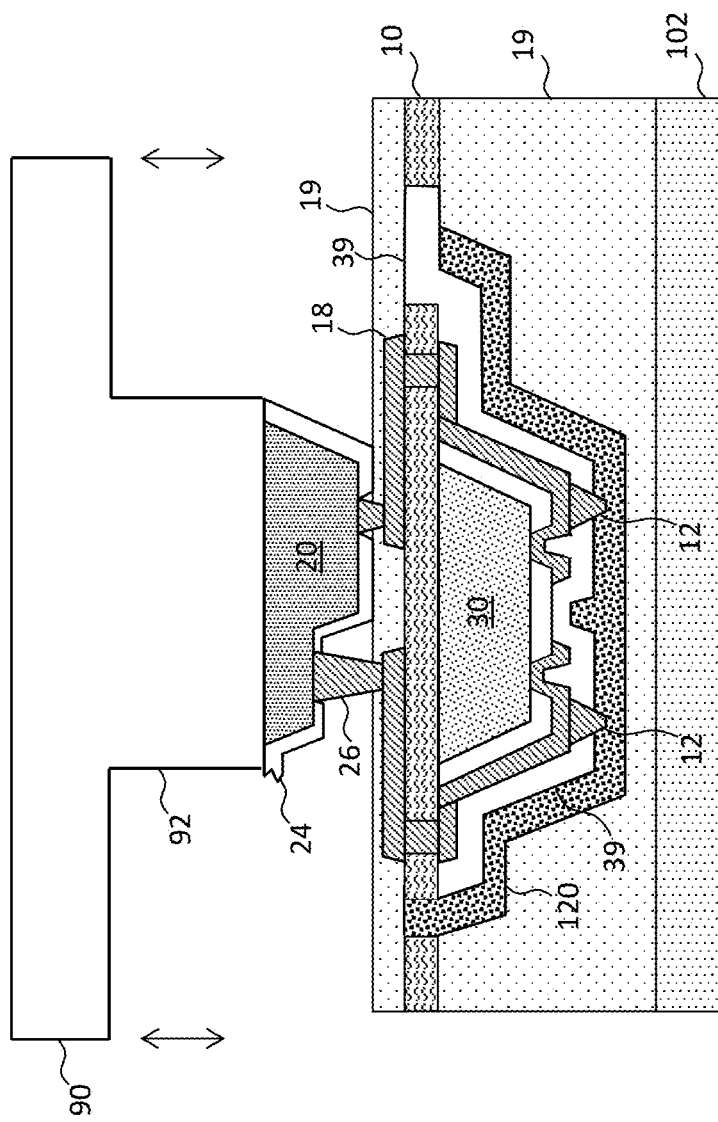
Figure 16I:
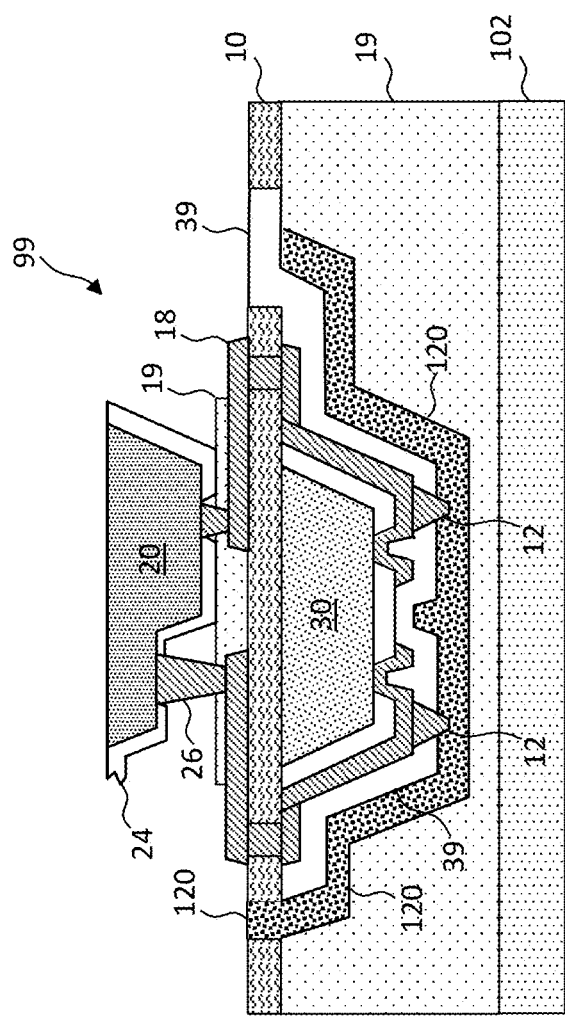
Figure 16L:
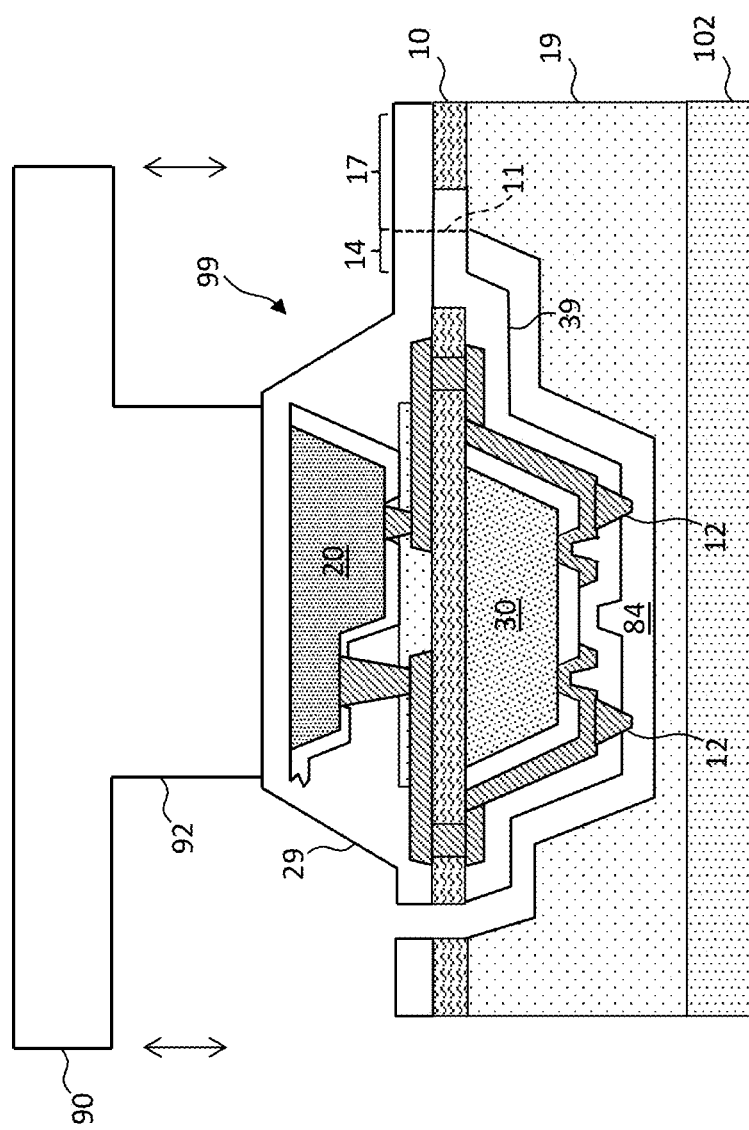
Figure 16M:
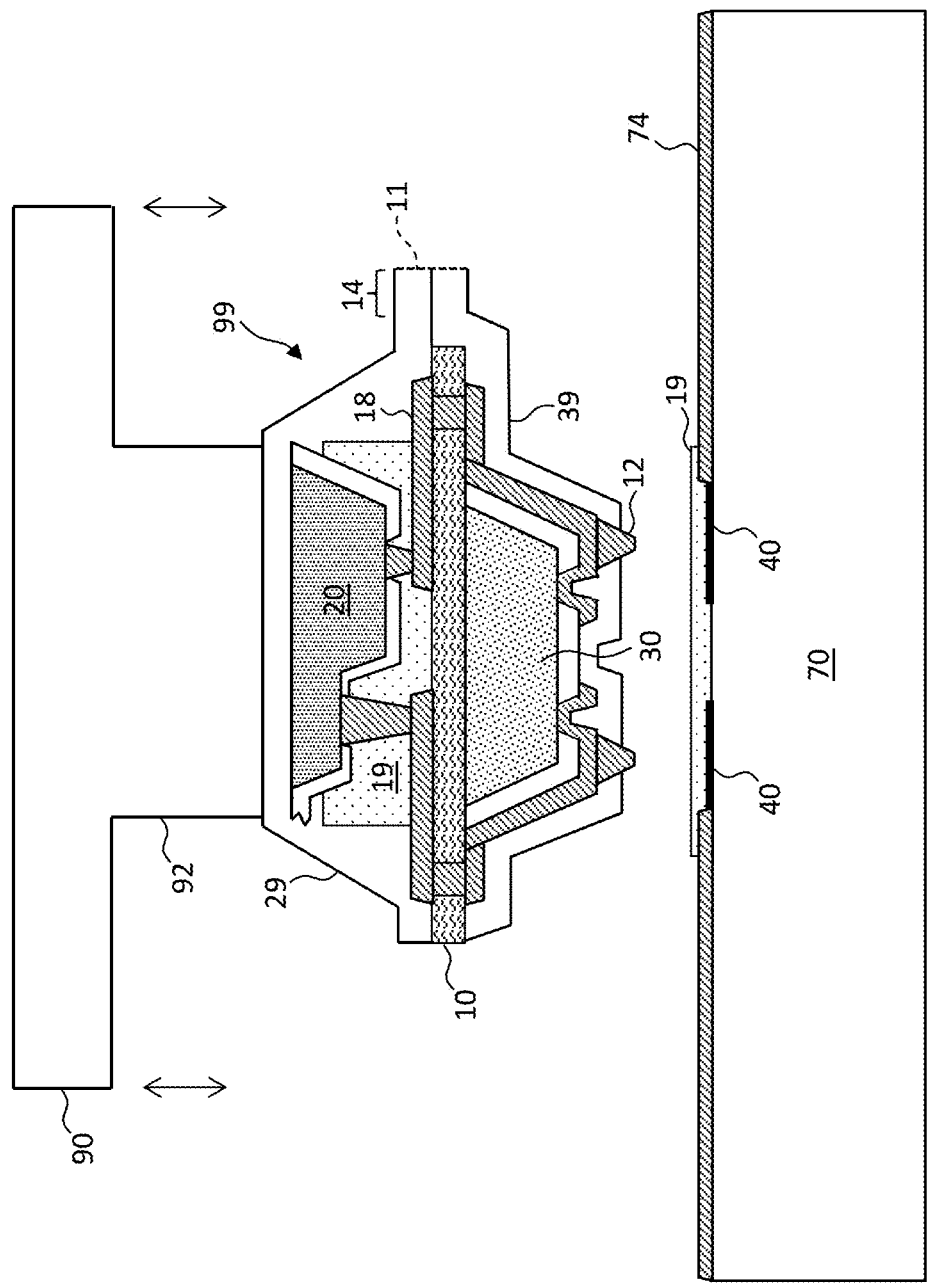
Figure 21:
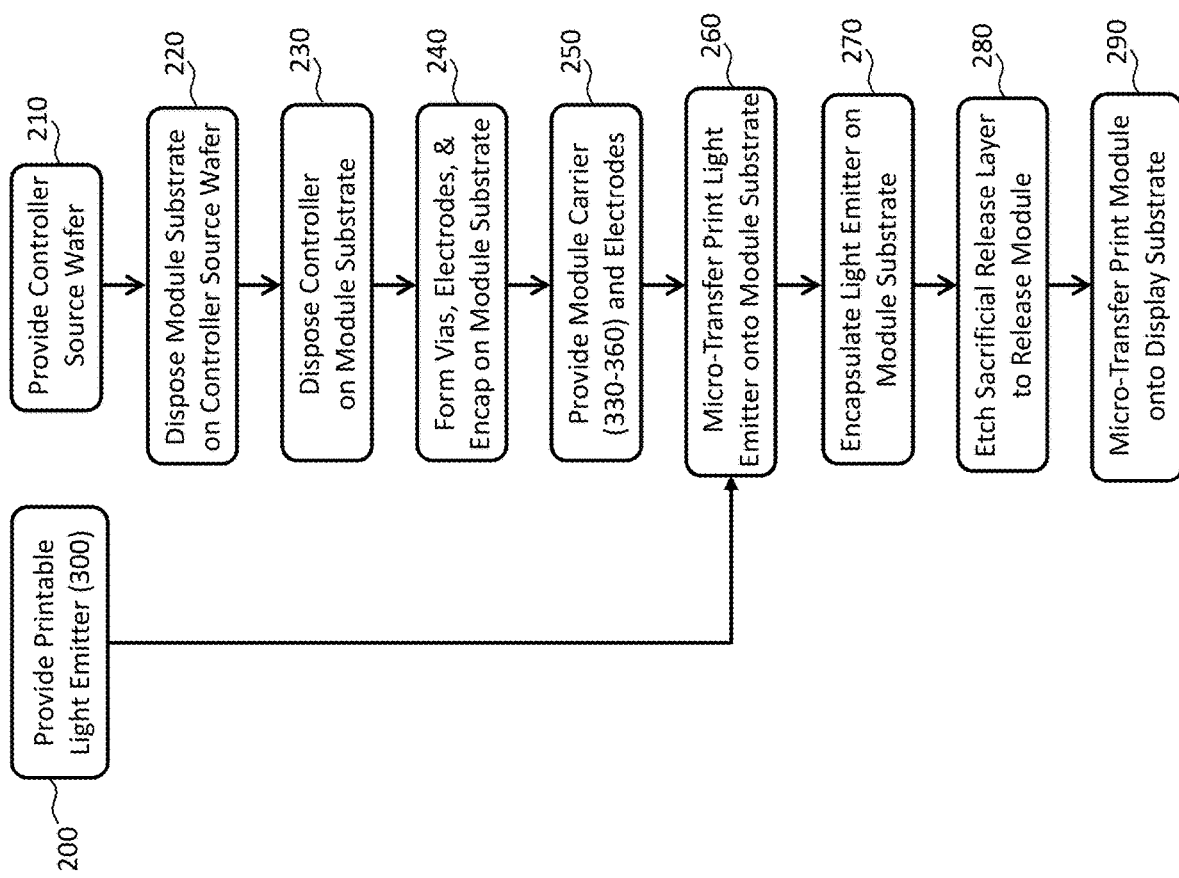

Referring to the successive structures illustrated in FIGS. 16A-16M and the flow diagram of FIG. 21, some embodiments of the present disclosure can be constructed by methods that comprise providing a source wafer 100 for a controller 30 in step 210 and as shown in FIG. 16A. Module substrate 10 is disposed on source wafer 100, in step 220 and as shown in FIG. 16B. Thus, in some embodiments, source wafer 100 is a controller source wafer 35 and also a module source wafer 15 and steps 210 and 220 can be a single step of providing a module source wafer 15 with a module substrate 10. In some embodiments, module substrate 10 is formed on source wafer 100 or source wafer 100 is provided comprising module substrate 10 or provided with module substrate 10 disposed on source wafer 100. Module substrate 10 can be an oxide layer, for example a buried oxide layer such as silicon dioxide. Controller 30 is formed (e.g., using photolithographic methods and materials) or disposed (e.g., by printing such as micro-transfer printing) on module substrate 10 in step 230 together with any one or more of module connection posts 12, module electrodes 18, patterned dielectric layers 50, vias 16, controller encapsulation layer 39, and module substrate 10 structures in step 240 as shown in FIGS. 16C and 16D. Referring to FIG. 16D, one or more module connection posts 12 extend through controller encapsulation layer 39 to allow electrical connection of pixel module 99 (e.g., controller 30 and light emitters 20 therein) to display electrodes 74 on target substrate 70. As shown in FIG. 16E, sacrificial release layer 120 is disposed over controller encapsulation layer 39. In particular, sacrificial release layer 120 extends through via 16 in module substrate 10 to contact source wafer 100 and also contacts controller encapsulation layer 39 where controller encapsulation layer 39 defines some or all of a module tether 14. One or more module connection posts 12 extend into sacrificial release layer 120. Referring to inverted FIG. 16F, a layer of adhesive 19 adheres controller 30 with sacrificial release layer 120 to carrier 102 and source wafer 100 is removed, as shown in more detail in FIGS. 15E-15G, thereby exposing module substrate 10 and at least a portion of sacrificial release layer 120. Patterned module electrodes 18 are formed on the exposed module light-emitter surface 10L of module substrate 10 in step 250 and as shown in FIG. 16G. In step 200, printable light emitters 20 are provided, for example horizontal or vertical light emitters 20 in an inverted or non-inverted configuration or as shown in any of FIGS. 5-8 and 11A. As illustrated in FIGS. 16A-16M, light emitters 20 are provided in an inverted configuration using step 300 (shown generically in FIG. 20). In step 260 and as shown in FIG. 16H, light emitters 20 are printed (e.g., micro-transfer printed) from a light-emitter source wafer 25 (e.g., as shown in FIG. 11A) to module light-emitter surface 10L of module substrate 10. In FIG. 16H, light-emitter connection posts 26 form an electrical contact between light emitter 20 and module electrodes 18. An optional layer of adhesive 19 can adhere light emitter 20 to module substrate 10 and, if present, can be patterned to expose a portion of module sacrificial release layer 120, as shown in FIG. 16I. In step 270, and as shown in FIG. 16J, an optional light-emitter encapsulation layer 29 is deposited, for example by sputtering or evaporation, and optionally patterned, for example photolithographically, to expose at least a portion of sacrificial release layer 120. Referring to FIG. 16K, in step 280 sacrificial release layer 120 is etched so that only module tether 14 physically connects pixel module 99 to carrier 102 by module anchor 17. In various embodiments of the present disclosure, module tether 14 can be a portion of an encapsulation layer, for example light-emitter encapsulation layer 29, controller encapsulation layer 39, a portion of a layer of adhesive 19, a portion of module substrate 10, or some other module encapsulation layer, or any combination of these. In the embodiments illustrated in FIG. 16K-16M, module tether 14 comprises a combination of light-emitter encapsulation layer 29 and controller encapsulation layer 39.

Referring to FIG. 16L, pixel module 99 can be micro-transfer printed (e.g., with stamp 90 and stamp post 92) from carrier 102 to display substrate 70 in step 290, as shown in FIG. 16M, so that module connection posts 12 electrically contact pads 40 and display electrodes 74 on display substrate 70. In some embodiments of the present disclosure, display substrate 70 is a surface-mount substrate (e.g., comprising layers of polyimide and patterned surface-mount electrodes corresponding to display electrodes 74) and pixel module 99 is a part of a surface-mount device. FIGS. 16A-16M illustrate module connection posts 12 corresponding to those illustrated in FIG. 1 but, according to some embodiments of the present disclosure, module connection posts 12 corresponding to those illustrated in FIG. 2, 9, or 10 could be used.

Figure 17F:
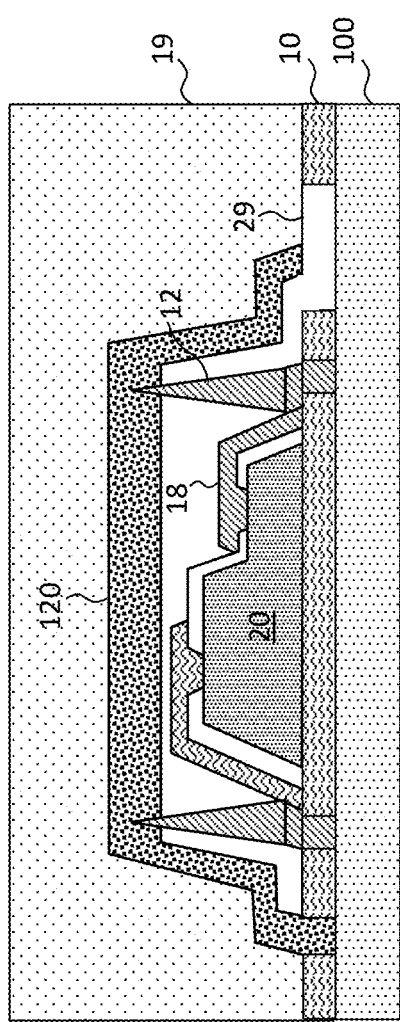
Figure 17G:
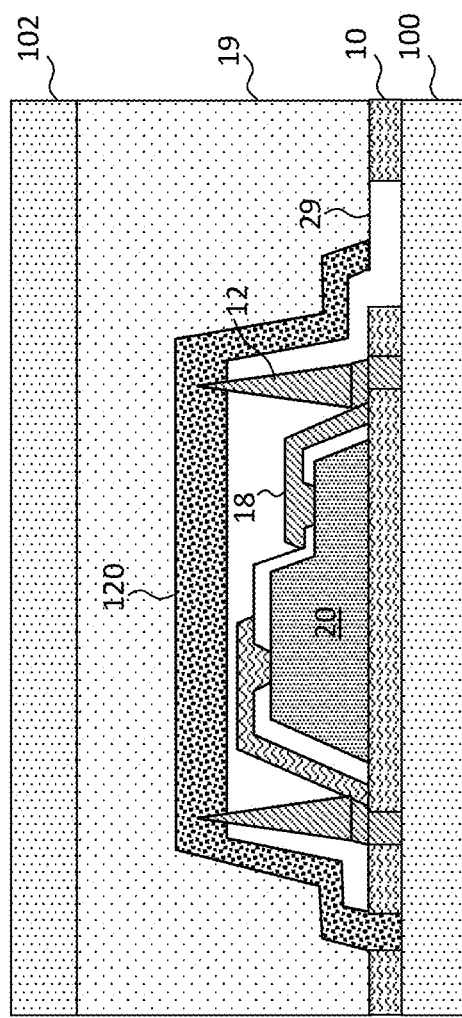
Figure 17H:
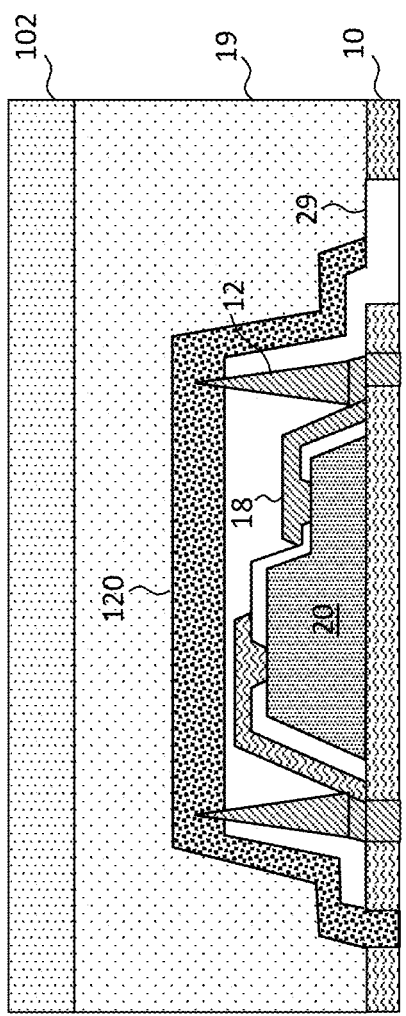
Figure 17I:
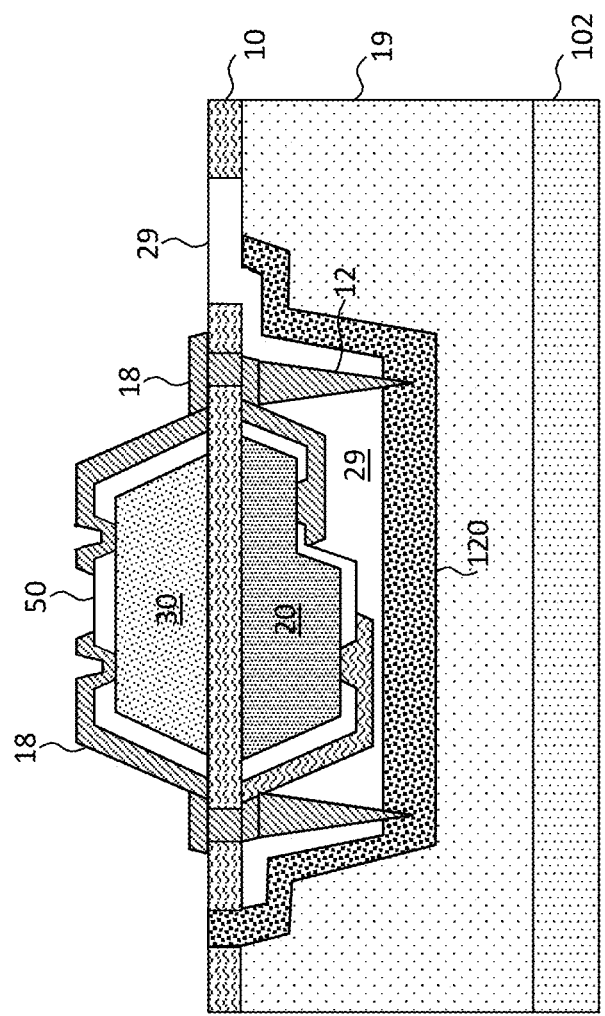
Figure 17J:
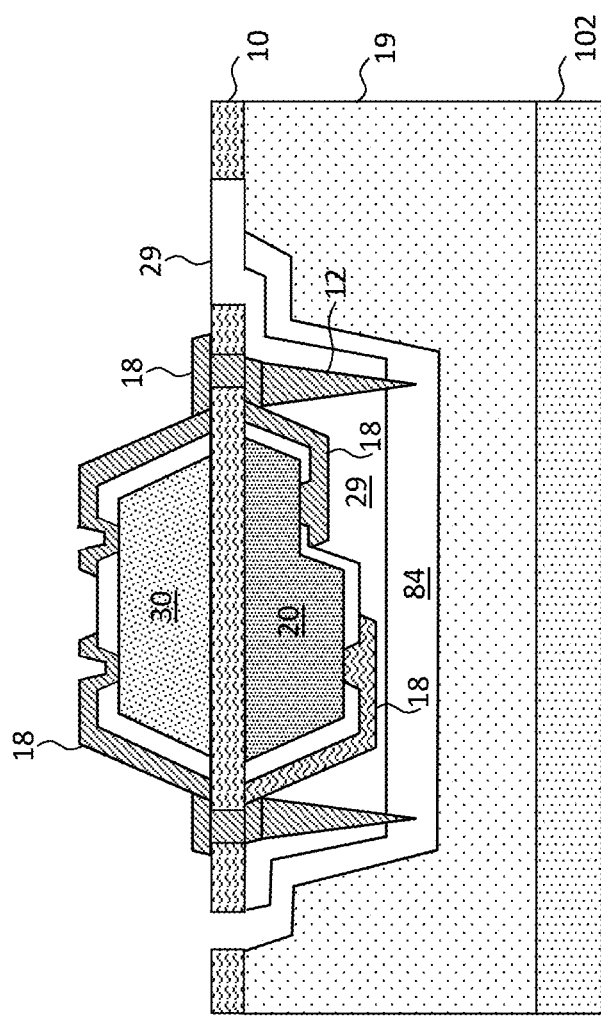
Figure 22:
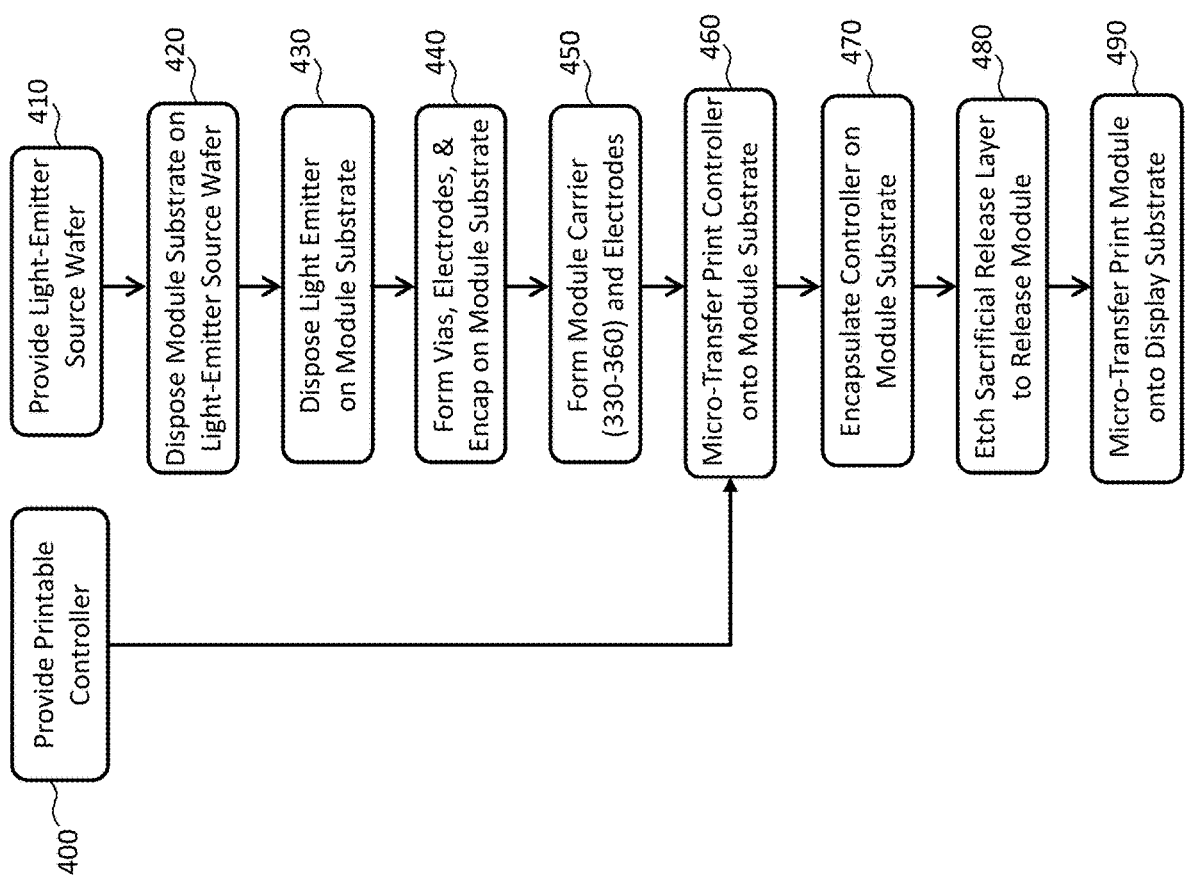

FIGS. 16A-16M illustrate some methods of constructing a pixel-module display 98 in which pixel modules 99 emit light in a direction away from display substrate 70 (a top-emitter configuration). FIGS. 17A-17L illustrate related steps and structures in which pixel modules 99 emit light through display substrate 70 (a bottom-emitter configuration). Referring to the successive structures illustrated in FIGS. 17A-17M and the flow diagram of FIG. 22 (in which the steps involving light emitter 20 and controller 30 are exchanged with respect to FIG. 21), some embodiments of the present disclosure can be constructed by providing a source wafer 100 for a light emitter 20 in step 410 and as shown in FIG. 17A. Module substrate 10 is disposed on source wafer 100 in step 420 and as shown in FIG. 17B. Thus, in some embodiments, source wafer 100 is a light-emitter source wafer 25 and also a module source wafer 15 and steps 410 and 420 can be a single step of providing a module source wafer 15 with a module substrate 10. In some embodiments, module substrate 10 is formed on source wafer 100 or source wafer 100 is provided comprising module substrate 10 or provided with module substrate 10 disposed on source wafer 100. Light emitter 20 is formed (e.g., using photolithographic methods and materials) or disposed (e.g., by printing, such as micro-transfer printing) on module substrate 10 in step 430 together with module connection posts 12, module electrodes 18, patterned dielectric layers 50, vias 16, light-emitter encapsulation layer 29, and module substrate 10 structures in step 440 as shown in FIGS. 17C and 17D. Referring to FIG. 17D, one or more module connection posts 12 extend through light-emitter encapsulation layer 29 to allow electrical connection of pixel module 99 (e.g., controller 30 and light emitters 20 therein) to display electrodes 74 on target substrate 70. As shown in FIG. 17E, sacrificial release layer 120 is disposed over light-emitter encapsulation layer 29. In particular, sacrificial release layer 120 extends through via 16 in module substrate 10 to contact source wafer 100 and also contacts light-emitter encapsulation layer 29 where light-emitter encapsulation layer 29 defines a module tether 14. One or more module connection posts 12 can extend into sacrificial release layer 120. Referring to FIG. 17F, a layer of adhesive 19 adheres light emitter 20 with sacrificial release layer 120 to carrier 102 (shown in FIG. 17G) and source wafer 100 is removed, as shown in FIG. 17H, thereby exposing module controller surface 10C of module substrate 10 in step 450 and as described in steps 330-360. In step 400, printable controller 30 is provided in any of the configurations of FIG. 9, 10, or 11B. In step 460 and as shown in inverted FIG. 17I, controller 30 is printed (e.g., micro-transfer printed) from a controller source wafer 35 (shown in FIG. 11B) to module controller surface 10C of module substrate 10. In the embodiment of FIG. 17I, controller 30 is electrically connected with photolithographically defined module electrodes 18. In some embodiments, controller 30 is electrically connected with controller assembly connection posts 32 to form an electrical contact between controller 30 and module electrodes 18. An optional layer of adhesive 19 can adhere controller 30 to module substrate 10 and, if present, can be patterned to expose a portion of module sacrificial release layer 120 as shown in FIG. 17I. In step 470, an optional module encapsulation layer is deposited, for example by sputtering or evaporation, and optionally patterned, for example photolithographically, to expose sacrificial release layer 120. Referring to FIG. 17J, in step 480 sacrificial release layer 120 is etched so that only module tether 14 physically connects pixel module 99 to carrier 102 by module anchor 17. In various embodiments of the present disclosure, module tether 14 can comprise an encapsulation layer, for example light-emitter encapsulation layer 29, a controller encapsulation layer 39 (not included in FIGS. 17J-17L), a portion of a layer of adhesive 19, a portion of module substrate 10, or some other module encapsulation layer, or any combination of these. In the embodiments illustrate in FIG. 17J-17L, module tether 14 comprises only light-emitter encapsulation layer 29.

Figure 17K:
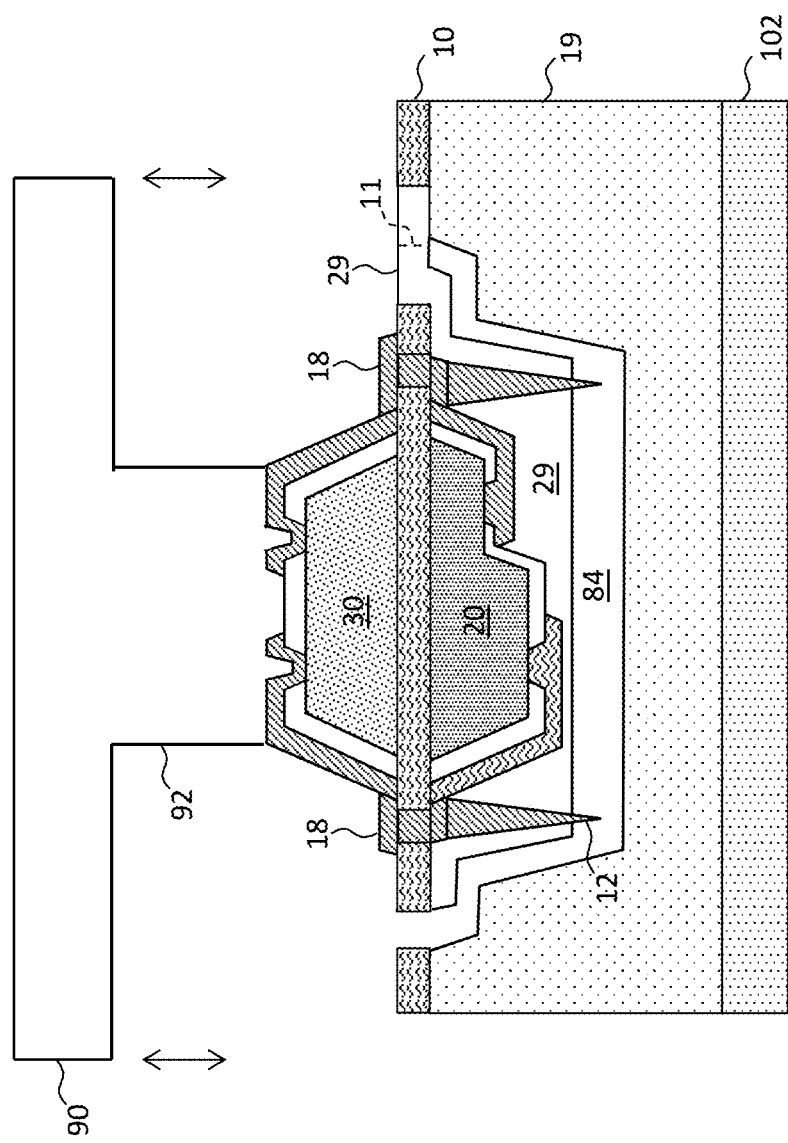
Figure 17L:
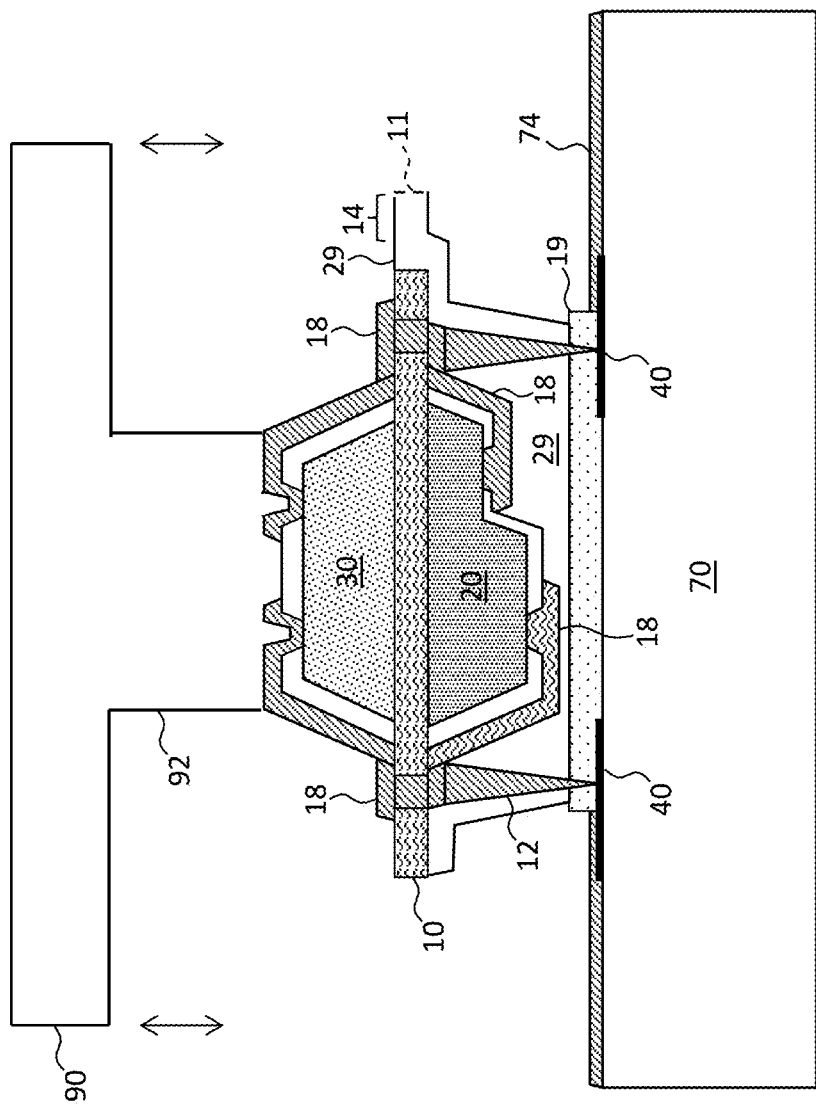

Referring to FIG. 17K, pixel module 99 can be micro-transfer printed (e.g., with stamp 90 and stamp post 92) from carrier 102 to display substrate 70 in step 490, as shown in FIG. 17L, so that module connection posts 12 and module electrodes 18 electrically contact pads 40 and display electrodes 74 on display substrate 70. In some embodiments of the present disclosure, display substrate 70 is a surface-mount substrate (e.g., comprising layers of polyimide and patterned surface-mount electrodes corresponding to display electrodes 74) and pixel module 99 is a part of a surface-mount device. FIGS. 17A-17L illustrate module connection posts 12 corresponding to those illustrated in FIG. 3 but, according to some embodiments of the present disclosure (not shown), module connection posts 12 can be disposed directly on light emitters 20 (corresponding to FIG. 1 for controllers 30).

The embodiments illustrated in FIGS. 16A-16M and 17A-17L both illustrate a single light emitter 20 disposed on module substrate 10 and a single pixel module 99 disposed on display substrate 70. In some embodiments, multiple light emitters 20 are disposed on module substrate 10 (a pixel module 99 comprises a plurality of light emitters 20), for example as shown in FIGS. 1-3 and 12A-13 and multiple pixel modules 99 disposed on display substrate 70 as shown in FIGS. 14A-14D.

The embodiments illustrated in FIGS. 16-16M and 17A-17M are illustrative and not limiting. Those knowledgeable in integrated circuit and display technologies will understand that variations of the described processes, structures, and materials can be applied within the context of the present disclosure and are included within embodiments of the present disclosure. For example, some steps can be done before, after, or at the same time as other steps.

Figure 18A:
FIGS. 18A-18D are successive cross sections of structures according to illustrative embodiments of the present disclosure.
Figure 18B:
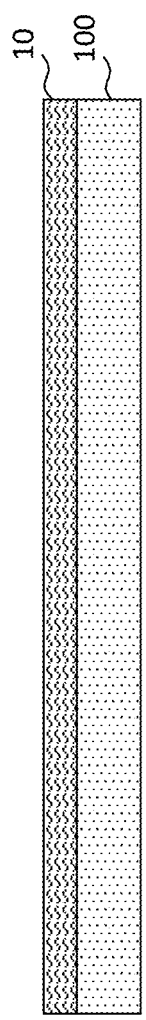
Figure 18C:
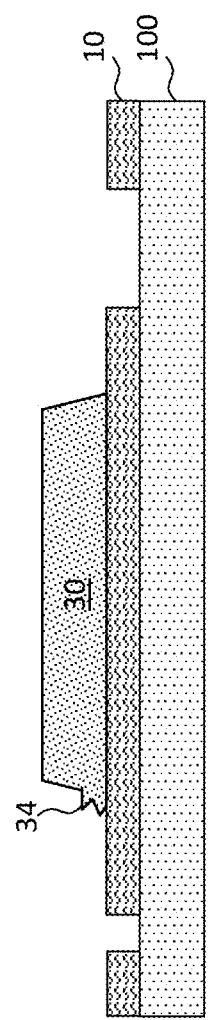
Figure 18D:
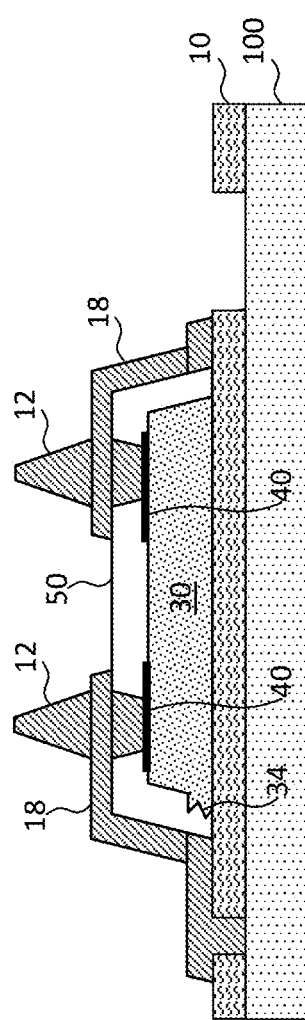
Figure 23:
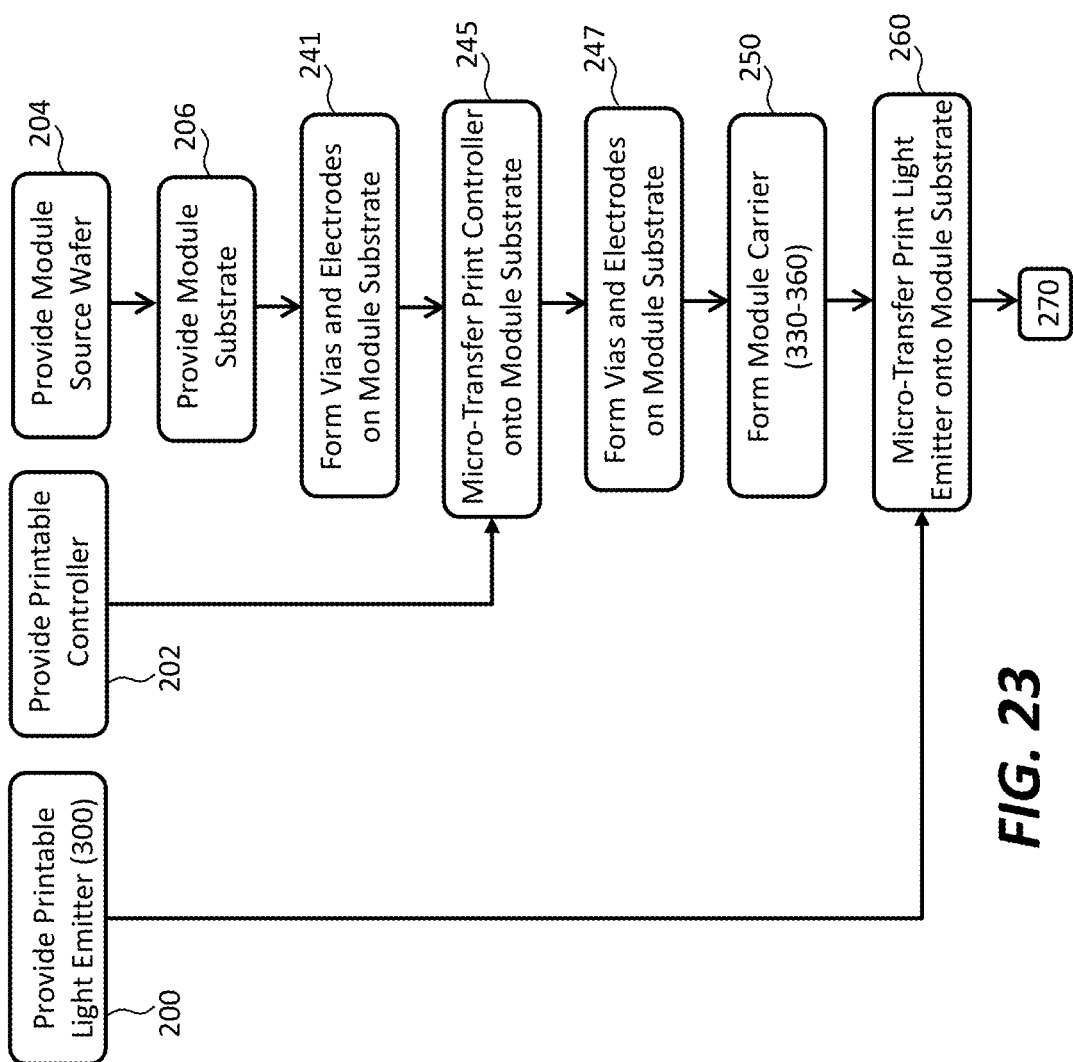

In some embodiments of the present disclosure, components such as light emitters 20 or controllers 30 are constructed and native to module substrate 10. Referring to FIGS. 18A-18D and 19A-19D, components such as light emitters 20 or controllers 30 are printed (e.g., micro-transfer printed) to module substrate 10 from a corresponding source wafer. Referring to FIGS. 18A-18D and the flow diagram of FIG. 23, in step 200 a printable light emitter 20 is provided using step 300 as described above. In this illustration, printable light emitter 20 is provided in an inverted configuration (e.g., as shown in FIG. 6). In some other embodiments, printable light emitter 20 is provided in a non-inverted configuration (as shown in FIGS. 5, 7, and 8). In step 202, controller 30 is provided in a non-inverted printable configuration, for example as shown in FIGS. 9 and 10. Referring to step 204 and FIG. 18A, a source wafer 100 for a pixel module 99 is provided and a module substrate 10 formed or disposed in step 206 as shown in FIG. 18B. Any necessary vias 16, dielectric structures 50, and module electrodes 18 on module substrate 10 can be formed in step 241 and, in step 245 and, as shown in FIG. 18C, controller 30 is disposed (e.g., micro-transfer printed) from a controller source wafer 35 to module substrate 10 (or any layers or module electrodes 18 provided on module substrate 10). In step 247, any additional structures (such as module connection posts 12 or other module electrodes 18) can be formed, as shown in FIG. 18D. The module structure is then inverted with a carrier 102 in step 250 and as generally described in steps 330-360. A printable light emitter 20 (in either an inverted or non-inverted configuration) is then printed (e.g., micro-transfer printed) to module light-emitter surface 10L or module substrate 10 in step 260 and any further processing done, as described with respect to 270, for example such as module connection posts 12, other module electrodes 18, or light-emitter encapsulation layer 29. In some embodiments of the present disclosure, in step 200 a printable controller 30 is provided and in step 202 a printable light emitter 20 is provided so that light emitters 20 are first printed in step 245 and controller 30 is printed in step 260. In some such embodiments, controller 20 can be encapsulated and pixel module 99 printed as described in steps 470-490. In general, encapsulation layers can be provided wherever useful for environmental protection or to provide a layer in which tethers can be defined, or both.

Figure 19A:
FIGS. 19A-19D are successive cross sections of structures according to illustrative embodiments of the present disclosure.
Figure 19B:
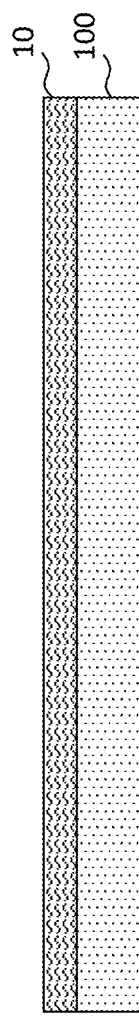
Figure 19C:
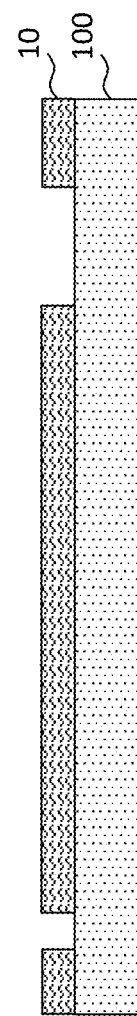
Figure 19D:
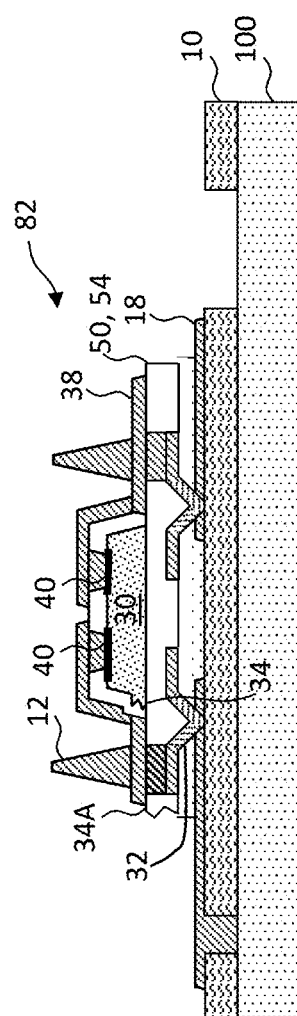

FIGS. 19A-19D illustrate steps of forming a pixel module 99 in which controller 30 is provided with controller assembly connection posts 32. In some such embodiments, FIGS. 19A-19C are similar to those of FIGS. 18A-18C, but in FIG. 19D, a controller assembly 82 including controller 30 and controller assembly connection posts 32 are printed (e.g., micro-transfer printed) to module substrate 10 and module electrodes 18. Module connection posts 12 can be formed on controller 30 either before or after printing.

In some embodiments of the present disclosure, a method of making a pixel module 99 comprises providing a controller 30, module electrodes 18, and module connection posts 12 disposed on a module substrate 10 that is disposed on or in a module source wafer 15 (e.g., a source wafer comprising module substrate 10), where module electrodes 18 are in electrical contact with controller 30. Controller 30, module electrodes 18, module connection posts 12, and module substrate 10 (e.g., with the module source wafer 15) are transferred to (e.g., adhered to with an adhesive 19 such as a resin) a carrier 102 (e.g., a handle substrate) so that controller 30 is disposed between the carrier 102 and module substrate 10. The module source wafer 15 can be removed, e.g., by grinding or laser lift-off. A light emitter 20 is disposed on module substrate 10 so that module substrate 10 is disposed between controller 30 and light emitter 20. Light emitter 20 is non-native to module substrate 10, and light emitter 20 is electrically connected to controller 30 (e.g., by micro-transfer printing light emitter 20 or a light-emitter assembly 80 to module substrate 10) in order to form pixel module 99.

The providing step can comprise disposing controller 30 on module substrate 10 so that controller 30 is non-native to module substrate 10, disposing a patterned first dielectric layer on controller 30, disposing module electrodes 18 on the patterned first dielectric layer and in electrical contact with controller 30, and disposing module connection posts 12. The providing step can further comprise disposing a second dielectric layer on module electrodes 18 so that module connection posts 12 protrude from the second dielectric layer. The second dielectric layer and module substrate 10 can together encapsulate module electrodes 18 and controller 30.

Some methods of the present disclosure comprise forming a patterned sacrificial release layer on the second dielectric layer prior to the transferring step, where the patterned sacrificial release layer covers the one or more module connection posts 12. The patterned sacrificial release layer can be sacrificed, for example by wet or dry etching, to release pixel module 99 from the carrier 102 and enable pixel module 99 to be transfer printed to a target substrate 70. Thus, according to some embodiments, the patterned sacrificial release layer is at least partially removed after source wafer 100 is removed.

At least a portion of the second dielectric layer can be disposed in a common plane with module substrate 10 so that controller 30 and light emitter 20 remain connected to the carrier 102 by the portion of the second dielectric layer after the patterned sacrificial release layer is at least partially removed. Thus, the portion of the second dielectric layer can form or be a module tether 14. Pixel module 99 can then be transferred (e.g., by micro-transfer printing with a stamp 90) from the carrier 102 to a target substrate 70 (e.g., a display substrate 70). Additional module electrodes 18 can be formed on a surface of module substrate 10 opposite controller 30 and light emitter 20 can be printed such that light-emitter connection posts 26 electrically connected to light emitter 20 come into electrical contact with the additional module electrodes 18. Methods of the present disclosure can comprise providing an unpatterned adhesive layer 19 on the additional module electrodes 18 and module substrate 10 prior to disposing light emitter 20 and patterning adhesive layer 19 after disposing light emitter 20 so that adhesive layer 19 after patterning does not extend beyond module substrate 10. Light emitters 20 can comprise a broken (e.g., fractured) or separated light-emitter tether 24 and controller 30 can comprises a broken or separated controller tether 34.

Methods of the present disclosure can comprise providing a first encapsulating layer (e.g., controller encapsulation layer 39) disposed on or over controller 30 so that module substrate 10 and the first encapsulating layer together encapsulate controller 30 and disposing a second encapsulating layer (e.g., light-emitter encapsulation layer 29) on or over light emitter 20 so that module substrate 10 and the second encapsulating layer together encapsulate light emitter 20.

Controller 30 can be electrically connected to light emitter 20 at least in part by one or more module electrodes 18 that pass through or around the edge of module substrate 10.

Pixel modules 99 and methods of the present disclosure dispose a controller 30 (or controller assembly 82) and one or more light emitters 20 (or light-emitter assembly 80) on opposing sides of a module substrate 10. In some embodiments, controller 30 or controller assembly 82 are exposed, that is it is not covered or supported by another substrate or structure. Similarly, in some embodiments, light emitters 20 or light-emitter assembly 80 are exposed, that is they are not covered or supported by another substrate or structure. Module substrate 10 can provide the mechanical structure necessary for supporting any one or more of light emitters 20, light-emitter assembly 80, controller 30, and controller assembly 82.

Pixel modules 99 of the present disclosure can be operated by providing power and signals to module electrodes 18, causing controller 30 to operate and control light emitters 20, for example through vias 16 where present. Power and signals can be provided to pixel modules 99 through module connection posts 12, if present, or through photolithographically defined wires disposed on a substrate, for example display electrodes 74 on display substrate 70, on which pixel modules 99 are disposed. Likewise, power and signals can be provided to light emitters 20 through light-emitter connection posts 26, if present, or through photolithographically defined wires (e.g., module electrodes 18) disposed on module substrate 10 on which light emitters 20 are disposed. Similarly, power and signals can be provided to controller 30 through controller assembly connection posts 32, if present, or through photolithographically defined wires (e.g., module electrodes 18) disposed on module substrate 10 on controller 30 is disposed.

Figure 24:
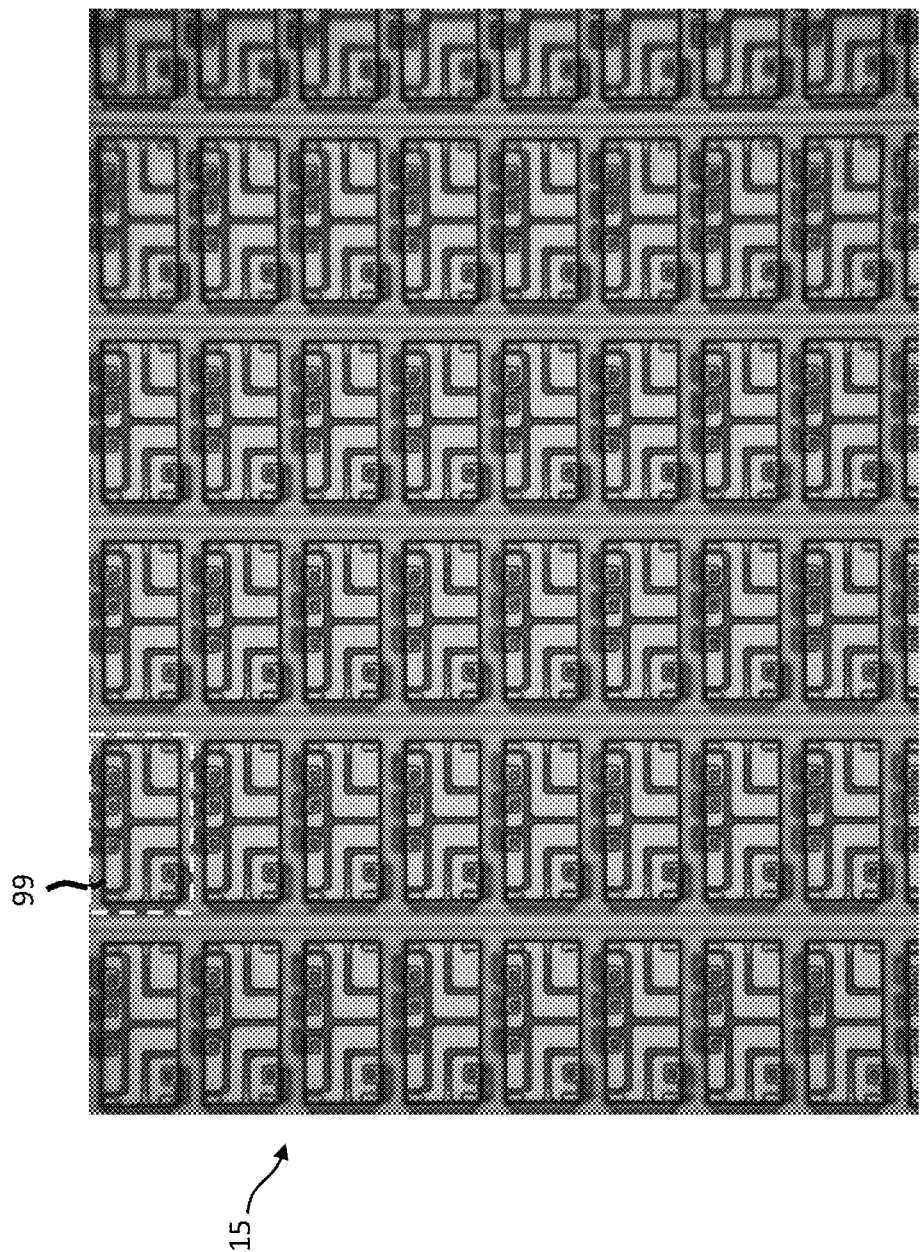
FIGS. 24-25 are micrographs according to illustrative embodiments of the present disclosure.
Figure 25:
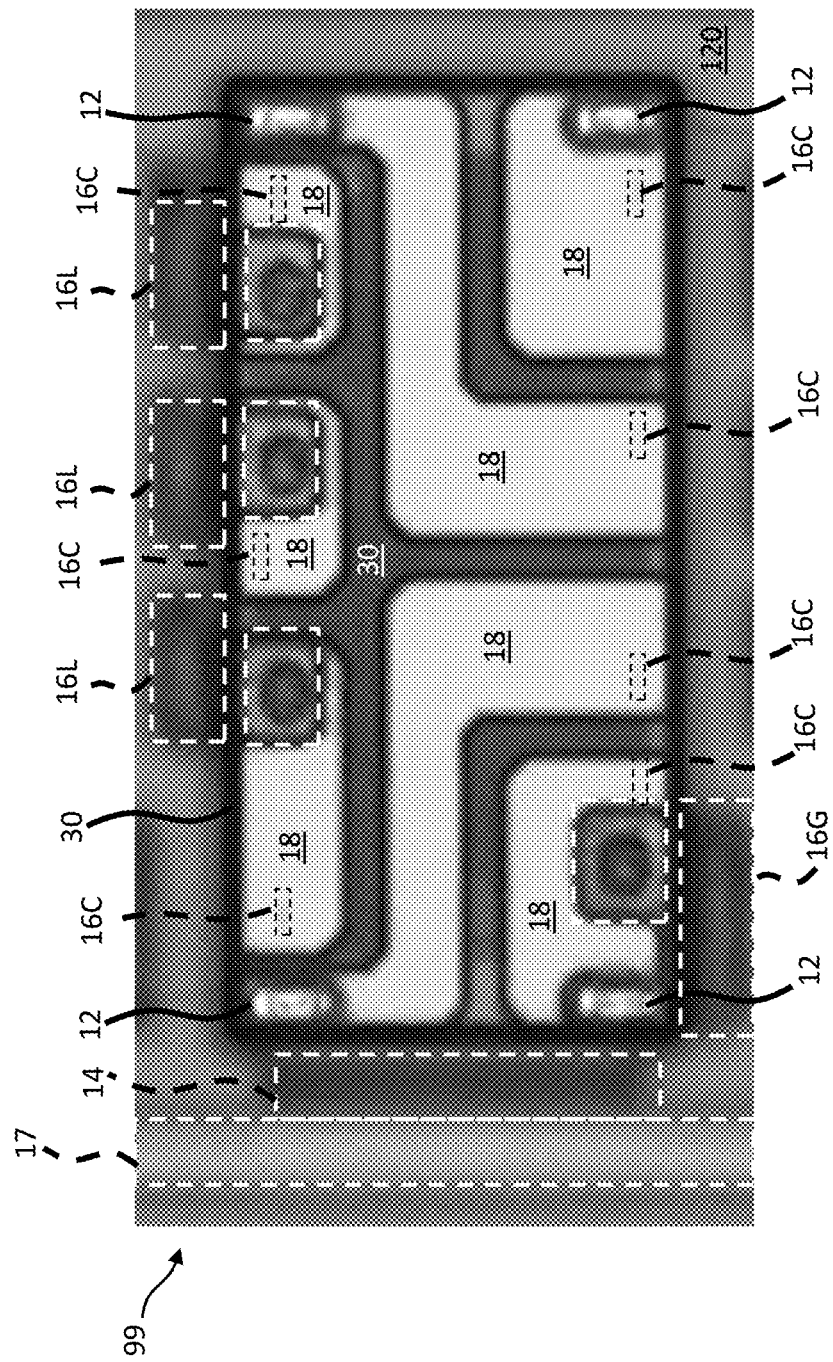

Some embodiments of the present disclosure have been constructed using photolithographic methods and micro-transfer printing, for example, the structures illustrated in FIGS. 1, 6, 8, 9, 11A-11C, 12B, and 14B. Methods and structures of the present disclosure have also been implemented, for example as shown in FIGS. 15A-15I, FIGS. 16A-16M, FIGS. 18A-18D, and FIG. 21. Referring to FIG. 24, a module source wafer 15 comprises a plurality of pixel modules 99 shown in more detail in FIG. 25. The incomplete pixel module 99 of FIG. 25 corresponds to FIG. 16E, viewed from the sacrificial release layer 120 side of the structure. Sacrificial release layer 120 is largely transparent and FIG. 25 is focused on the module electrode 18 layer. Controller 30 is largely beneath and obscured by module electrodes 18 but a perimeter of controller 30 can be seen as a dark rectangular outline. (Dielectric structure 50 is largely transparent and is not indicated but insulates bare-die controller 30 from module electrodes 18 except at controller vias 16C. Controller 30 is a CMOS silicon integrated circuit approximately 40 by 35 microns in length and width and is disposed on an oxide layer that serves as module substrate 10 beneath controller 30. Module substrate 10 is thus a buried oxide layer until module source wafer 15 is removed (as shown in FIGS. 15G and 16F). Module tether 14 and module anchor 17 are outlined on the left of FIG. 25 in dashed white rectangles. Module connection posts 12 are located at the four corners of rectangular controller 30. Controller vias 16C provide electrical connections between module connection posts 12 and controller 30 and between controller 30 and light emitters 20 (micro-iLEDs, disposed as in FIG. 16H) through module electrodes 18. Light-emitter vias 16L electrically connect module electrodes 18 through module substrate 10 to control light emitters 20 and are relatively large to conduct sufficient current. Similarly, ground via 16G provides a ground connection to light emitters 20 and controller 30. Ground and light-emitter vias 16G, 16L connect through an additional dielectric layer 50 (not shown in the micrograph) and therefore comprise two vias 16, one above controller 30 and one adjacent to controller 30. As those knowledgeable in the electronic arts will understand, controller 30 can provide a selective voltage though light-emitter vias 16L to control light emitters 20 that returns through ground via 16G or, with inverted logic, ground via 16G can provide a voltage that is selectively returned through light-emitter vias 16G as a ground connection to control light emitters 20.

According to various embodiments of the present disclosure, a display substrate 70 or target substrate on which pixel modules 99 are disposed can be any material having two opposing side and a surface suitable for supporting electrical components, electrical conductors, and integrated circuits, for example as found in the flat-panel display industry. Display substrates 70 or target substrates 70 such as surface-mount device substrates can be flexible or rigid and can be or comprise, for example, one or more of glass, plastic, metal, or ceramic, polymer, resin, polyimide, PEN, PET, metal, metal foil, glass, a semiconductor, and sapphire.

Module substrate 10 can be a semiconductor substrate in or on which a light emitter 20 or controller 30 is formed, or a separate substrate defined on a module wafer 15. Module substrate 10 can be a glass, polymer, or dielectric layer, for example silicon dioxide or nitride, can comprise a seed layer, and can be a layer deposited on a subsequently removed substrate or wafer. According to some embodiments, module substrate 10 is an insulator layer in an SOI wafer. Controller 30 can be constructed in an epitaxial layer (e.g., crystalline silicon, such as a silicon single crystal) on an insulator layer (e.g., a buried oxide layer such as silicon dioxide) formed on a bulk wafer (e.g., bulk silicon). Through vias 16 can be constructed through the epitaxial and insulating layers and electrically connected to controller 30. The bulk silicon layer can be removed, for example by any one or combination of grinding, wet etching, dry etching, and chemical polishing to expose the insulating layer. Light emitters 20 can be disposed on a side of the insulating layer opposite the epitaxial layer and controller 30, for example by micro-transfer printing, and electrically connected to the through vias to form a completed pixel module 99.

Controllers 30 can be integrated circuits comprising light-emitter control circuits formed in a semiconductor structure or substrate, for example bare-die semiconductor circuits made in monocrystalline silicon using integrated circuit and photolithographic materials and methods. The semiconductor can be, for example, silicon, CMOS, or a compound semiconductor such as GaAs. Controllers 30 can be micro-sized devices, for example having at least one of a length and a width less than 1000 microns (e.g., less than 500 microns, less than 250 microns, less than 100 microns, less than 50 microns, less than 20 microns, or less than 10 microns) and, optionally, a thickness less than 100 microns (e.g., less than 50 microns, less than 20 microns, less than 10 microns, or less than 5 microns).

Similarly, light emitters 20 can be integrated circuits, for example micro-iLEDs, formed in a semiconductor structure or substrate, for example bare-die semiconductor circuits made in monocrystalline materials such as compound semiconductors using integrated circuit and photolithographic materials and methods. The semiconductor can be, for example, silicon, CMOS, or a compound semiconductor such as GaN or GaAs. Light emitters 20 can be micro-sized devices, for example having at least one of a length and a width less than 1000 microns (e.g., less than 500 microns, less than 250 microns, less than 100 microns, less than 50 microns, less than 20 microns, or less than 10 microns) and, optionally, a thickness less than 100 microns (e.g., less than 50 microns, less than 20 microns, less than 10 microns, or less than 5 microns). Such monocrystalline materials can provide faster switching speeds, greater efficiency, and reduced size compared to thin-film materials found in conventional flat-panel displays. Thus, displays having devices and structures constructed according to various embodiments of the present disclosure can have improved performance and resolution.

The following description refers to integrated-circuit modules 99 that can include module substrate 10, non-native device(s) 20, and integrated circuit(s) 30, where the integrated circuit(s) 30 can be native to module substrate 10. It will be readily understood by those of ordinary skill in the art in light of the present disclosure that pixel modules 99 with module substrate 10, non-native devices 20 that are inorganic light-emitting diodes (LEDs) 20, and native integrated circuits 30 that are controllers 30 are examples of an integrated-circuit module 99 that includes module substrate 10, non-native devices 20, and integrated circuit 30, where integrated circuit 30 is native to module substrate 10. However, the present disclosure is not limited to pixel modules 99 with native controllers 30 and non-native LEDs 20. Where reference is made to a pixel module 99 analogous embodiments of an integrated-circuit module 99 are contemplated where integrated-circuit module 99 has a similar structure, but is not a pixel or portion thereof, likewise where reference is made to non-native LED 20 analogous embodiments are contemplated that include instead a non-LED non-native device 20, and where reference is made to controller 30 analogous embodiments are contemplated that instead include an (e.g., native) integrated circuit 30 that is not a controller. For example, in some embodiments non-native device 20 can be or include a sensor (e.g., a magnetic sensor), a power transistor made in a compound semiconductor material, a micro-electromechanical system (MEMS) device such as an acoustic filter or piezoelectric device, an optical filter, a passive device such as an antenna, or a controller for native integrated circuit 30. Among various embodiments, native integrated circuit 30 can be or include, but is not limited to being, an application specific integrated circuit (ASIC), a processor, a controller, an electronic filter, a communication circuit, or an optical sensor.

Figure 26A:
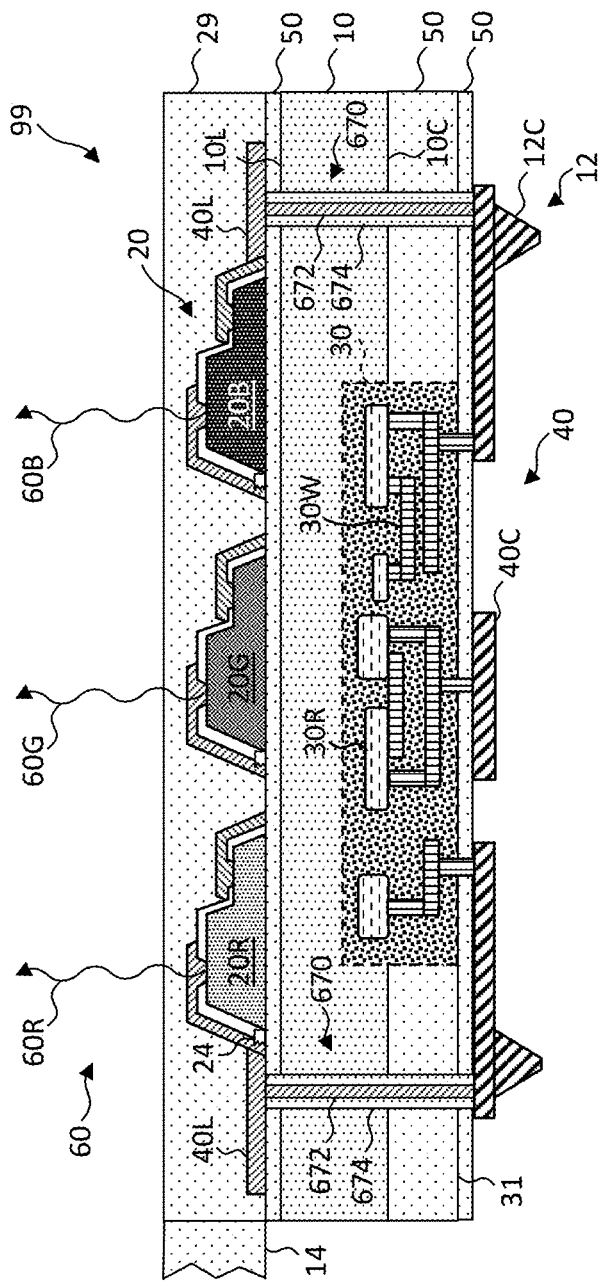
FIG. 26A is a cross section of an integrated circuit module corresponding to FIGS. 1B and 1C according to illustrative embodiments of the present disclosure.
Figure 26B:
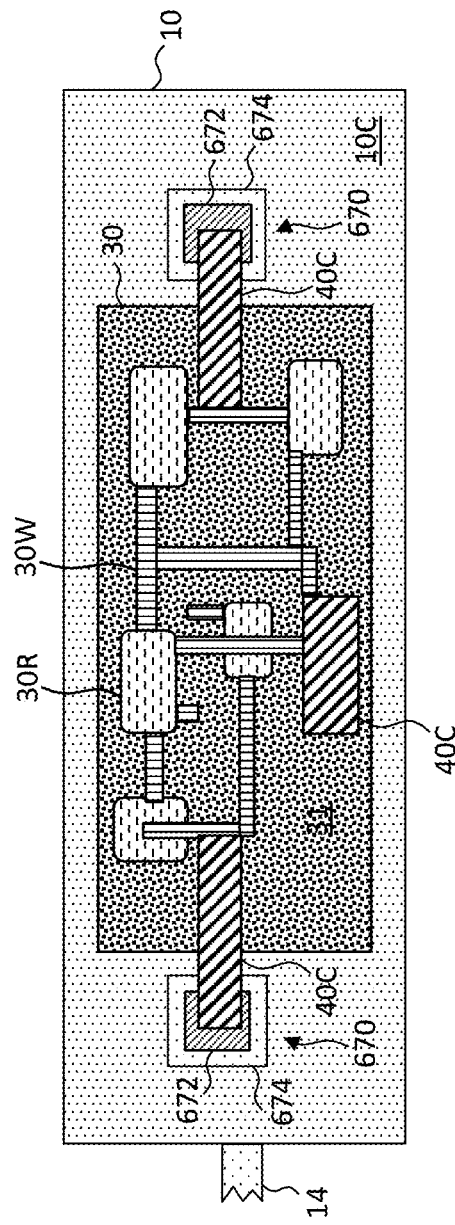
FIG. 26B is a bottom-side plan view of an integrated circuit module according to illustrative embodiments of the present disclosure.
Figure 26C:
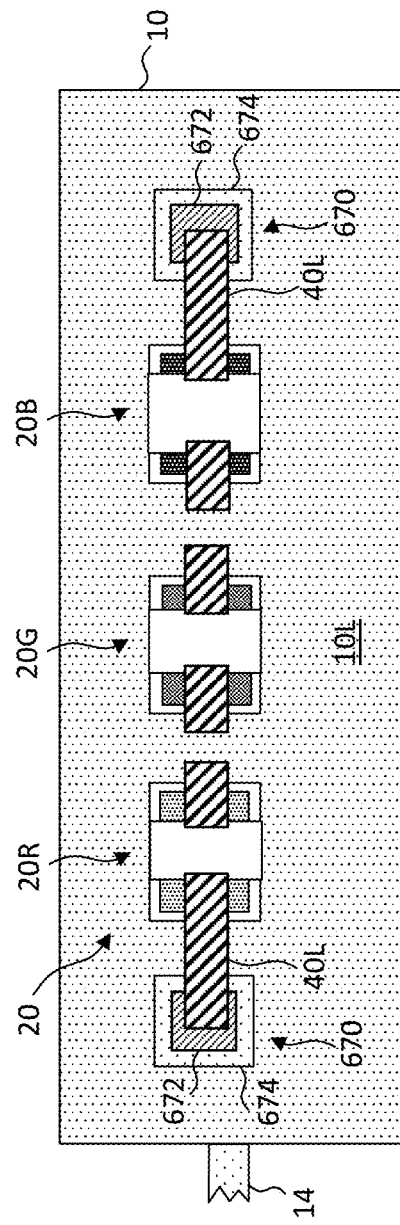
FIG. 26C is a top-side plan view of an integrated circuit module according to illustrative embodiments of the present disclosure.

In some embodiments and as illustrated in the cross section of FIG. 26A, the corresponding bottom plan view of FIG. 26B, and the corresponding top plan view of FIG. 26C, an integrated-circuit module 99 comprises a semiconductor substrate 10 having a native side 10C and a device side 10L. A non-native device 20, such as an inorganic light-emitting diode, is disposed on device side 10L and a native integrated circuit 30, such as a device 20 controller, is formed on or in native side 10C of semiconductor substrate 10 such that a portion of semiconductor substrate 10 is disposed between device(s) 20 (e.g., a light-emitting diode) and integrated circuit 30 (e.g., a controller). A dielectric layer 50 can also be disposed between device(s) 20 (e.g., a light-emitting diode) and integrated circuit 30 (e.g., a controller). An electrode via 670 comprising an electrode 672 extending through semiconductor substrate 10 is electrically connected both to native integrated circuit 30 and to non-native device 20. Electrode via 670 can be or comprise a through-silicon via (TSV).

According to some embodiments, semiconductor substrate 10 is a bulk silicon substrate and is substantially silicon from device side 10L through to native side 10C. In some embodiments, semiconductor substrate 10 is not a semiconductor-on-insulator (SOI) wafer or substrate and can therefore be less expensive, which can reduce the cost of integrated-circuit module 99. Dielectric layer(s) 50 can be disposed on semiconductor substrate 10 (semiconductor wafer 10) on either or both device side 10L and native side 10C but, in some embodiments, such dielectric layers 50 are not disposed between semiconductor portions (e.g., doped semiconductor portions) of native integrated circuit 30 on semiconductor substrate 10 native side 10C and semiconductor substrate 10 device side 10L, in contrast to SOI wafers that have a buried oxide (BOX) layer between an epitaxial layer in which a native circuit is formed and a side of the SOI wafer opposite the epitaxial layer. According to some embodiments of the present disclosure, semiconductor portions of native integrated circuit 30 are formed in a layer of semiconductor material on a process side of semiconductor substrate 10, for example a bulk semiconductor substrate 10 or bulk layer of semiconductor substrate 10.

In some embodiments and as shown in FIGS. 26A-26C, native integrated circuit 30 is formed in or on semiconductor substrate 10 on native side 10C. Semiconductor substrate 10 can comprise any semiconductor material, such as silicon, or a compound semiconductor material, and can be a bulk (e.g., single) crystalline semiconductor substrate (e.g., not a thin-film amorphous or polycrystalline silicon coating or layer on a substrate such as glass). Native integrated circuit 30 can comprise one or more active components such as transistors 30R (e.g., comprising doped semiconductor materials) or one or more passive components such as wires 30W (e.g., comprising metal lines or traces), capacitors, or resistors deposited over transistors 30R, for example in a dielectric layer 50, or both. For example, FIG. 26A illustrates controller 30 being disposed in or on semiconductor substrate 10 where transistors 30R are formed in substrate 10 and wires 30W are disposed in a dielectric layer 50 disposed (e.g., deposited) on semiconductor substrate 10 on native side 10C thereof. Integrated circuit 30, which can be native, can be any useful electronic or opto-electronic circuit and embodiments of the present disclosure are not limited to any particular functionality, form, or layout of native integrated circuit 30 in or on semiconductor substrate 10. Figures showing native integrated circuits 30 are illustrative and are not intended to or may not show any particular complete or functional circuit. Integrated circuit 30 can be native to semiconductor substrate 10. Native integrated circuit(s) 30 are formed in or on semiconductor substrate 10. For example, native integrated circuit 30 can use material from semiconductor substrate 10 to perform its function. For example, native integrated circuit 30 can be formed at least partially in (and optionally on) semiconductor substrate 10 using photolithographic methods and materials that process a layer (e.g., an active, process-side layer) of semiconductor material(s) that are comprised in semiconductor substrate 10, for example by (i) doping, implanting, diffusing, or otherwise depositing materials in semiconductor substrate 10 to control the semiconductor behavior of the semiconductor material(s); (ii) patterning structures in semiconductor substrate 10, for example using photoresist, mask exposures, and etching; (iii) depositing and patterning materials on semiconductor structure 10, for example electrically conductive materials such as metals, such as aluminum, silver, gold, tungsten, tin, dielectric materials such as silicon dioxide, silicon nitride, or organic materials such as epoxies, resins, polyimide, and polymethylmethacrylate; or (iv) any combination of (i)-(iii).

As shown also in FIGS. 26A-C, an integrated-circuit contact pad 40C disposed on integrated-circuit surface 31 can provide one or more electrical connections to native integrated circuit 30. Integrated-circuit surface 31 can be a surface of semiconductor substrate 10 or a surface of a layer disposed on semiconductor substrate native side 10C (e.g., a dielectric layer 50 with a dielectric surface 31C that insulates integrated-circuit contact pads 40C from transistors 30R or wires 30W). An integrated-circuit contact pad 40C can be a wire 30W (e.g., portion thereof) and can be in a same layer as a wire 30W, or a separate layer, e.g., as shown in FIG. 26A. Integrated-circuit contact pad 40C and wires 30W are electrical conductors and can comprise any one or more of a metal, a metal alloy, and a transparent conductive oxide and can be patterned to form wires, contact pads, or other electrical interconnections, and can form electrical connections for native integrated circuit 30. Integrated-circuit contact pad 40C can serve as a redistribution layer (RDL) for integrated-circuit module 99, for example providing larger and lower-resolution electrical connections to integrated-circuit module 99 than are found in integrated circuit 30, devices 20, or device contact pads 40L.

As also shown in FIGS. 26A-C, one or more non-native devices 20 (e.g., LEDs 20) can be disposed on device side 10L of semiconductor substrate 10 (or on a layer disposed on semiconductor substrate 10, e.g., a thin dielectric layer 50 insulating semiconductor substrate 10 from devices 20). A non-native device 20 is not formed on semiconductor substrate 10, for example has a substrate or structure separate, individual, and independent of semiconductor substrate 10. For example, in some embodiments, non-native device 20 is micro-transfer printed from a device source wafer (on or in which device 20 is formed and to which device 20 is therefore native) to semiconductor substrate 10. Non-native devices 20 can be or comprise bare, unpackaged die, for example suitable for micro-transfer printing. Non-native devices 20 can be a micro-device, for example having at least one of a length and width no more than 200 microns (e.g., no more than 100 microns, no more than 50 microns, no more than 20 microns, no more than 10 microns, no more than 5 microns, or no more than 2 microns). A dielectric layer 50 (e.g., an encapsulation layer 29) can encapsulate non-native devices 20 and, in some embodiments, can also form at least a portion of a module tether 14 (e.g., a broken (e.g., fractured) or separated module tether 14 or module tether 14 connected to module anchor 17 on module wafer 15) that can be used to micro-transfer print integrated-circuit module 99 to a target substrate, for example using a viscoelastic stamp. Integrated-circuit module 99 can be or comprise a bare, unpackaged assembly, for example suitable for micro-transfer printing, and can be a micro-device, for example having at least one of a length and a width no more than 400 microns (e.g., no more than 200 microns, no more than 100 microns, no more than 50 microns, or no more than 20 microns).

According to some embodiments of the present disclosure, native integrated circuit 30 is constructed using high-resolution photolithographic processes and contact pads 40 (e.g., integrated-circuit contact pads 40C and device contact pads 40L) and any electrode 672 connections to contact pads 40 are formed at a lower resolution, for example using printed-circuit-board processes. Thus, in some embodiments, native integrated circuit 30 has an integrated-circuit resolution 632 that is greater than a contact-pad resolution 42. (Contact pads 40 can include wires and other electrical connections formed on integrated-circuit surface 31 or device side 10L or layers disposed on device side 10L, such as dielectric layers 50, for example contact pads 40 can include portions of electrode 672 disposed on integrated-circuit surface 31. Thus, electrode 672 can comprise electrical conductors disposed in electrode via 670 and electrical conductors disposed on integrated-circuit surface 31 and on device side 10L, for example on a dielectric layer 50 disposed on device side 10L.) "Resolution" has its conventional meaning in the photolithographic arts, which is the smallest reproducible feature or feature spacing present on or in a device or circuit, e.g., as formed by photolithography. A higher resolution refers to relatively smaller features or feature spacings and lower resolution refers to relatively larger features or spacing. Thus, according to some embodiments of the present disclosure, native integrated circuit 30 (e.g., controller 30) comprises circuit connections and active components and a resolution of the circuit connections and active components (e.g., integrated-circuit resolution 632) is greater than a resolution of electrode 672 or contact pads 40 (e.g., contact-pad resolution 42).

In some embodiments, non-native device 20 comprises a material, e.g., a device substrate material, that is different from a material of semiconductor substrate 10. For example, semiconductor substrate 10 can comprise single crystalline silicon and non-native device 20 can comprise a compound semiconductor (such as GaN or GaAs or other compound (e.g., binary or ternary compound) useful in constructing inorganic LEDs, sensors, or high-electron mobility transistors). Thus, according to some embodiments of the present disclosure, elements comprised in integrated-circuit module 99 have uniformly excellent performance even though integrated-circuit module 99 can comprise different semiconductor materials because native integrated circuit 30 (e.g., a CMOS circuit) is constructed in single crystalline silicon rather than thin-film amorphous or polycrystalline silicon (with much lower electron mobility) and non-native devices 20 are also constructed in crystalline semiconductor material on a source substrate (with matching crystal structure) and transferred to integrated-circuit module 99. (Non-native devices 20 can comprise one or more different semiconductor materials from native integrated circuit 30.) As in known in the art, silicon can have inferior performance (or cannot function at all) for some device applications, and devices made of different semiconductor materials formed on a silicon substrate can have inferior performance because of crystal structure mismatches (e.g., lattice spacing mismatch causing high defect densities) between the different semiconductor materials and crystalline silicon. Therefore, embodiments of the present disclosure have improved performance or reduced size, or both, over prior (e.g., non-heterogeneous) modules.

According to some embodiments of the present disclosure, one or more integrated-circuit contact pads 40C are in electrical contact with electrode 672 and, optionally, are in electrical contact with one or more integrated-circuit connection posts 12C. Electrode via 670 can comprise a hole, for example a hole with a square, rectangular, oval, elliptical, or cylindrical cross section, that extends through semiconductor substrate 10 from native side 10C to non-native device side 10L. Electrode via 670 can be coated with a sidewall dielectric 674, e.g., silicon dioxide. An electrically conductive electrode 672 can be disposed in or forms electrode via 670, can be insulated from semiconductor substrate 10 by sidewall dielectric 674, and can electrically connect native integrated circuit 30 through integrated-circuit contact pad 40C to non-native device 20 through device contact pad 40L. For example, electrode 672 can electrically connect controller 30 on native side 10C of semiconductor substrate 10 to LEDs 20 on device side 10L of semiconductor substrate 10 to form a functioning pixel module 99. The portion of electrode 672 in electrode via 670 can be, for example, tungsten (e.g., a tungsten plug). Electrode 672 can extend onto integrated-circuit surface 31 and device side 10L or layers, such as dielectric layers 50, disposed on device side 10L. Portions of electrode 672 not in electrode via 670 can comprise a different material, e.g., aluminum, than portions of electrode 672 in electrode via 670. Device contact pads 40L can be disposed on semiconductor substrate 10 or a layer disposed on semiconductor substrate 10 (e.g., a dielectric layer 50 that insulates device contact pads 40L from semiconductor substrate 10) and can be made using similar materials and methods as integrated-circuit contact pads 40C (e.g., photolithographic methods and materials). Integrated circuit 30 can control non-native devices 20 (or vice versa), e.g., controller 30 can control LEDs 20.

Figure 27:
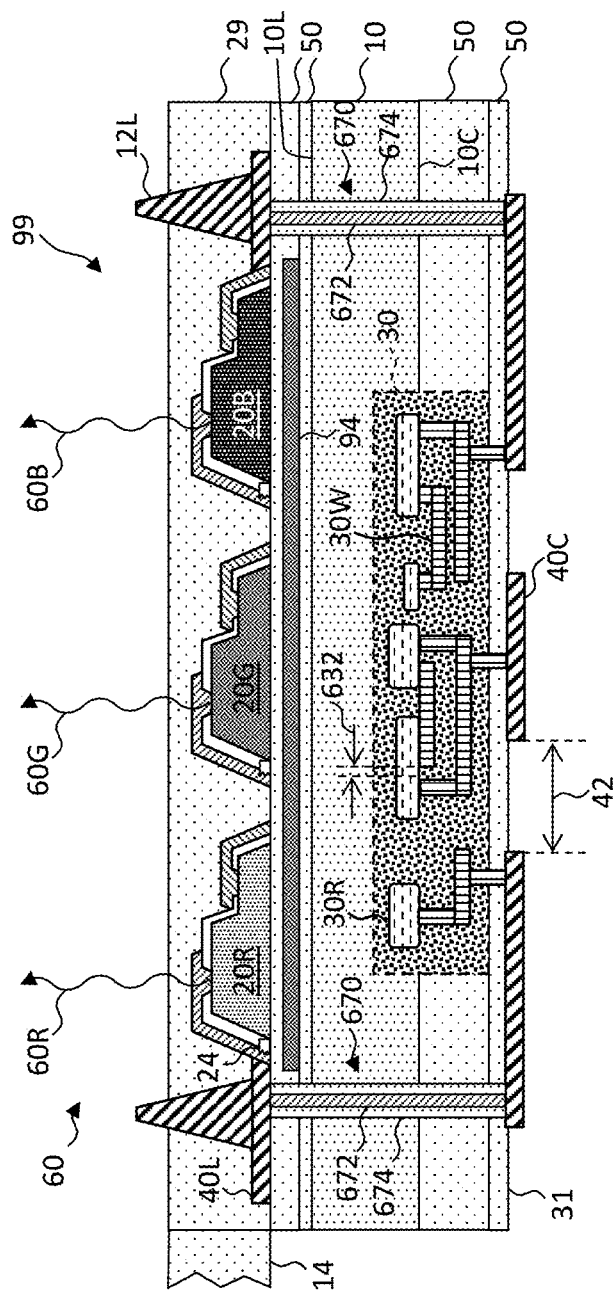
FIG. 27 is a cross section of an integrated circuit module according to illustrative embodiments of the present disclosure.

In some embodiments and as shown in FIG. 26A, an integrated-circuit connection post 12C can be formed or deposited on or in electrical contact with one or more of integrated-circuit contact pads 40C. As shown in FIG. 27, a device connection post 12L can be formed or deposited on or in electrical contact with one or more of device contact pads 40L. (Integrated-circuit connection posts 12C and device connection posts 12L are collectively connection posts 12.) Such connection posts 12 extend away from semiconductor substrate 10 and can have a distal end that is smaller than a proximal end in physical contact with integrated-circuit contact pad 40C or device contact pad 40L, e.g., have a sharp point. Connection posts 12 can extend beyond any planarization layer or encapsulation layer 29 disposed on semiconductor substrate 10 so that the ends of connection posts 12 are exposed to make electrical connections. Connection posts 12 can enable electrical connection with a target substrate contact pad by micro-transfer printing integrated-circuit module 99 in alignment with a target substrate, as discussed also in U.S. Pat. No. 10,468,363, whose contents are incorporated by reference herein.

In some embodiments of the present disclosure, integrated-circuit module 99 comprises multiple non-native devices 20 connected through multiple electrode vias 670 to native integrated circuit 30, e.g., as shown in FIG. 26A. In some embodiments, each non-native device 20 can be electrically connected through multiple electrode vias 670. Native integrated circuit 30 can be a controller 30 (e.g., a CMOS circuit made in single crystalline silicon) for non-native devices 20 (e.g., inorganic LEDs made in compound semiconductor(s)). In some embodiments, LEDs 20 are horizontal LEDs 20 (e.g., as shown in FIGS. 26A and 26C); in some embodiments LEDs 20 are vertical LEDs 20 (not shown in the Figures). In some embodiments, integrated-circuit module 99 is a pixel module 99 for a display pixel and comprises three non-native devices 20 (e.g., a red LED 20R operable to emit red light 60R, a green LED 20G operable to emit green light 60G, and a blue LED 20B operable to emit blue light 60B, collectively LEDs 20 and light 60, respectively) controlled by (e.g., native) integrated circuit 30 (e.g., controller 30) to provide a full-color pixel module 99. LEDs 20 can emit light away from semiconductor substrate 10, e.g., as shown in FIG. 26A. LEDs 20 can be disposed on semiconductor substrate 10 from LED source wafers 25 using micro-transfer printing and can comprise broken (e.g., fractured) or separated device tethers 24. Pixel module 99 (or more generally integrated-circuit module 99) can be a micro-transfer printed module and can comprise a broken (e.g., fractured) or separated module tether 14.

Figure 28A:
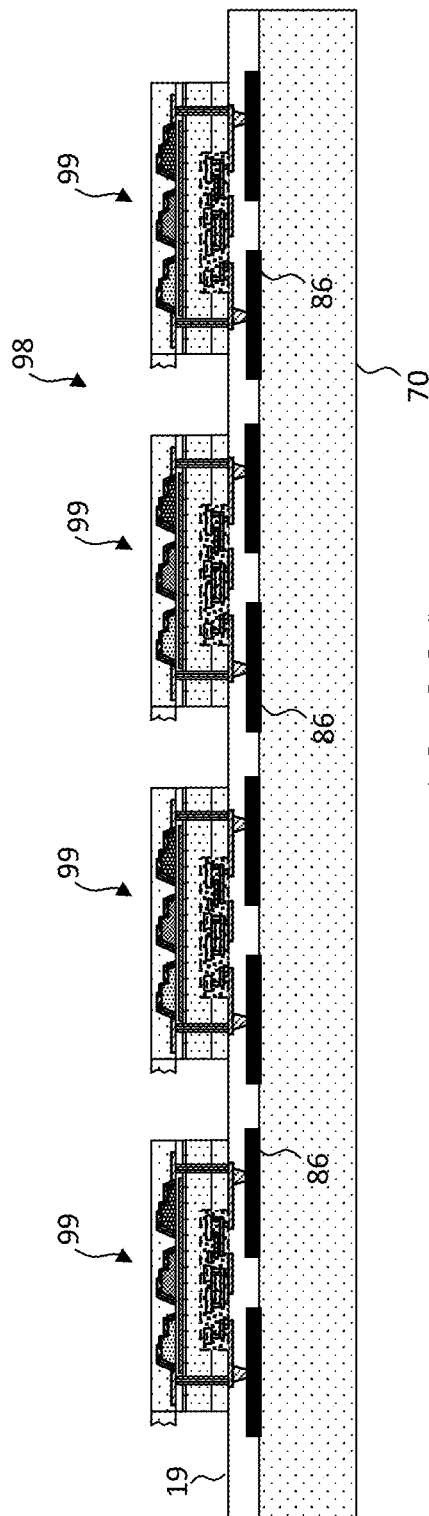
FIG. 28A is a cross section of a top-emitter pixel-module display according to illustrative embodiments of the present disclosure.
Figure 28B:
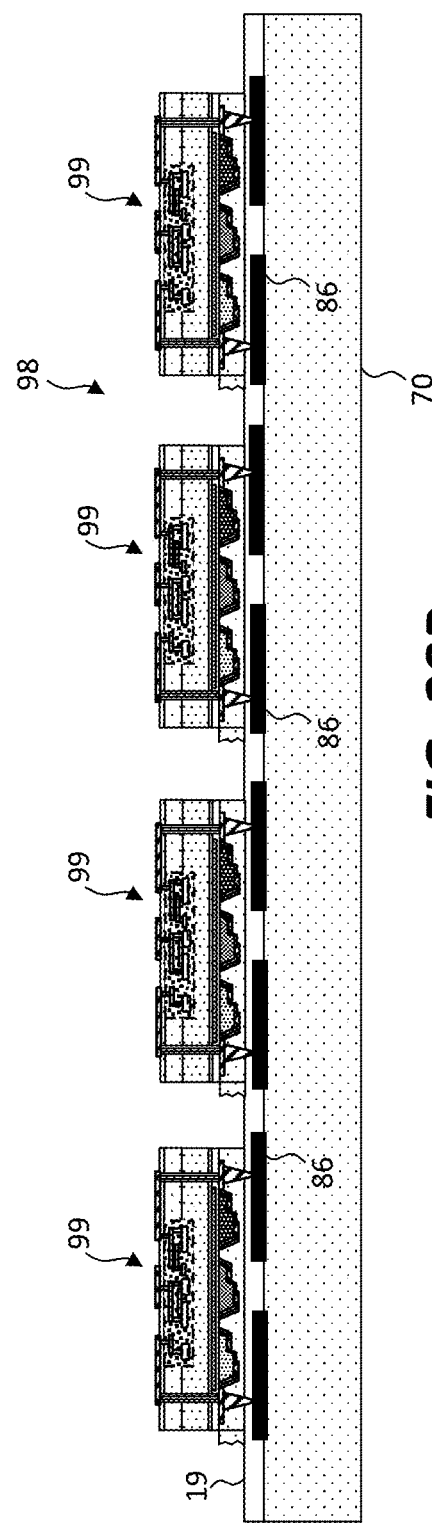
FIG. 28B is a cross section of a bottom-emitter pixel-module display according to illustrative embodiments of the present disclosure.

In some embodiments of the present disclosure and as illustrated in FIGS. 28A and 3B, pixel module display 98 comprises a plurality of pixel modules 99 and a display substrate 70 on which the plurality of pixel modules 99 is disposed (e.g., in a regular array). Each pixel module 99 can comprise integrated-circuit connection posts 12C (e.g., as shown in FIGS. 26A and 27) in electrical contact with display contact pads 86 and can be disposed and electrically connected on display substrate 70, for example by micro-transfer printing. A layer 19 of adhesive can adhere pixel modules 99 to display substrate 70. Pixel modules 99 can be electrically connected through connection posts 12 and electrically conductive display contact pads 86 to a display controller (not shown in the Figures). In some embodiments, LED 20 is a bare, unpackaged LED 20 and comprises a broken (e.g., fractured) or separated LED tether 24. In some embodiments, each pixel module 99 is a bare, unpackaged pixel module 99 and comprises a fractured or separated module tether 14. In some embodiments, controller 30 is disposed between LED 20 and display substrate 70 (as shown in FIG. 28A in a top emitter configuration). In some embodiments, LED 20 is disposed between controller 30 and display substrate 70 and display substrate 70 is at least partially transparent (e.g., no less than 20%, 50%, 70%, 80%, or 90% transparent to light 60 emitted by LEDs 20 and as shown in FIG. 28B in a bottom emitter configuration).

Figure 29A:
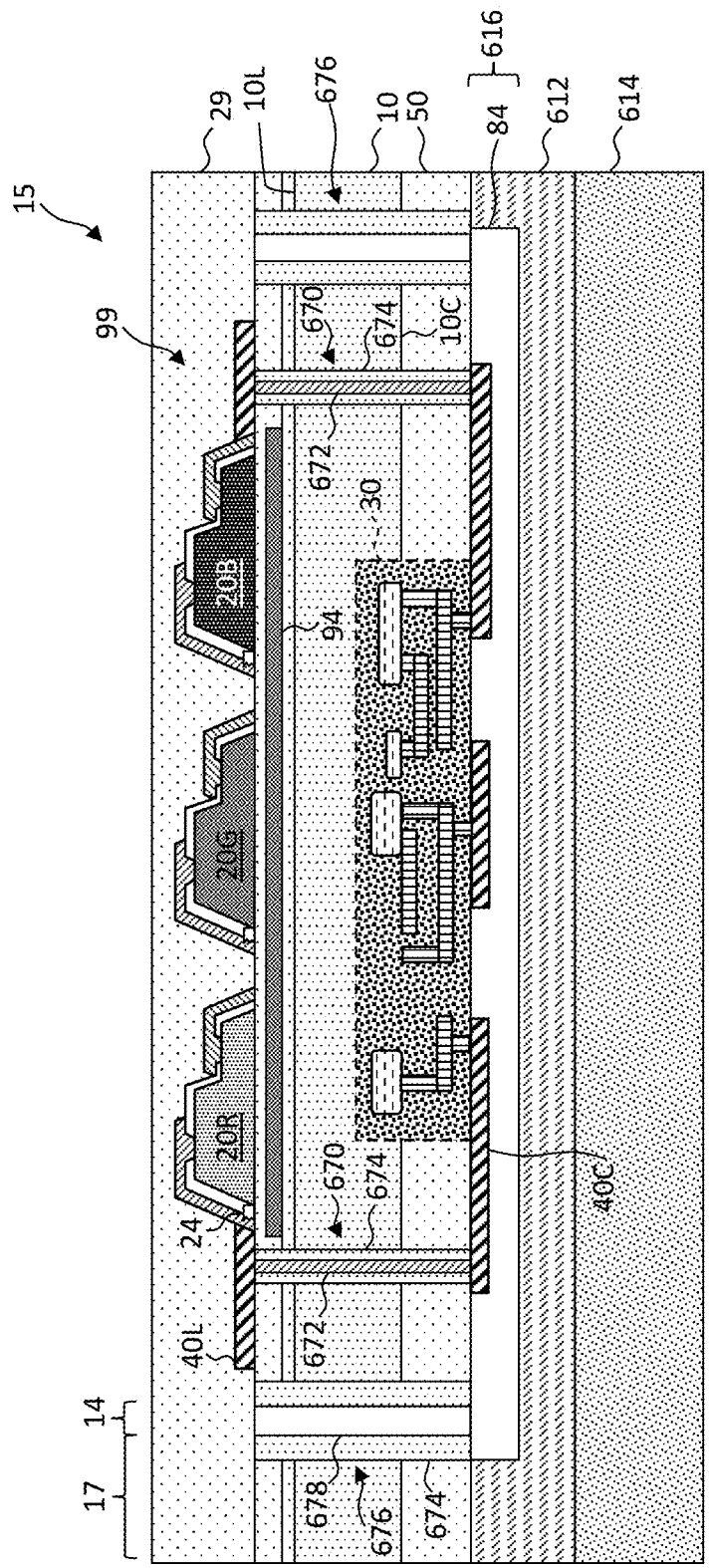
FIG. 29A is a cross section of a semiconductor wafer comprising a pixel module corresponding to FIG. 29B taken across cross section line A according to illustrative embodiments of the present disclosure.
Figure 29B:
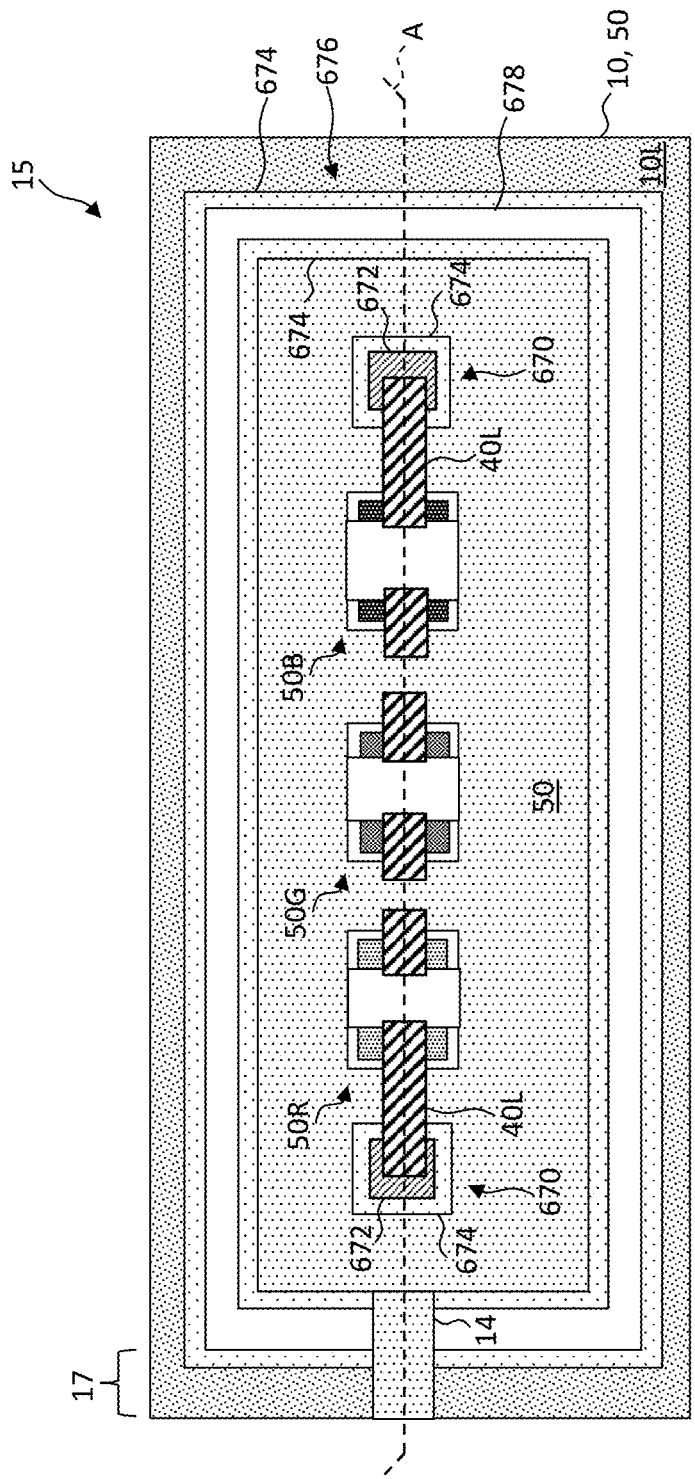
FIG. 29B is a top-side plan view of a semiconductor wafer comprising a pixel module according to illustrative embodiments of the present disclosure.
Figure 30:
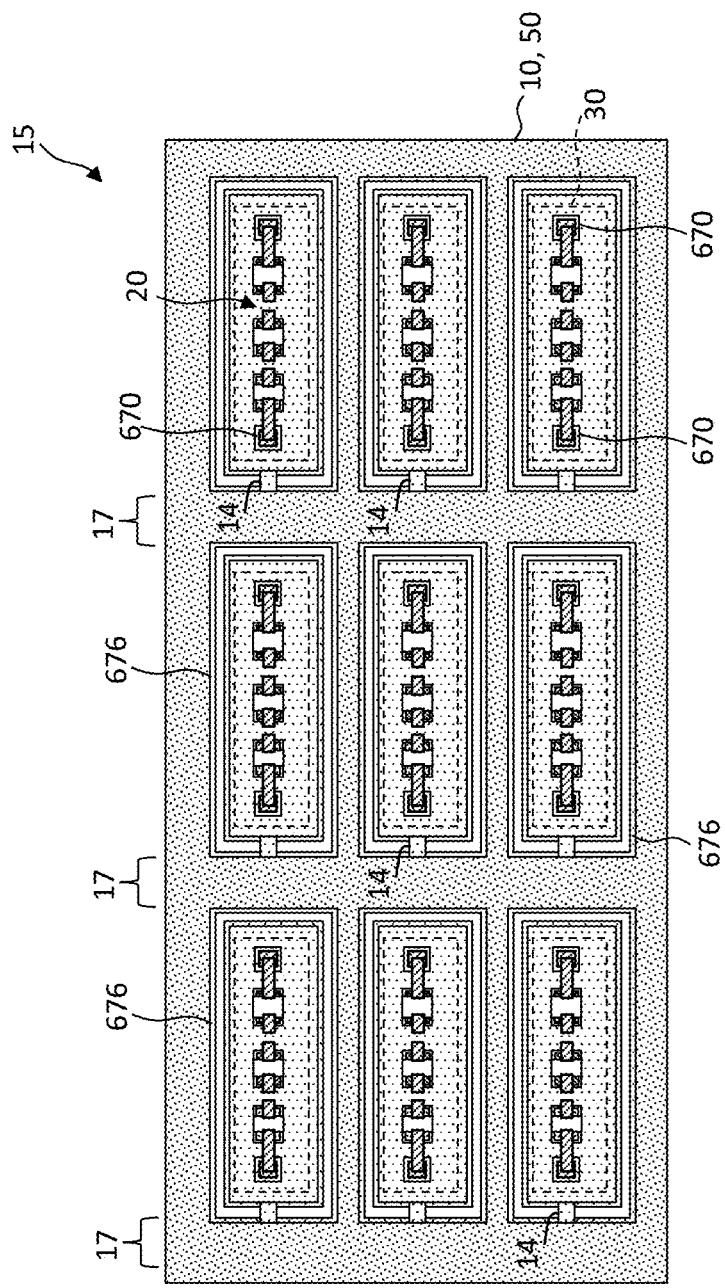
FIG. 30 is a plan view of a semiconductor wafer comprising pixel modules according to illustrative embodiments of the present disclosure.

According to some embodiments and as illustrated in FIGS. 29A, 29B and 30, a module wafer 15 (e.g., a pixel-module wafer 15) comprises a semiconductor substrate 10 having a native side 10C and a device side 10L. A native integrated circuit 30 (e.g., controller 30) is formed on or in native side 10C of semiconductor substrate 10. An electrode via 670 comprising an electrode 672 extends into semiconductor substrate 10, the electrode 672 electrically connected to controller 30 (e.g., native integrated circuit 30) for example with integrated-circuit contact pads 40C. Electrode 672 can extend onto integrated-circuit surface 31. An etch via 676 extends into semiconductor substrate 10 forming a wall disposed at least partially surrounding native integrated circuit 30 (e.g., controller 30) and, in some embodiments, at least partially surrounding electrode via 670, so that the wall surrounds controller 30 (e.g., native integrated circuit 30) and electrode via 670. Etch via 676 and electrode via 670 can be formed as blind vias. Etch via 676 can comprise a sidewall dielectric 674 that is a similar or the same material as sidewall dielectric 674 of electrode via 670. Etch via 676 also comprises a via sacrificial material 678 (e.g., an etchable material) that can be the same material as electrode 672 in electrode via 670, e.g., tungsten. Etch via 676 can be made in a common step or common steps with electrode via 670, using common masks, materials, deposition processes, and patterning methods.

According to some embodiments of the present disclosure, a patterned sacrificial layer 616 comprises sacrificial portion 84 that is disposed on at least a portion of native side 10C and on the entire native integrated circuit 30. The patterned sacrificial portion 84 extends over electrode via 670 and at least a portion of etch via 676. A bonding layer 612 (e.g., comprising an adhesive or a curable adhesive) can be disposed in contact with sacrificial portion 84. A carrier wafer 614 (e.g., a silicon, quartz, or glass wafer) is bonded to bonding layer 612 on a side of bonding layer 612 opposite semiconductor substrate 10. According to some embodiments, electrode via 670 and etch via 676 extend into and through semiconductor substrate 10 and any layers (e.g., dielectric layers 50) disposed on semiconductor substrate 10, e.g., as shown in FIG. 29A.

In some embodiments, one or more non-native devices 20 (e.g., LEDs 20 formed in a compound semiconductor comprising a material, e.g., GaN or GaAs, different from a material of semiconductor substrate 10, e.g., silicon) are disposed on device side 10L of semiconductor substrate 10. The one or more non-native devices 20 (e.g., LEDs 20) are electrically connected to electrode 672, e.g., with device contact pads 40L. According to some embodiments of the present disclosure, module wafer 15 (e.g., a pixel-module wafer 15) comprises a plurality of electrode vias 670, wherein each electrode via 670 of the plurality of electrode vias 670 is electrically connected to integrated circuit 30, and comprises a plurality of LEDs 20, wherein each LED 20 of the plurality of LEDs 20 is disposed on device side 10L of semiconductor substrate 10 and electrically connected to an electrode 672 of the plurality of electrode vias 670. In some embodiments, integrated circuit 30 (e.g., controller 30) is operable to control non-native devices 20 (e.g., LEDs 20).

According to some embodiments, an encapsulation layer 29 is disposed over device(s) 20 (e.g., LED(s) 20). Encapsulation layer 29 can comprise a dielectric material, for example a same dielectric material as is found in dielectric layer(s) 50 if present, e.g., silicon dioxide. Encapsulation layer 29 can be patterned to expose at least a portion of etch via 676 (e.g., at least via sacrificial material 678) and to extend over and beyond a portion of etch via 676 to form a module anchor 17 on semiconductor substrate 10. A portion of encapsulation layer 29 extending over and beyond the portion of etch via 676 forms a module tether 14 that physically connects controller 30 to module anchor 17 in semiconductor substrate 10 (e.g., as shown in FIG. 29B), thereby suspending integrated circuit 30 over semiconductor substrate 10 (e.g., as shown in FIG. 29A). Integrated-circuit module 99 can be physically connected to module anchor 17 with a module tether 14 so that integrated-circuit module 99 can be micro-transfer printed from carrier wafer 614. To that end, via sacrificial material 678 can be etched, thereby forming a gap 84G in semiconductor substrate 10, and sacrificial portion 84 is etched, thereby forming a gap 84G between integrated circuit 30 and bonding layer 612 and suspending integrated-circuit module 99 (e.g., pixel module 99) (e.g., native integrated circuit 30 (e.g., controller 30), non-native devices 20 (e.g., LEDs 20), and the portion of semiconductor substrate 10 surrounded by etch via 676) over bonding layer 612 and carrier wafer 614, as discussed further subsequently and e.g., as shown in FIG. 31N. In some embodiments, integrated-circuit module 99 comprises one or more connection posts 12 extending away from semiconductor substrate 10 and electrically connected to electrode 672.

According to some embodiments of the present disclosure and as illustrated in FIG. 30, module wafer 15 (e.g., pixel-module wafer 15) comprises a plurality of integrated-circuit modules 99 and comprises a plurality of integrated circuits 30 disposed on or in native side 10C of semiconductor substrates 10 and a plurality of electrode vias 670, each electrode 670 via comprising an electrode 672 extending into a respective semiconductor substrate 10, electrode 672 electrically connected to an integrated circuit 30 of the plurality of integrated circuits 30, wherein an etch via 676 is disposed around each integrated circuit 30 of the plurality of integrated circuit 30 and each electrode via 670 of the plurality of electrode vias 670. In some embodiments, each electrode via 670 of the plurality of electrode vias 670 and each etch via 676 of the plurality of etch vias 676 can extend through respective semiconductor substrate 10. In some such embodiments, e.g., as shown in FIG. 26A, a plurality of devices 20 can be disposed on device side 10L and can be electrically connected to each controller 30 of the plurality of controllers 30. In some embodiments, multiple integrated-circuit modules 99 are formed in a single semiconductor substrate 10 (e.g., a single silicon crystal) and, once etch vias 76 and sacrificial portions 84 are etched, each integrated-circuit module 99 can have a separate semiconductor substrate 10 that is part of a common crystalline (e.g., single crystal) semiconductor substrate 10 [e.g., formed from a common semiconductor layer (e.g., that was originally a continuous layer]. Thus, in some embodiments, module wafer 15 comprises a plurality of integrated-circuit modules 99 each having a respective semiconductor substrate 10 that is formed from a portion of a common semiconductor substrate 10 that can be a single semiconductor layer (e.g., a single crystalline semiconductor layer, such as a single crystal of silicon).

Figure 31A:
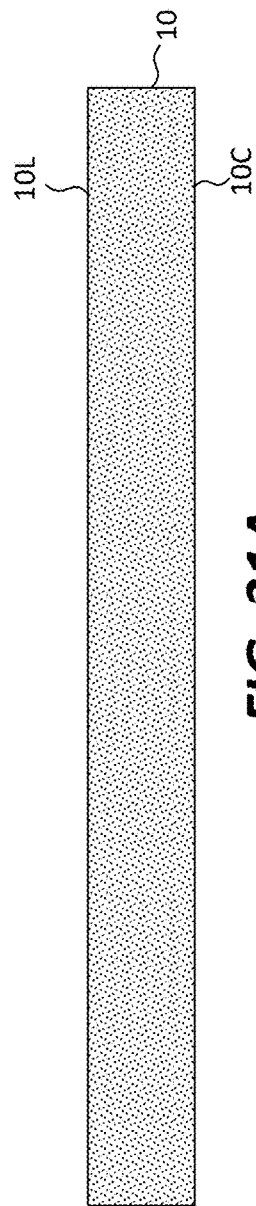
FIGS. 31A-31O are successive cross sections of structures illustrating a method according to illustrative embodiments of the present disclosure.
Figure 31B:
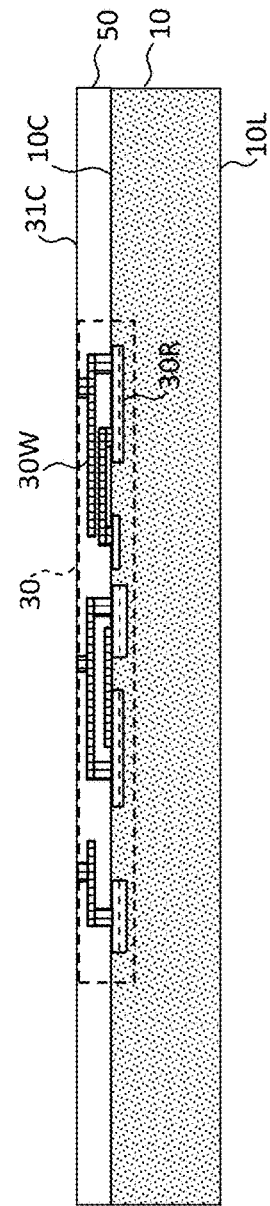
Figure 31C:
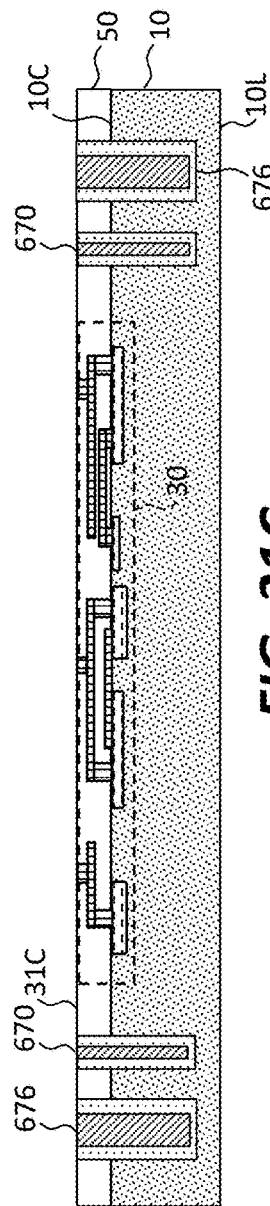
Figure 31D:
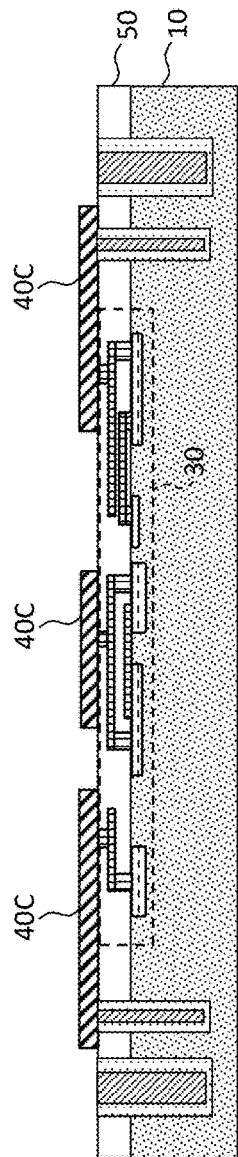
Figure 31E:
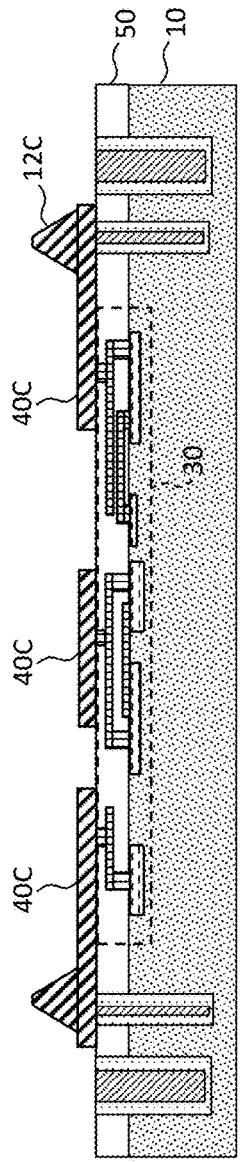
Figure 31F:
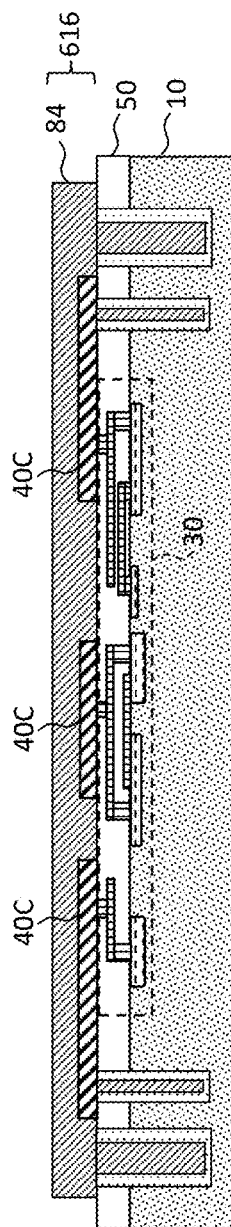
Figure 31K:
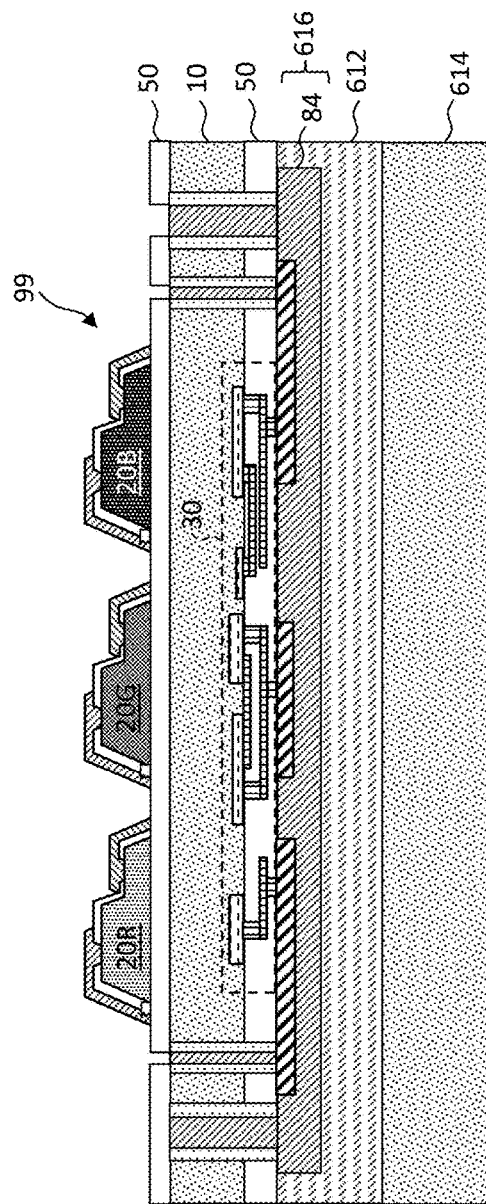
Figure 31L:
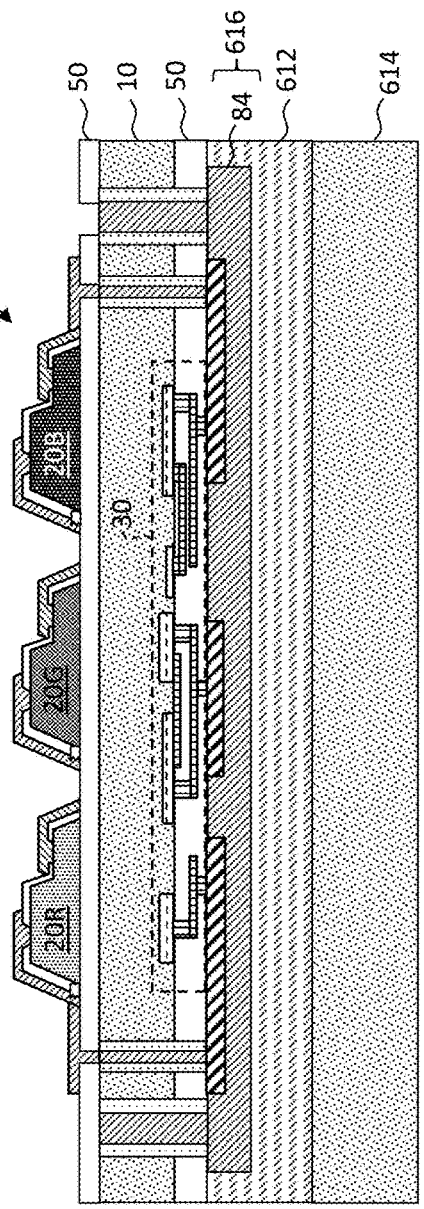
Figure 31M:
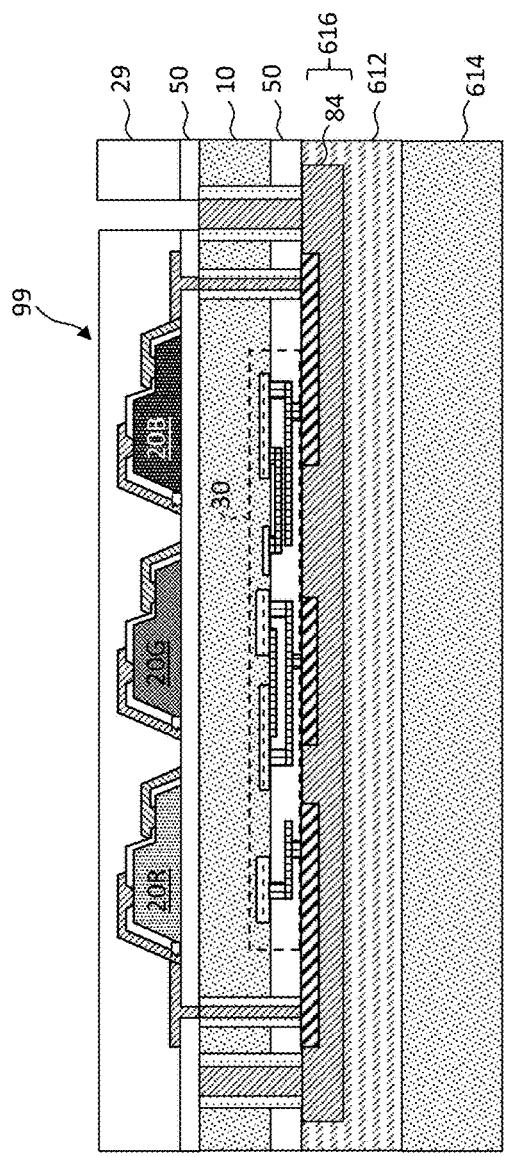
Figure 31N:
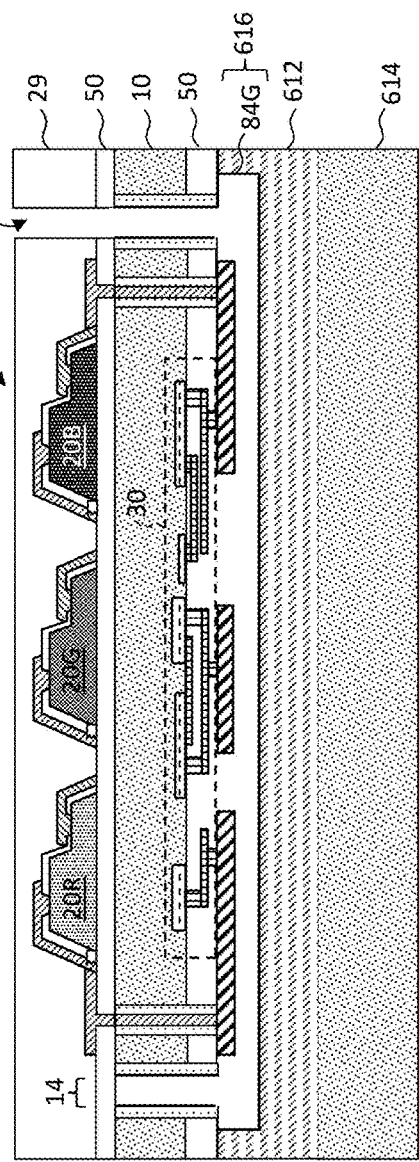
Figure 310:
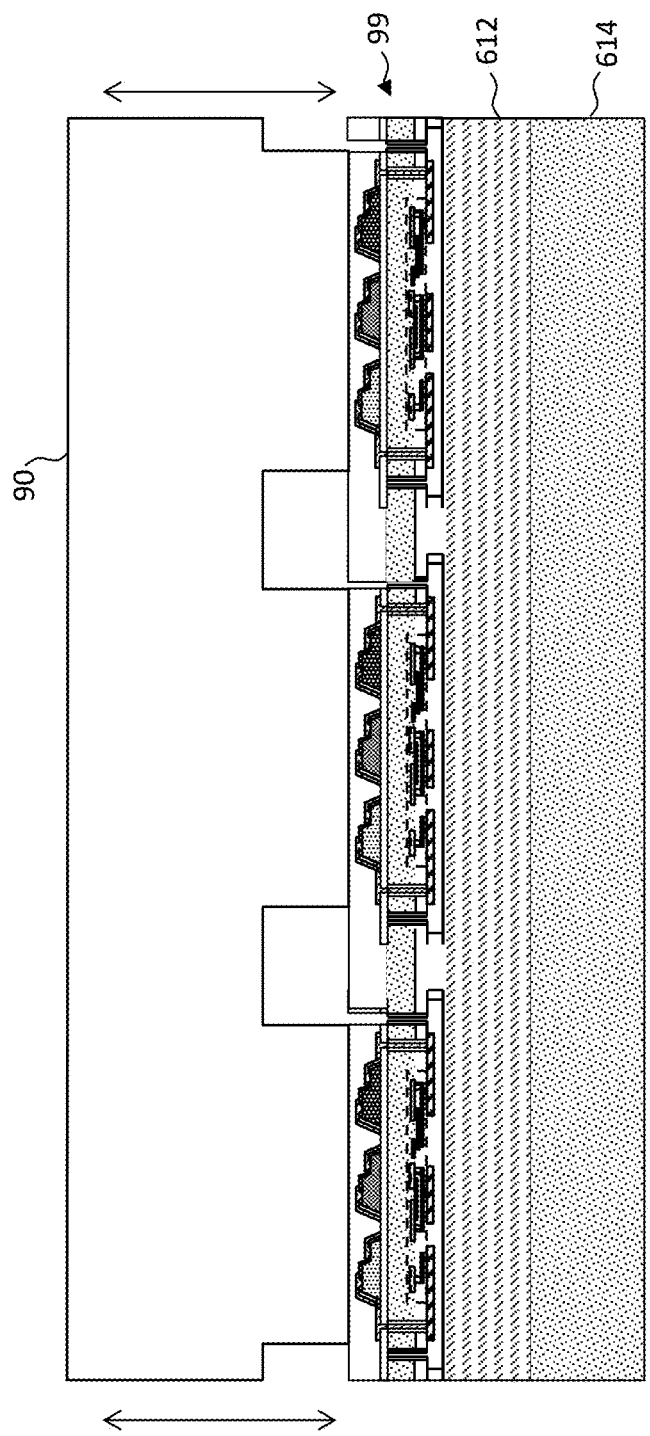
Figure 32:
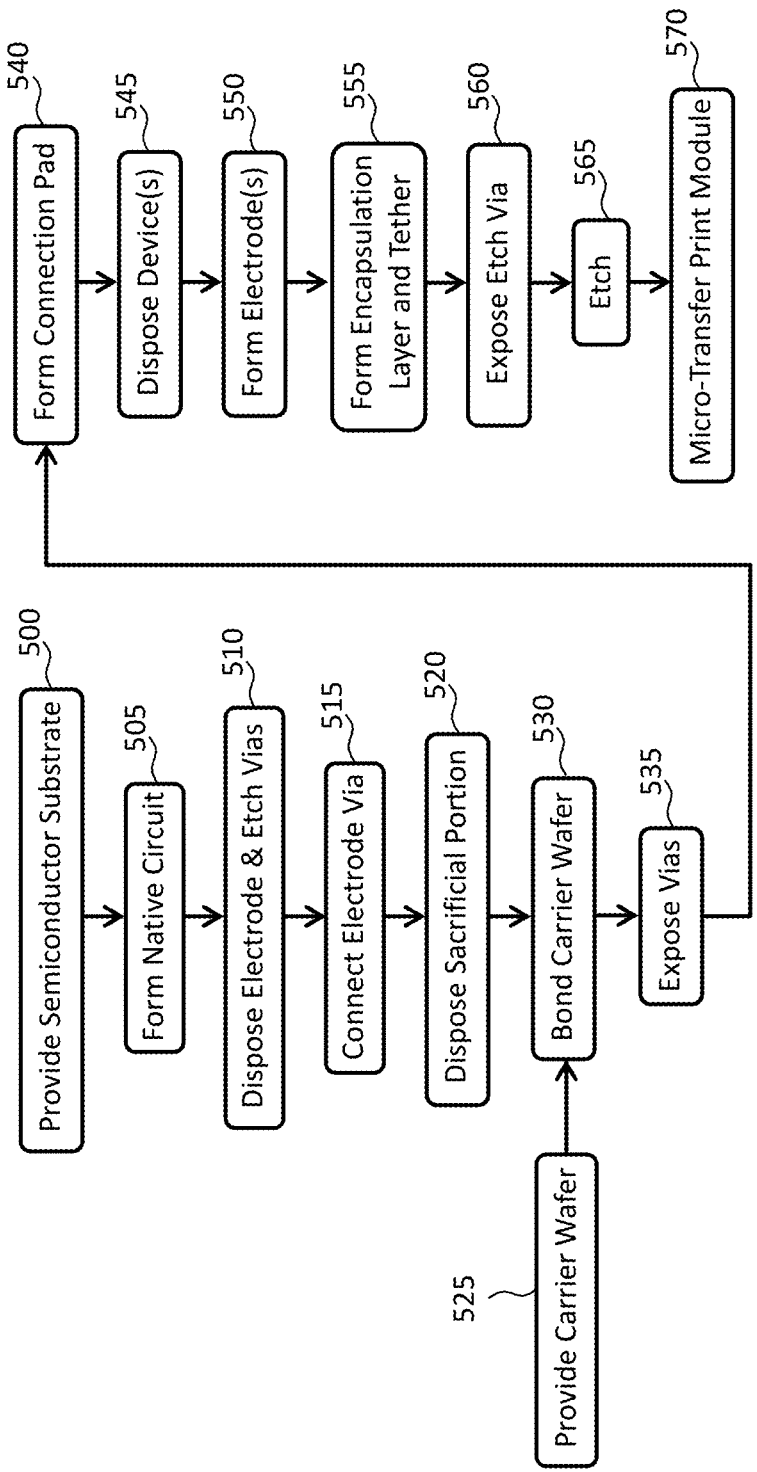
FIG. 32 is a flow chart of exemplary methods according to illustrative embodiments of the present disclosure.

As shown in the successive cross sections of FIGS. 31A-6O and the flow diagram of FIG. 32, according to some embodiments, a method of making an integrated-circuit module 99 (e.g., pixel module 99) comprises providing a semiconductor substrate 10 having a native side 10C and a device side 10L in step 500 and as shown in FIG. 31A, for example a bulk silicon wafer. Integrated circuit 30 is disposed in or on native side 10C of semiconductor substrate 10 in step 505 and as shown in FIG. 31B, for example by photolithography. An electrode via 670 comprising an electrode 672 extending into semiconductor substrate 10 and an etch via 676 forming a wall around integrated circuit 30 and, in some embodiments, around electrode via 670 (e.g., a single wall surrounding both integrated circuit 30 and electrode via 670) is disposed in step 510 and as shown in FIG. 31C, for example by photolithography. Etch via 676 can be filled, for example with via sacrificial material 687 (e.g., as in FIGS. 31C-M), or unfilled, for example when via sacrificial material 687 is etched (e.g., as in FIG. 31N discussed subsequently). Electrode via 670 and etch via 676 can be blind vias that do not extend through semiconductor substrate 10. In step 515, electrode 672 is electrically connected to integrated circuit 30 (e.g., to a wire 30W or transistor 30T of integrated circuit 30) with an integrated-circuit contact pad 40C as shown in FIG. 31D. A patterned sacrificial layer 616 is disposed over integrated circuit 30, electrode 672, and etch via 676 in step 520 and as shown in FIG. 31F, for example by photolithography. A carrier wafer 614 is provided in step 525 and as shown in FIG. 31G and carrier wafer 614 is bonded to patterned sacrificial layer 616 with a bonding layer 612 in step 530 and as shown in FIG. 31H. Bonding layer 612 can be applied to either or both carrier wafer 614 (carrier substrate or handle wafer or handle substrate) or sacrificial portion 84 and semiconductor substrate 10 or dielectric layer 50. Optionally, a portion of semiconductor substrate 10 is removed to expose electrode 670 of electrode via 670 and via sacrificial material 678 of etch via 676 in step 535 and as shown in FIG. 31I, for example by any combination of grinding, wet etching, dry etching, or chemical polishing. Device contact pad 40L is optionally formed on device side 40L of semiconductor substrate 10 in electrical contact with electrode 672 in step 540, for example by photolithography. Device 20 (e.g., LED 20) is disposed on device side 40L of semiconductor substrate 10 in step 545 and as shown in FIG. 31K (shown upside down from FIG. 31I), for example by micro-transfer printing devices 20 from a device source wafer 25 onto or over semiconductor substrate 10. Device 20 is electrically connected to electrode 672 in step 550 and as shown in FIG. 31L, for example by evaporating and patterning metal to form wires. Encapsulation layer 29 is deposited over device(s) 20 and extending over and beyond a portion of etch via 676, for example by evaporation or coating, to form module tether 14 in step 555 and patterned in step 560 to expose etch via 676 as shown in FIG. 31M, Via sacrificial material 678 and sacrificial portion 84 are etched to form gap 84G suspending pixel module 99 over carrier wafer 614 by module tether 14 in step 565 and as shown in FIG. 31N. If desired, pixel module 99 is micro-transfer printed from carrier wafer 614 with a visco-elastic stamp 90 to a target substrate 70 (e.g., display substrate 70) in step 570 and as shown in FIG. 31O.

As shown in the illustrations of FIGS. 31C-31H, in some embodiments of the present disclosure, each electrode via 670 of the plurality of electrode vias 670 and each etch via 676 of the plurality of etch vias 676 extend into but not through semiconductor substrate 10.

In some embodiments and as shown in FIGS. 26A and 31E, an integrated-circuit connection post 12C is formed on and in electrical contact with integrated-circuit contact pad 40C. In some embodiments (as shown in FIG. 27), a device connection post 12L is formed on and in electrical contact with device contact pad 40L. In some embodiments (e.g., as shown in FIGS. 29A and 31J), a light shield 94 is disposed over device side 10L before devices 20, which are LEDs 20, are disposed on semiconductor substrate 10 (e.g., in step 550). Light shield 94 can protect native integrated circuit 30 from light emitted from device 20 (e.g., from LED 20), since the behavior of silicon circuits can be affected by light. According to some embodiments, step 505-520, 530-540, and 550-565 can be performed by photolithographic methods and materials.

In some embodiments, via sacrificial material 678 and sacrificial portion 84 comprise a same material or are etched in a common step. In some embodiments, via sacrificial material 678 and sacrificial portion 84 are different materials and are etched in separate steps. As will be appreciated by those knowledgeable in the photolithographic arts, steps described herein can be performed in different order or at different times to achieve the same structures and objectives, and such alternative step orders are contemplated in embodiments of methods of the present disclosure.

Each light emitter 20 can be, according to various embodiments, for example, a light-emitting diode (LED), an organic light-emitting diode (OLED), a micro-LED, a laser, a diode laser, or a vertical cavity surface emitting laser and can include known light-emitting diode and/or laser materials and structures. Light emitters 20 can comprise an inorganic solid single-crystal direct bandgap light emitter, can emit visible light, such as red, green, blue, yellow, or cyan light, violet, or ultra-violet light, and can emit either coherent or incoherent light and can include phosphors, quantum dots, or other color conversion materials. Light emitters 20 used herein can have at least one of a width from 2 to 50 µm (e.g., 2 to 5 µm, 5 to 10 µm, 10 to 20 µm, or 20 to 50 µm), a length from 2 to 50 µm (e.g., 2 to 5 µm, 5 to 10 µm, 10 to 20 µm, or 20 to 50 µm), and a height from 2 to 50 µm (e.g., 2 to 5 µm, 5 to 10 µm, 10 to 20 µm, or 20 to 50 µm). A light emitter 20 or light-emitter assembly 80 can include one or more associated color filters or one or more associated color conversion materials or articles, for example as described in U.S. patent application Ser. No. 14/930,363, filed on Nov. 2, 2015.

A discussion of micro-iLEDs and micro-LED displays can be found in U.S. Pat. No. 9,520,537, issued Dec. 13, 2016, entitled Micro Assembled Micro LED Displays and Lighting Elements, the disclosure of which is hereby incorporated by reference in its entirety. Micro-transfer methods are described in U.S. Pat. Nos. 8,722,458, 7,622,367 and 8,506,867, the disclosure of each of which is hereby incorporated by reference.

Pixel modules 99 or controller 30 in accordance with certain embodiments of the present disclosure can be constructed using compound micro-assembly techniques (e.g., can be compound micro-systems). A discussion of compound micro-assembly structures and methods is provided in U.S. patent application Ser. No. 14/822,868, filed Sep. 25, 2014, entitled Compound Micro-Assembly Strategies and Devices, the disclosure of which is hereby incorporated by reference in its entirety.

In general, structures, features, and elements of the present disclosure can be made using photolithographic methods and materials found in the integrated circuit arts, and the light-emitting diode arts, for example including doped or undoped semiconductor materials, conductors, passivation layers, patterned dielectric layers, electrical contacts, and controllers.

As is understood by those skilled in the art, the terms "over" and "under" are relative terms and can be interchanged in reference to different orientations of the layers, elements, and substrates included in the present disclosure. For example, a first layer or device on a second layer, in some implementations means a first layer or device directly on and in contact with a second layer. In other implementations a first layer or device on a second layer includes a first layer or device and a second layer with another layer therebetween.

Having described certain implementations of embodiments, it will now become apparent to one of skill in the art that other implementations incorporating the concepts of the disclosure may be used. Therefore, the disclosure should not be limited to the described embodiment, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances (e.g., in some embodiments) can be conducted simultaneously. The disclosure has been described in detail with particular reference to certain embodiments thereof, but it will be understood that variations and modifications can be effected within the spirit and scope of the disclosure.

PARTS LIST

A cross section line
10 module substrate/semiconductor substrate
10L module light-emitter surface/module light-emitter side/device side
10C module controller surface/module controller side/native side
11 fracture line
12 module connection post/connection post
12C integrated-circuit connection post
12L device connection post
14 module tether
15 module source wafer
16 via
16L light-emitter via
16C controller via
16G ground via
17 module anchor
18 module electrode
19 adhesive/adhesive layer
20 light emitter/light-emitting diode (LED)/non-native device/device
20A light-emitter area
20S light-emitter bottom side
20T light-emitter top side
20R red-light emitter/red light-emitting diode
20G green-light emitter/green light-emitting diode
20B blue-light emitter/blue light-emitting diode
21 conduction layer
22 light-emitter assembly connection post
23 light-emission layer
24 light-emitter tether/device tether/LED tether
24A light-emitter assembly tether
25 light-emitter source wafer
26 light-emitter connection post
27 light-emitter anchor
28 light-emitter electrode
29 light-emitter encapsulation layer/encapsulation layer
30 controller/integrated circuit/native integrated circuit
30A controller area
30R transistor/doped semiconductor material
30S controller bottom side
30T controller top side
30W wire
31 integrated-circuit surface
31C dielectric surface
32 controller assembly connection post
34 controller tether
34A controller assembly tether
35 controller source wafer
37 controller anchor
38 controller electrode
39 controller encapsulation layer
40 contact pad
40C integrated-circuit contact pad
40L device contact pad
42 contact-pad resolution
50 dielectric/dielectric structure/dielectric layer/dielectric substrate
52 light-emitter assembly substrate
54 controller assembly substrate
60 light
60R red light
60G green light
60B blue light
70 display substrate/target substrate 74 display electrode
80 light-emitter assembly
82 controller assembly
84 sacrificial portion/gap
84G gap
86 display contact pad/electrical conductor
90 stamp
92 stamp post
94 light shield
97 pixel-module wafer
98 pixel-module display
99 integrated-circuit module/pixel module
100 source wafer
102 carrier
110 component
112 dielectric encapsulant
114 component tether
117 component anchor
118 component electrode
120 sacrificial release layer
200 provide printable light emitter step
202 provide printable controller step
204 provide module source wafer step
206 provide module substrate step
210 provide controller source wafer step
220 dispose module on controller source wafer step
230 dispose controller on module substrate step
240 form vias and electrodes on module substrate step
241 form vias and electrodes on module substrate step
245 micro-transfer print controller onto module substrate step
247 form vias and electrodes on module substrate step
250 form module carrier and electrodes step
260 micro-transfer print light emitter onto module substrate step
270 encapsulate light emitter on module substrate step
280 etch sacrificial release layer to release module step
290 micro-transfer print module onto target substrate step
300 provide printable light emitter step
310 provide component source wafer step
320 form component on component source wafer step
330 provide component source wafer step
340 encapsulate component on component source wafer step
350 adhere component to component carrier step
360 remove component source wafer step
370 etch sacrificial release layer to release component step
400 provide printable light emitter step
410 provide controller source wafer step
420 dispose module on controller source wafer step
430 dispose controller on module substrate step
440 form vias and electrodes on module substrate step
450 form module carrier and electrodes step
460 micro-transfer print light emitter onto module substrate step
470 encapsulate light emitter on module substrate step
480 etch sacrificial release layer to release module step
490 micro-transfer print module onto target substrate step
500 provide semiconductor substrate step
505 form native circuit step
510 dispose electrode and etch vias step
515 connect electrode via step
520 dispose sacrificial portion step
525 provide carrier wafer step
530 bond carrier wafer step
535 Expose vias step
540 form contact pads step
545 dispose device(s) step
550 form electrode(s) step
555 form encapsulation layer and tether step
560 expose etch via step
565 etch step
570 micro-transfer print module step
612 bonding layer
614 carrier wafer
616 patterned sacrificial layer
632 integrated-circuit resolution
670 electrode via
672 electrode
674 sidewall dielectric
676 etch via
678 via sacrificial material

The invention claimed is:

1. A pixel module, comprising:
a semiconductor substrate having a native side and an opposing device side;
a light-emitting diode (LED) disposed on the device side of the semiconductor substrate;
a controller formed on or in the native side of the semiconductor substrate; and
an electrode via comprising an electrode extending through the semiconductor substrate, the electrode electrically connected to the controller and to the LED,
wherein the controller is native to the semiconductor substrate and the LED is non-native to the semiconductor substrate.

2. The pixel module of claim 1, comprising a plurality of electrode vias, each electrode via of the plurality of electrode vias comprising an electrode extending through the semiconductor substrate, the electrode electrically connected to the controller and to the LED.

3. The pixel module of claim 1, comprising a plurality of LEDs, each LED of the plurality of LEDs disposed on the device side and non-native to the semiconductor substrate.

4. The pixel module of claim 3, wherein the plurality of LEDs comprises a red LED operable to emit red light, a green LED operable to emit green light, and a blue LED operable to emit blue light.

5. The pixel module of claim 1, wherein the controller is operable to control the LED.

6. The pixel module of claim 1, wherein the LED is disposed to emit light in a direction away from the semiconductor substrate.

7. The pixel module of claim 1, wherein the controller has a controller surface on a side of the controller opposite the native side of the semiconductor substrate and the pixel module comprises an integrated-circuit connection post disposed on the controller surface or the native side of the semiconductor substrate, the integrated-circuit connection post extending in a direction away from the semiconductor substrate and electrically connected to the electrode.

8. The pixel module of claim 1, comprising a device connection post disposed on the device side extending in a direction away from the semiconductor substrate and beyond the LED, the device connection post electrically connected to at least one of the LED and the controller.

9. The pixel module of claim 1, wherein the electrode via comprises a sidewall dielectric disposed around a perimeter of the electrode via that electrically insulates the electrode from the semiconductor substrate.

10. The pixel module of claim 1, comprising a light shield disposed between the LED and the semiconductor substrate.

11. The pixel module of claim 1, wherein the LED comprises (i) a broken or separated device tether, (ii) the LED is a bare, unpackaged die, or (iii) both (i) and (ii).

12. The pixel module of claim 1, comprising an encapsulation layer disposed over the LED.

13. The pixel module of claim 12, wherein the encapsulation layer comprises a broken or separated module tether.

14. The pixel module of claim 1, comprising a broken or separated module tether.

15. The pixel module of claim 1, wherein the LED at least one of a width and a length of no more than 100 microns.

16. The pixel module of claim 1, wherein the pixel module has at least one of a width and a length of no more than 400 microns.

17. The pixel module of claim 1, wherein the controller comprises one or more circuit connections, one or more active components, or a combination of both one or more circuit connections and one more active components and a resolution of the one or more circuit connections, the one or more active devices, or the combination of both the one or more circuit connections and the one or more active components is greater than a resolution of the electrode.

18. The pixel module of claim 1, wherein the semiconductor substrate is made of single crystalline silicon such that the cortroller is formed on or in the single crystalline silicon and the LED comprises a compound semiconductor.

19. The pixel module of claim 1, comprising a dielectric layer disposed on the semiconductor substrate such that the dielectric layer is disposed between the LED and the semiconductor substrate and the LED is electrically insulated from the semiconductor substrate by the dielectric layer.

20. The pixel module of claim 1, comprising a light shield disposed between the semiconductor substrate and the LED.

* * * * *